United States Patent
Leijtens et al.

(10) Patent No.: US 11,312,738 B2
(45) Date of Patent: Apr. 26, 2022

(54) DIMETHYLAMMONIUM-CONTAINING PEROVSKITE DEVICES

(71) Applicant: Alliance for Sustainable Energy, LLC, Golden, CO (US)

(72) Inventors: Tomas Leijtens, Emerald Hills, CA (US); David Todd Moore, Arvada, CO (US); Giles Edward Eperon, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 77 days.

(21) Appl. No.: 16/677,857

(22) Filed: Nov. 8, 2019

(65) Prior Publication Data
US 2020/0148711 A1 May 14, 2020

Related U.S. Application Data

(60) Provisional application No. 62/757,244, filed on Nov. 8, 2018.

(51) Int. Cl.
*C07F 13/00* (2006.01)
*H01L 51/42* (2006.01)

(52) U.S. Cl.
CPC .......... *C07F 13/005* (2013.01); *H01L 51/422* (2013.01)

(58) Field of Classification Search
CPC ............. H01L 51/422; H01L 31/02008; H01L 31/022425; H01L 51/5012; H01L 31/06; Y02E 10/549; C07F 13/005; C07F 7/003
See application file for complete search history.

(56) References Cited

U.S. PATENT DOCUMENTS

| | | | |
|---|---|---|---|
| 2016/0133673 A1 | 5/2016 | Koposov et al. | |
| 2017/0243699 A1* | 8/2017 | Beaumont | H01G 9/2009 |
| 2017/0244057 A1 | 8/2017 | Zhu et al. | |
| 2018/0179440 A1* | 6/2018 | Kovalenko | H01L 51/0077 |

FOREIGN PATENT DOCUMENTS

| | | |
|---|---|---|
| WO | 2018015831 A1 | 1/2018 |
| WO | 2018026326 A1 | 2/2018 |

OTHER PUBLICATIONS

Baikie, T. et al., "Synthesis and crystal chemistry of the hybrid perovskite (CH3NH3)PbI3 for solid-state sensitised solar cell applications," Journal of Materials Chemistry A, vol. 1, 2013, pp. 5628-5641.

(Continued)

*Primary Examiner* — Ermias T Woldegeorgis
(74) *Attorney, Agent, or Firm* — Michael A. McIntyre

(57) ABSTRACT

The present disclosure relates to a perovskite that includes $ABX_3$, where A is an organic cation, B is a second cation, X is an anion, and the perovskite has a film density ($\rho$) of less than 4.37 g/cm$^3$. In some embodiments of the present disclosure, the film density may be in the range, 4.1 g/cm$^3 \le \rho \le$ 4.37 g/cm$^3$. In some embodiments of the present disclosure, the organic cation may include at least one of dimethylammonium (DMA), guanidinium (GA), and/or acetamidinium (Ac). In some embodiments of the present disclosure, A may further include cesium.

16 Claims, 58 Drawing Sheets

(56) References Cited

OTHER PUBLICATIONS

Jodlowski, A. et al., "Large guanidinium cation mixed with methylammonium in lead iodide perovskites for 19% efficient solar cells," Nature Energy, vol. 2, Dec. 2017, pp. 972-979.
Ju, Dianxing et al., "Gas Induced Conversion of Hybrid Perovskite Single Crystal to Single Crystal for Great Enhancement of Their Photoelectric Properties," Journal of Materials Chemistry A, vol. 5, 2017, 21 pages (including Supplementary Information).
Ke, W. et al., "Myths and reality of HPbl3 in halide perovskite solar cells," Nature Communications, vol. 9, 2018, 9 pages.
International Search Report for corresponding PCT patent application No. PCT/US19/60412, dated Mar. 18, 2020, 3 pages.
Written Opinion of the International Searching Authority for corresponding PCT/US19/60412, dated Mar. 18, 2020, 4 pages.
Avila, J. et al., "High voltage vacuum-deposited CH3NH3PbI3—CH3NH3PbI3 tandem solar cells," RSC Energy & Environmental Science, vol. 11, 2018, pp. 3292-3297.
Beal, R. et al., "Cesium Lead Halide Perovskites with Improved Stability for Tandem Solar Cells," Journal of Physical Chemistry Letters, vol. 7, 2016, pp. 746-751.
Bush, K. et al., "23.6%-efficient monolithic perovskite/silicon tandem solar cells with improved stability," Nature Energy, vol. 2, 2017, 7 pages.
Chirila, A. et al., "Potassium-induced surfacemodification of Cu(In,Ga)Se2 thin films for high-efficiency solar cells," Nature Materials, vol. 12, 2013, 5 pages.
Christians, J. et al., "Stability in Perovskite Photovoltaics: A Paradigm for Newfangled Technologies," ACS Energy Letters, vol. 3, 2018 pp. 2136-2143.
Dou, B. et al., "Degradation of Highly Alloyed Metal Halide Perovskite Precursor Inks: Mechanism and Storage Solutions," ACS Energy Letters, vol. 3, 2018, pp. 979-985.
Eperon, G. et al., "Formamidinium lead trihalide: a broadly tunable perovskite for efficient planar heterojunction solar cells," RSC Energy & Environmental Science, vol. 7, 2014, pp. 982-988.
Eperon, G. et al., "Perovskite-perovskite tandem photovoltaics with optimized band gaps," Solar Cells, vol. 354, Issue 6314, 2016, 6 pages.
Feng, J. et al., "Record Efficiency Stable Flexible Perovskite Solar Cell Using Effective Additive Assistant Strategy," Advanced Materials Communication, vol. 30, 2018, 9 pages.
Filip, M. et al., "Steric engineering of metal-halide perovskites with tunable optical band gaps," Nature Communications, 9 pages.
Garcia-Fernandez, A. et al., "[(CH3)2NH2]7Pb4X15 (X=Cl- and Br-), 2D-Perovskite Related Hybrids with Dielectric Transitions and Broadband Photoluminescent Emission," Inorganic Chemistry, vol. 57, 2018, pp. 3215-3222.
Hazarika, A. et al., "Perovskite Quantum Dot Photovoltaic Materials beyond the Reach of Thin Films: Full-Range Tuning of A-Site Cation Composition," ACS Nano, vol. 12, 2018, pp. 10327-10337.
Hohl-Ebinger, J. et al., "Non-Linearity of Solar Cells in Spectral Response Measurements," 22nd European Photovoltaic Solar Energy Conference, Sep. 3-7, 2007, 3 pages.
Hüpkes, J. et al., "Chemical Etching of Zinc Oxide for Thin-Film Silicon Solar Cells," ChemPhysChem, vol. 13, 2012, pp. 66-73.
Ke, W. et al., "Efficient Lead-Free Solar Cells Based on Hollow [en]MASnI3 Perovskites," Journal of the American Chemical Society, vol. 139, 2017, pp. 14800-14806.
King, D.L. et al., "New Methods for Measuring Performance of Monolilthic Multi-Junction Solar Cells," IEEE, 2000, 5 pages.
Leijtens, T. et al., "Tin-lead halide perovskites with improved thermal and air stability for efficient all-perovskite tandem solar cells," RSC Sustainable Energy & Fuels, vol. 2, 2018, pp. 2450-2459.
Li, Z. et al., "Stabilizing Perovskite Structures by Tuning Tolerance Factor: Formation of Formamidinium and Cesium Lead Iodide Solid-State Alloys," Chemistry of Materials, vol. 28, 2016, pp. 284-292.
Mancini, A. et al., "Synthesis, structural and optical characterization of APbX3 (A=methylammonium, dimethylammoniu, trimethylammonium; X=I, Br, Cl) hybrid organic-inorganic materials," Journal of Solid State Chemistry, vol. 240, 2016, pp. 55-60.
McMahon, T.J. et al., "Errors in Calculated Air Mass 1 Short-Circuit Currents Due to Non-Linear Responsivities," Solar Cells, vol. 13, 1984, pp. 99-105.
McMeekin, D. et al., "Solution-Processed All-Perovskite Multijunction Solar Cells," Joule, vol. 3, 2019, pp. 387-401.
Meusel, M. et al., "Spectral Mismatch Correction and Spectrometric Characterization of Monolithic III-V Multi-junction Solar Cells," Progress in Photovoltaics: Research and Applications, vol. 10, 2002, pp. 243-255.
Mitzi, D., "Synthesis, Structure, and Properties of Organic-Inorganic Perovskites and Related Materials," Progress in Inorganic Chemistry, vol. 48, Edited by Kenneth D. Karlin, 1999, 121 pages.
Palmstrom, A. et al., "Enabling Flexible All-Perovskite Tandem Solar Cells," Joule, 2019, pp. 2193-2204.
Paraskeva, V. et al., "The effect of shunt resistance on External Quantum Efficiency measurements at high light bias conditions," IEEE, 2014, 6 pages.
Parsons, G. et al., "Mechanisms and reactions during atomic layer deposition on polymers," Coordination Chemistry Reviews, vol. 257, 2013, pp. 3323-3331.
Reese, M. et al., "Quantitative calcium resistivity based method for accurate and scalable water vapor transmission rate measurement," Review of Scientific Instruments, vol. 82, 2011, 10 pages.
Sahli, F. et al., "Fully textured monolithic perovskite/silicon tandem solar cells with 25.2% power conversion efficiency," Nature Materials, vol. 17, 2018, pp. 820-826.
Saparov, B. et al., "Organic-Inorganic Perovskites: Structural Versatility for Functional Materials Design," Chemical Reviews, vol. 116, 2016, pp. 4558-4596.
Shi, Z. et al., "Symmetrization of the Crystal Lattics of MAPbI3 Boosts the Performance and Stability of Metal-Perovskite Photodiodes," Advanced Materials, vol. 29, 2017, 6 pages.
Spanopoulos, I. et al., "Unraveling the Chemical Nature of the 3D "Hollow" Hybrid Hallide Perovskites," Journal of the American Chemical Society, vol. 140, 2018, pp. 5728-5742.
Stoddard, R. et al., "Enhancing Defect Tolerance and Phase Stability of High-Bandgap Perovskites via Guanidinium Alloying," ACS Energy Letters, vol. 3, 2018, pp. 1261-1268.
Stolterfoht, M. et al., "Visualization and suppression of interfacial recombination for high-efficiency large-area pin perovskite solar cells," Nature Energy, vol. 3, Oct. 2018, pp. 847-854.
Swarnkar, A. et al., "Quantum dot-induced phase stabilization of α-CsPbI3 perovskite for high-efficiency photovoltaics," Science, vol. 354, Issue 6308, Oct. 2016, 5 pages.
Tress, W., "Perovskite Solar Cells on the Way to Their Radiative Efficiency Limit-Insights Into a Success Story of High Open-Circuit Voltage and Low Recombination," Advanced Energy Materials, vol. 7, 2017, 8 pages.
Forgacs, D. et al., "Efficient Monolithic Perovskite/Perovskite Tandem Solar Cells," Wiley Advanced Science News, vol. 7, 2017, 6 pages.

* cited by examiner

DIMETHYLAMMONIUM-CONTAINING PEROVSKITE DEVICES

CROSS-REFERENCE TO RELATED APPLICATIONS

This application claims the benefit of U.S. Provisional Patent Application No. 62/757,244 filed Nov. 8, 2018, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

SUMMARY

An aspect of the present disclosure is a perovskite that includes $ABX_3$, where A is an organic cation, B is a second cation, X is an anion, and the perovskite has a film density ($\rho$) of less than 4.37 g/cm$^3$. In some embodiments of the present disclosure, the film density may be in the range, 4.1 g/cm$^3 \leq \rho \leq 4.37$ g/cm$^3$. In some embodiments of the present disclosure, the organic cation may include at least one of dimethylammonium (DMA), guanidinium (GA), and/or acetamidinium (Ac). In some embodiments of the present disclosure, A may further include cesium.

In some embodiments of the present disclosure, the perovskite may have the composition $DMA_xCs_{1-x}BX_3$, where $0 \leq x \leq 0.8$. In some embodiments of the present disclosure, A may further include formamidinium (FA). In some embodiments of the present disclosure, the perovskite may have the composition $DMA_xCs_{1-x-y}FA_yBX_3$, where $0.40 \leq y \leq 0.90$. In some embodiments of the present disclosure, B may include at least one of lead and/or tin. In some embodiments of the present disclosure, the perovskite may have the composition $DMA_xCs_{1-x-y}FA_yPbX_3$.

In some embodiments of the present disclosure, the anion may include at least one of chlorine, bromine, and/or iodine. In some embodiments of the present disclosure, the perovskite may have the composition $DMA_xCs_{1-x-y}FA_yPbI_{3-v}Cl_v$, wherein $0 < v < 3$. In some embodiments of the present disclosure, the perovskite may have the composition $DMA_xCs_{1-x-y}FA_yPbI_{3-z}Br_z$, wherein $0 < z < 3$. In some embodiments of the present disclosure, the perovskite may have the composition $DMA_xCs_{1-x-y}FA_yPbI_{3-v-z}Br_zCl_v$, wherein $0 < v < 3$, and $0 < z < 3$.

In some embodiments of the present disclosure, the perovskite may have the composition $DMA_xCs_{1-x-y}FA_yPbI_{3-v-z}Br_zCl_v$, wherein $0.05 \leq x \leq 0.50$, $0.29 \leq y \leq 0.70$, $0 \leq v \leq 0.45$, and $0 \leq z \leq 1.5$. In some embodiments of the present disclosure, the perovskite may have the composition of at least one of $DMA_{0.10}FA_{0.60}Cs_{0.30}PbI_{2.4}Br_{0.6}$, $DMA_{0.10}FA_{0.60}Cs_{0.30}PbI_{2.4}Br_{0.6}Cl_{0.06}$, $DMA_{0.5}Cs_{0.50}PbI_3$, $DMA_{0.5}Cs_{0.50}PbI_{2.4}Br_{0.6}$, $DMA_{0.1}FA_{0.58}Cs_{0.32}PbI_3$, $DMA_{0.1}FA_{0.58}Cs_{0.32}PbI_{2.4}Br_{0.6}$, $DMA_{0.2}FA_{0.435}Cs_{0.365}PbI_3$, $DMA_{0.2}FA_{0.435}Cs_{0.365}PbI_{2.4}Br_{0.6}$, $DMA_{0.3}FA_{0.29}Cs_{0.41}PbI_3$, $DMA_{0.3}FA_{0.29}Cs_{0.41}PbI_{2.4}Br_{0.6}$, $DMA_{0.4}FA_{0.145}Cs_{0.455}PbI_3$, $DMA_{0.4}FA_{0.145}Cs_{0.455}PbI_{2.4}Br_{0.6}$, $DMA_{0.4}FA_{0.145}Cs_{0.455}PbI_{2.85}Br_{0.15}$, $DMA_{0.3}FA_{0.29}Cs_{0.41}PbI_{2.6}Br_{0.3}$, $DMA_{0.2}FA_{0.435}Cs_{0.365}PbI_{2.76}Br_{0.24}$, $DMA_{0.3}FA_{0.29}Cs_{0.41}PbI_{2.55}Br_{0.45}Cl_{0.06}$, $DMA_{0.15}FA_{0.53}Cs_{0.32}PbI_{2.55}Br_{0.45}Cl_{0.06}$, $DMA_{0.2}FA_{0.44}Cs_{0.36}PbI_{2.55}Br_{0.45}Cl_{0.06}$, $DMA_{0.25}FA_{0.38}Cs_{0.37}PbI_{2.55}Br_{0.45}Cl_{0.06}$, $DMA_{0.3}FA_{0.30}Cs_{0.40}PbI_{2.55}Br_{0.45}Cl_{0.06}$, $DMA_{0.15}FA_{0.64}Cs_{0.21}PbI_{2.55}Br_{0.45}Cl_{0.06}$, $DMA_{0.2}FA_{0.60}Cs_{0.2}PbI_{2.55}Br_{0.45}Cl_{0.06}$, $DMA_{0.25}FA_{0.56}Cs_{0.19}PbI_{2.55}Br_{0.45}Cl_{0.06}$, $DMA_{0.3}FA_{0.52}Cs_{0.18}PbI_{2.55}Br_{0.45}Cl_{0.06}$, $DMA_{0.2}FA_{0.4}Cs_{0.4}PbI_{2.55}Br_{0.45}Cl_{0.06}$, $DMA_{0.2}FA_{0.48}Cs_{0.32}PbI_{2.55}Br_{0.45}Cl_{0.06}$, $DMA_{0.25}FA_{0.5}Cs_{0.25}PbI_{2.55}Br_{0.45}Cl_{0.06}$, $DMA_{0.25}FA_{0.45}Cs_{0.3}PbI_{2.55}Br_{0.45}Cl_{0.06}$, $DMA_{0.2}FA_{0.4}Cs_{0.4}PbI_{2.55}Br_{0.45}Cl_{0.06}$, $DMA_{0.12}FA_{0.65}Cs_{0.23}PbI_{2.55}Br_{0.45}Cl_{0.06}$, $DMA_{0.1}FA_{0.6}Cs_{0.3}PbI_{1.5}Br_{1.5}$, $DMA_{0.1}FA_{0.6}Cs_{0.3}PbI_{2.85}Cl_{0.15}$, $DMA_{0.1}FA_{0.6}Cs_{0.3}PbI_{2.94}Cl_{0.06}$, $DMA_{0.1}FA_{0.6}Cs_{0.3}PbI_{2.9}Cl_{0.1}$, $DMA_{0.1}FA_{0.6}Cs_{0.3}PbI_{2.55}Br_{0.3}Cl_{0.15}$, $DMA_{0.1}FA_{0.6}Cs_{0.3}PbI_{2.55}Br_{0.3}Cl_{0.15}$, $DMA_{0.1}FA_{0.6}Cs_{0.3}PbI_{2.55}Br_{0.3}$, $DMA_{0.1}FA_{0.6}Cs_{0.3}PbI_{2.4}Br_{0.3}Cl_{0.3}$, $DMA_{0.1}FA_{0.6}Cs_{0.3}PbI_{2.55}Br_{0.3}Cl_{0.15}$, $DMA_{0.1}FA_{0.6}Cs_{0.3}PbI_3$, $DMA_{0.1}FA_{0.6}Cs_{0.3}PbI_{2.4}Br_{0.45}Cl_{0.15}$, $DMA_{0.1}FA_{0.6}Cs_{0.3}PbI_{2.55}Br_{0.45}$, $DMA_{0.1}FA_{0.6}Cs_{0.3}PbI_{2.4}Br_{0.15}Cl_{0.45}$, $DMA_{0.05}FA_{0.7}Cs_{0.25}PbI_{2.4}Br_{0.6}Cl_{0.06}$, $DMA_{0.05}FA_{0.63}Cs_{0.32}PbI_{2.4}Br_{0.6}Cl_{0.06}$, or $DMA_{0.2}FA_{0.53}Cs_{0.27}PbI_{2.4}Br_{0.6}Cl_{0.06}$.

In some embodiments of the present disclosure, the perovskite may further include a unit cell volume greater than 480 Å$^3$. In some embodiments of the present disclosure, the unit cell volume may be between greater than 480 Å$^3$ and 485 Å$^3$. In some embodiments of the present disclosure, the perovskite may further include a bandgap between 1.65 eV and 1.9 eV, inclusively. In some embodiments of the present disclosure, the bandgap may be between 1.70 eV and 1.85 eV, inclusively.

BRIEF DESCRIPTION OF THE DRAWINGS

Some embodiments are illustrated in referenced figures of the drawings. It is intended that the embodiments and figures disclosed herein are to be considered illustrative rather than limiting.

FIG. 24B forward and reverse current-voltage scans, where FB-SC=forward bias to short circuit; and FIG. 24C maximum power point tracking data for the same 10% DMA-containing wide gap cell, according to some embodiments of the present disclosure. The stabilized PCE from MPP tracking is shown on the J-V curve of FIG. 24B as a blue square. The short-circuit current measured from the JV scan is 19.2 mAcm$^{-2}$. Current-voltage scans were carried out at 0.47 V/s.

REFERENCE NUMBERS

Figure 1A:
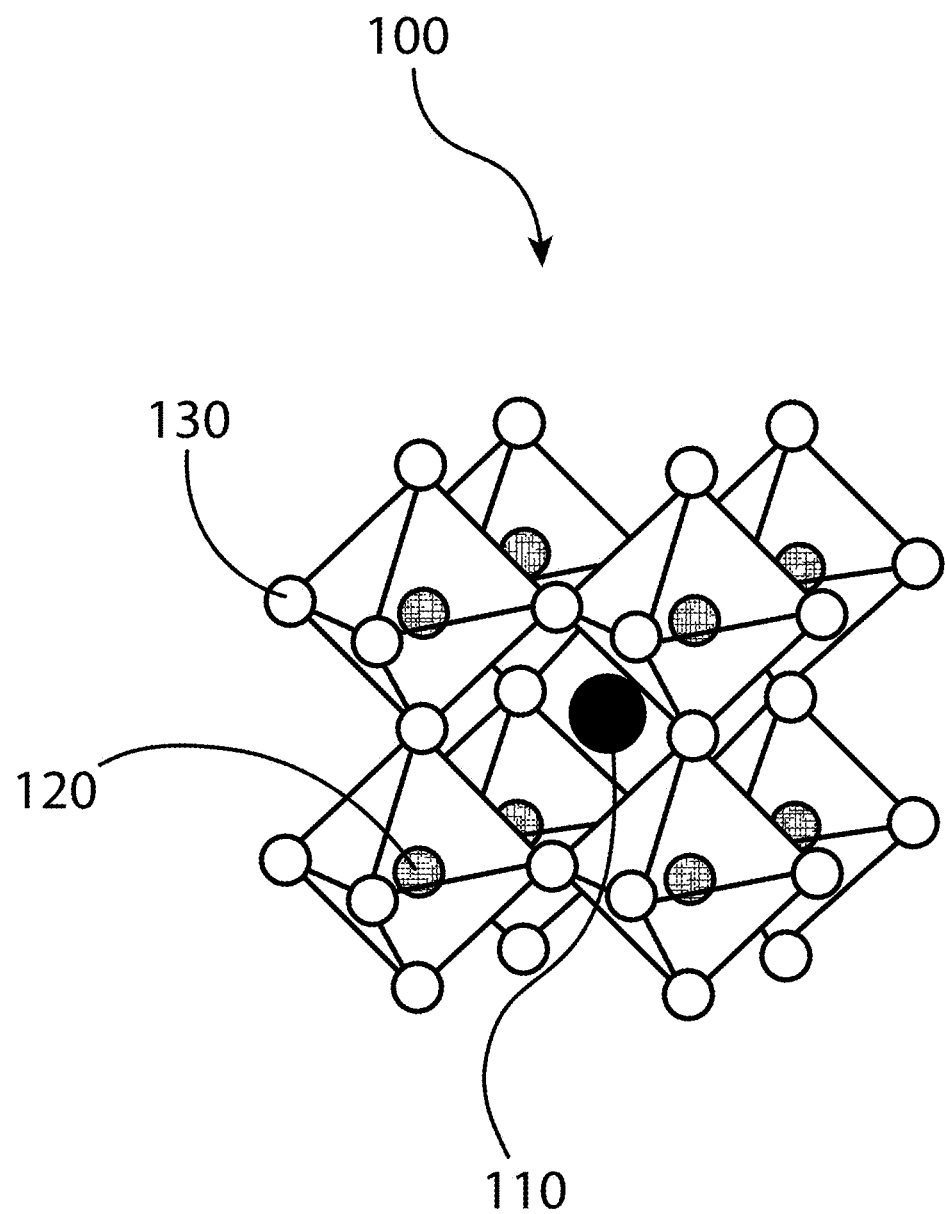
FIGS. 1A, 1B, and 1C illustrate a perovskite, according to some embodiments of the present disclosure.

100 . . . perovskite crystal
110 . . . A-cation
120 . . . B-cation
130 . . . X-anion
300 . . . device
310 . . . active layer
320 . . . first charge transport layer
330 . . . second charge transport layer
340 . . . conducting oxide layer
350 . . . first current collector
360 . . . second current collector
370 . . . substrate
380 . . . encapsulant

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to an optoelectronic device. In some embodiments of the present disclosure the optoelectronic device may include an active layer (e.g. an optical absorber or emitter) configured for either the absorption of photons and generation of voltage, or for the emission of photons with the application of voltage. In some embodiments of the present disclosure, the active layer may be an alloyed perovskite structure with composition $DMA_xFA_yCs_{1-x-y}PbI_zBr_{3-z-q}Cl_q$, where $0<x<0.2$, $0<y<1$, $0≤z<3$, $0≤q≤0.06$. DMA is dimethylammonium $((CH_3)_2NH)$, FA is formamidinium $(H_2NCHNH_3)$. In some embodiments of the present disclosure, the optoelectronic device may include a first electrical contact and a second electrical contact, such that the active layer is positioned between the first electrical contact and the second electrical contact. At least one of the electrical contacts may be configured to allow the transmission of light through the electrical contact to the underlying active layer. The electrical contacts may be constructed of at least one of a transparent conducting oxide, a conductive polymer, a small molecule organic, and/or a metal.

Figure 1B:
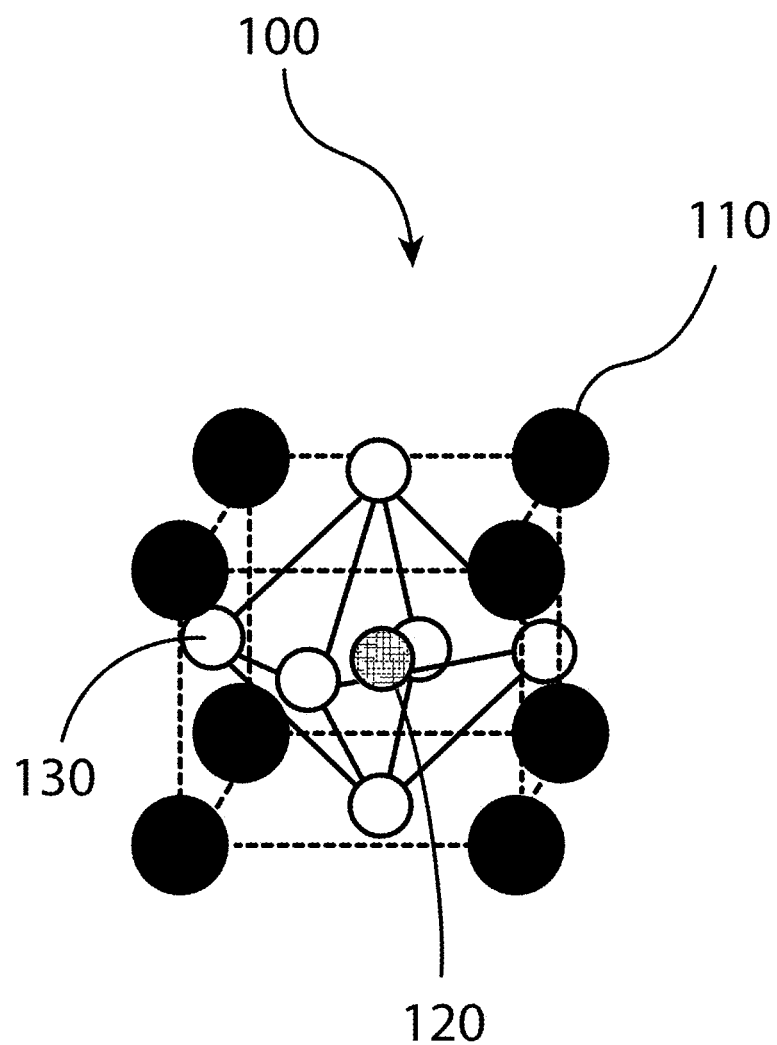
Figure 1C:
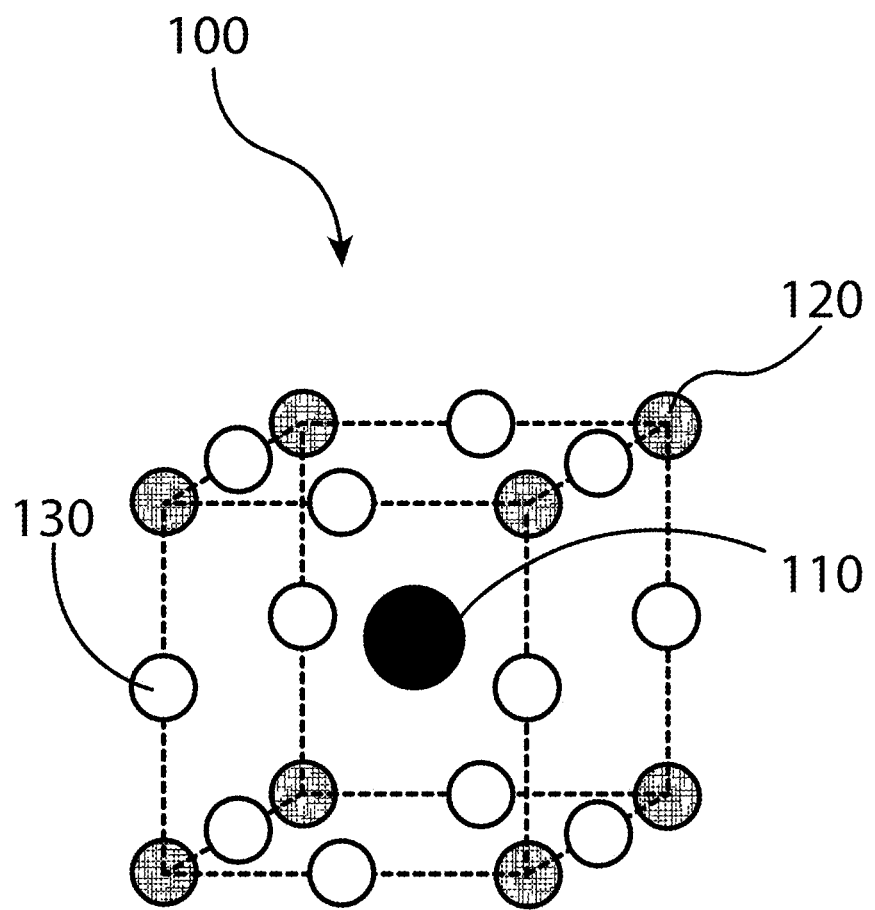

FIGS. 1A, 1B, and 1C illustrate that perovskites 100, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (130) is an anion and A (110) and B (120) are cations, typically of different sizes (A typically larger than B). FIG. 1A illustrates that a perovskite 100 may be organized into eight octahedra surrounding a central A-cation 110, where each octahedra is formed by six X-anions 130 surrounding a central B-cation 120. FIG. 1B illustrates that a perovskite 100 may be visualized as a cubic unit cell, where the B-cation 120 is positioned at the center of the cube, an A-cation 110 is positioned at each corner of the cube, and an X-anion 130 is face-centered on each face of the cube. FIG. 1C illustrates that a perovskite 100 may also be visualized as a cubic unit cell, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 1B and 1C, the A-cations 110, the B-cations 120, and the X-anions 130 balance to the general formula $ABX_3$, after accounting for the fractions of each atom shared with neighboring unit cells. For example, referring to FIG. 1B, the single B-cation 120 atom is not shared with any of the neighboring unit cells. However, each of the six X-anions 130 is shared between two unit cells, and each of the eight A-cations 110 is shared between eight unit cells. So for the unit cell shown in FIG. 1B, the stoichiometry simplifies to B=1, A=8*0.124=1, and X=6*0.5=3, or $ABX_3$. Similarly, referring again to FIG. 1C, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to FIG. 1C, the X-anions 130 and the B-cations 120 are shown as aligned along an axis; e.g. where the angle at the X-anion 130 between two neighboring B-cations 120 is exactly 180 degrees, referred to herein as the tilt angle. However, a perovskite 100 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium $(CH_3NH_3^+)$, ethylammonium $(CH_3CH_2NH_3^+)$, propylammonium $(CH_3CH_2 CH_2NH_3^+)$, butylammonium $(CH_3CH_2 CH_2 CH_2NH_3^+)$, formamidinium $(NH_2CH=NH_2^+)$, hydrazinium, acetylammonium, dimethylammonium, imidazolium, guanidinium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium $(CH(NH_2)_2)$. Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl $(C_1)$, ethyl $(C_2)$, n-propyl $(C_3)$, iso-propyl $(C_3)$, n-butyl $(C_4)$, tert-butyl $(C_4)$, sec-butyl $(C_4)$, iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_9$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g. fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cations 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g. x is not equal to 1, 2, or 3. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens. Any combination is possible provided that the charges balance.

For example, a perovskite having the basic crystal structure illustrated in FIG. 1A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 2:
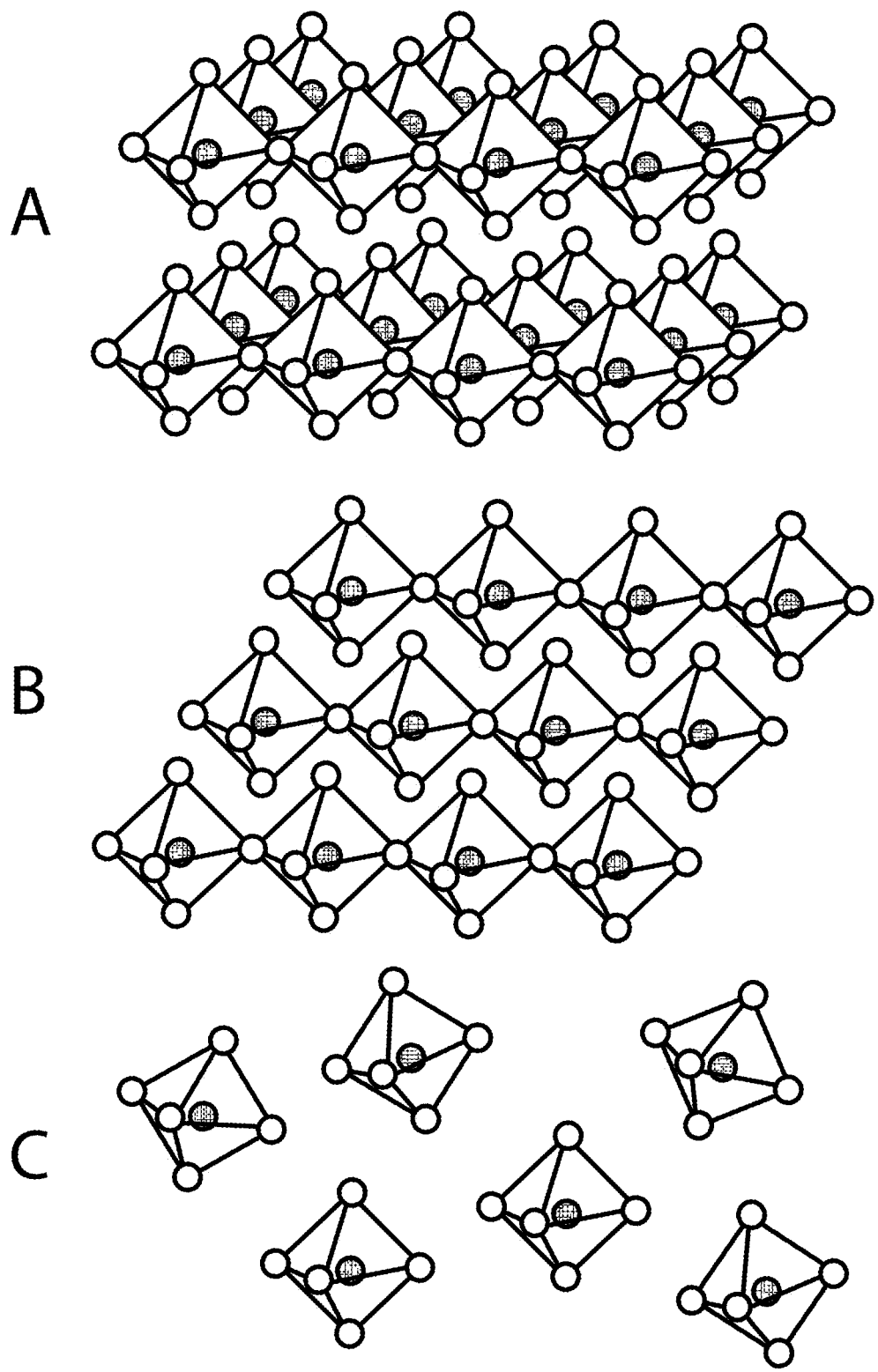
FIG. 2 illustrates each of a 2D perovskite, a 1D perovskite, and a 0D perovskite, in Panels A, B, and C, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 1A, 1B, and 1C. FIG. 2 illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g. methylammonium and/or formamidinium $CH(NH_2)_2^+$), the B-cation may be a divalent cation (e.g. $Pb^{2+}$ and/or $Sn^{2+}$), and the X-anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 2, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 2, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 2, typically, the 0D perovskites are consisted of isolated inorganic octahedral clusters and surrounded by small cations (not shown) which are connected via hydrogen bonding.

The present disclosure relates to an optoelectronic device. In some embodiments of the present disclosure the optoelectronic device may include an active layer (e.g. an optical absorber or emitter) configured for either the absorption of photons and generation of voltage, or for the emission of photons with the application of voltage. In some embodiments of the present disclosure, the active layer may be an alloyed perovskite structure with composition $A_xFA_yCs_{1-x-y}PbI_zBr_{3-z-q}Cl_q$, where 0>x>0.2, 0<y<1, 0<z<3, 0≤q≤0.06 and where A may include at least one of dimethylammonium (DMA), guanidinium (GA), and/or acetamidinium (Ac). As used herein, FA is formamidinium ($H_2NCHNH_3$). In some embodiments of the present disclosure, the optoelectronic device may include a first electrical contact and a second electrical contact, such that the active layer is positioned between the first electrical contact and the second electrical contact. At least one of the electrical contacts may be configured to allow the transmission of light through the electrical contact to the underlying active layer. The electrical contacts may be constructed of at least one of a transparent conducting oxide, a conductive polymer, a small molecule organic, and/or a metal.

Figure 3:
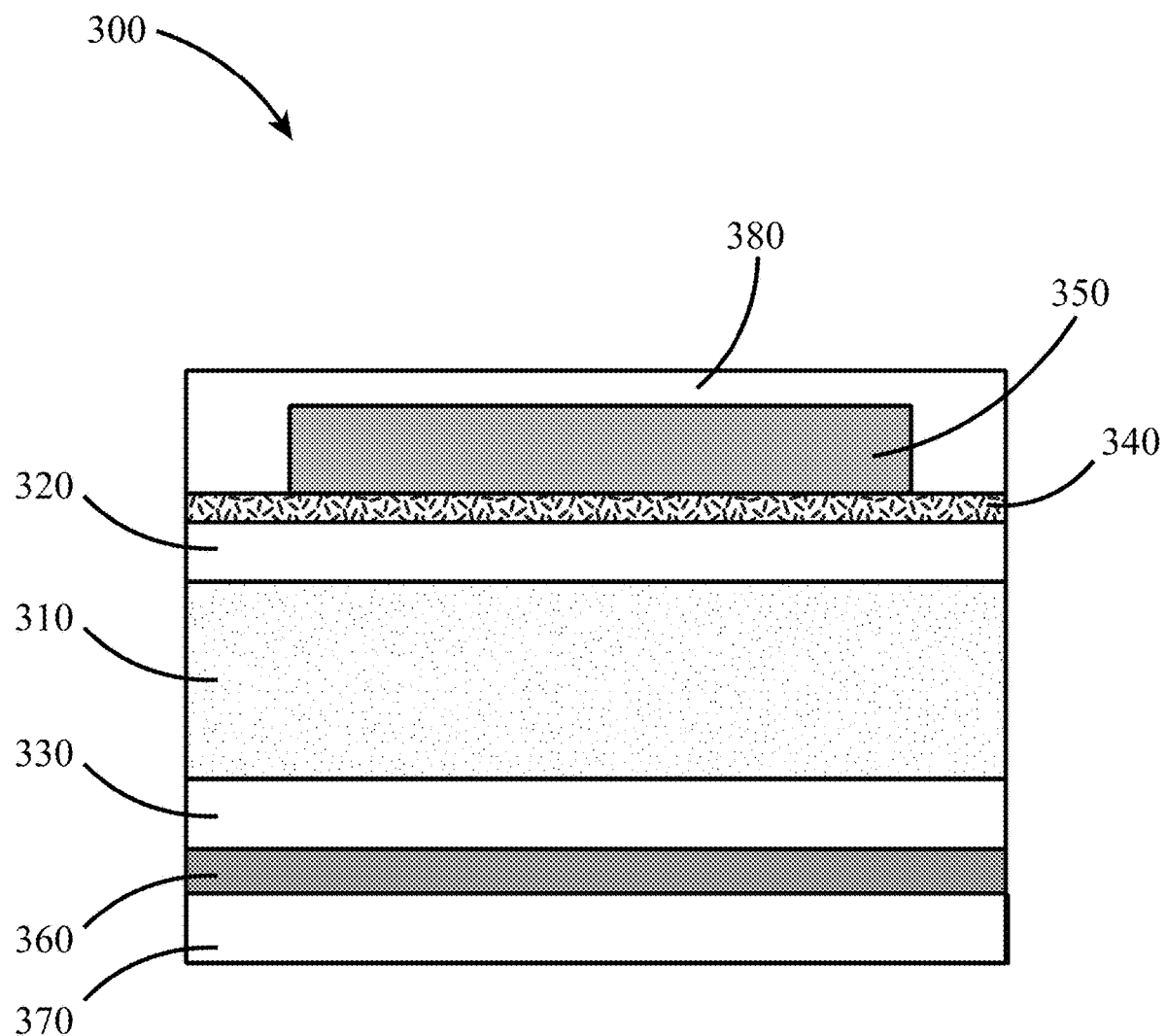
FIG. 3 illustrates an architecture of an optoelectronic device that incorporates a DMA-containing perovskite active layer and an alumina encapsulant, according to some embodiments of the present disclosure.

FIG. 3 illustrates an optoelectronic device 300 constructed with a thin (~400 nm) perovskite film, the active layer 310, having the composition $DMA_xFA_yCs_{1-x-y}PbI_{3-v-z}Br_zCl_v$ (0<x<0.8; 0≤y≤0.90; 0≤z≤3.0; 0≤v<3.0), according to some embodiments of the present disclosure. In some embodiments of the present disclosure, the active layer may be synthesized by spin-coating a solution in dimethylformamide and dimethylsulfoxide and applying selective contacts to either side, resulting in an active layer within a p-i-n junction structure, where p-i-n refers to a perovskite layer positioned between a p-selective contact and an n-selective contact. To achieve this exemplary device, the starting materials and their molarities contained in the solution may be formamidinium iodide (between 0 M and 1 M, inclusively, or between 0.6 M and 0.65 M, inclusively), cesium iodide (between 0 M and 0.5 M, inclusively, or between 0.15 M and 0.4 M, inclusively), dimethylammonium iodide (between 0 M and 0.5 M, inclusively, or between 0 M and 0.2 M, inclusively), lead (II) iodide (between 0 M and 1 M, inclusively), lead (II) bromide (between 0 M and 1 M, inclusively), and lead (II) chloride (between 0 M and 1 M, inclusively). The ratio of dimethylformamide to dimethylsulfoxide may be 3:1 by volume or in a range between 0.1:1 and 100:1 or between 1:1 and 10:1. In some embodiments of the present disclosure, during spin-coating, methyl acetate may be applied as an antisolvent to nucleate crystallization of the perovskite film. The resultant film may then be annealed at about 100° C. (in a range between 70° C. and 200° C.) for one hour (in a range between 5 minutes and 2 hours) to complete crystallization. As shown in FIG. 3 (1P), the perovskite active layer 310 may be positioned between a first charge transport layer 320 (e.g. hole transport layer or HTL) and a second charge transport layer 330 (e.g. electron transport layer or ETL). Further, a conducting oxide layer 340 may be positioned between the first charge transport layer 320 and a first current collector 350. A second current collector 360 may be positioned between the second charge transport layer 330 and a substrate 370. In addition, at least a portion of the device 300 may be contained within an encapsulant 380.

In some embodiments of the present disclosure, a first charge transport layer 320 may include at least one of a fullerene material and/or LiF. In some embodiments of the present disclosure, a second charge transport layer 330 may include at least one of poly[(9,9bis(3'((N,N-dimethyl)-N-ethylammonium)-propyl)-2,7-fluorene]-alt-2,7-(9,9-dioctylfluorene)] (i.e. PFN-Br) and/or poly[N,N'bis(4-butylphenyl)-N,N'-bisphenylbenzidine] (i.e. poly-TPD). In some embodiments of the present disclosure, a conducting oxide layer 340 may be constructed of aluminum-dope zinc oxide. In some embodiments of the present disclosure, a first current collector 350 may be constructed of at least one of gold, silver, copper, and/or aluminum. In some embodiments of the present disclosure, a second current collector 360 may be constructed of a transparent current conducting oxide, such as indium tin oxide. In some embodiments of the present disclosure, a substrate 370 may be constructed of a glass. In some embodiments of the present disclosure, an encapsulant 380 may include alumina. In some embodiments of the present disclosure, a hole transport layer (i.e. charge transport layer) may be constructed of at least one of nickel oxide, PTAA (poly-triarylamine), copper pthalocyanine, and/or vanadium oxide. In some embodiments of the present disclosure, an electron transport layer (i.e. charge transport layer) may be constructed of at least one of $SnO_2$, $TiO_2$, ZnO, and/or PCBM.

Figure 4:
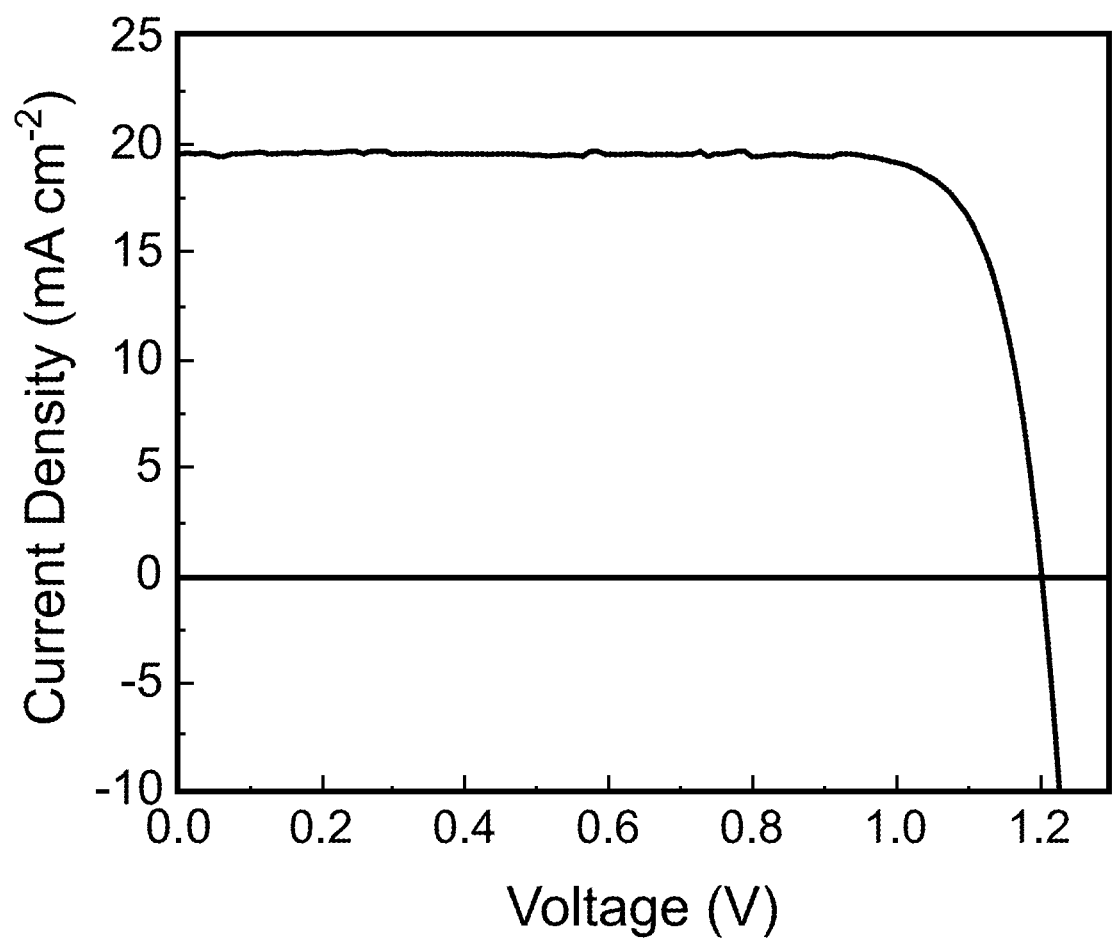
FIG. 4 illustrates current-voltage characteristics of an optoelectronic device having a DMA-containing perovskite active layer, according to some embodiments of the present disclosure.

Referring to FIG. 4, a resultant optoelectronic device, made with a device architecture like that illustrated in FIG. 3, exhibited very high photovoltaic efficiency, as measured by current-voltage characterization under 1 sun illumination. The key performance metrics for this device were as follows: $J_{sc}$=19.6 mA/cm$^2$; $V_{oc}$=1.20 V; FF=0.82; and PCE=19.2%. Furthermore, when encapsulated with an alumina layer, the optoelectronic device having the DMA-containing active layer exhibited much increased long-term stability in air compared to devices having active layers free of DMA, as measured by applying a resistive load, illuminating with a sulfur lamp, and testing current-voltage characteristics regularly over multiple days (see FIG. 5). When compared to the DMA-free device, the DMA-containing device demonstrated a similar bandgap, as measured via optical absorption. The legend for FIG. 5 is as follows: triangle=0% DMA, 30% Br; upside-down triangle=25% DMA, 10% Br; diamond=12% DMA, 20% Br; and sidewise triangle=20% DMA, 10% Br.

Figure 6A:
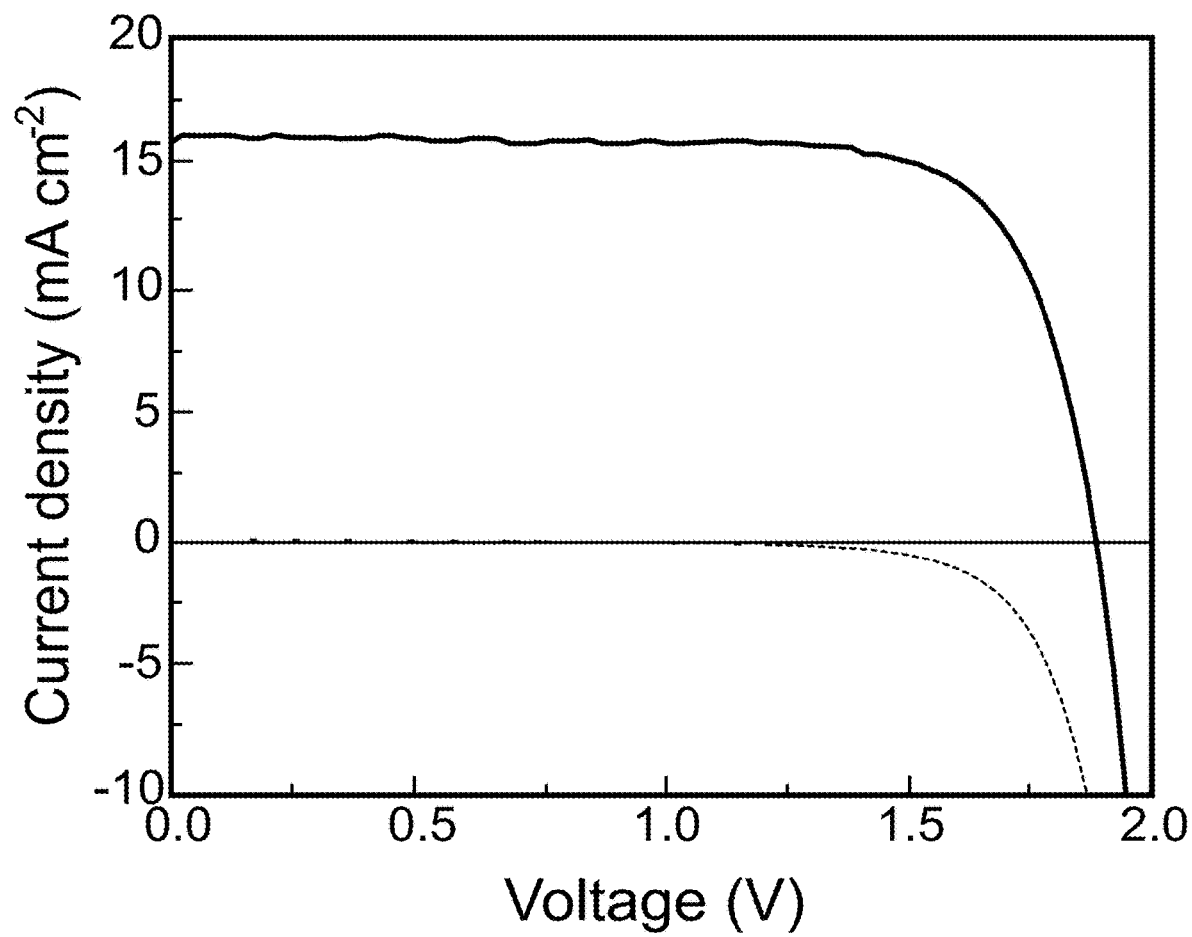
FIGS. 6A and 6B illustrate current-voltage characteristics and power conversion efficiencies, respectively, for a perovskite-perovskite tandem solar cell fabricated using DMA-containing perovskite as the wide gap cell and (FA,Cs)(Sn,Pb)I$_3$ as the narrow bandgap cell, according to some embodiments of the present disclosure.
Figure 6B:
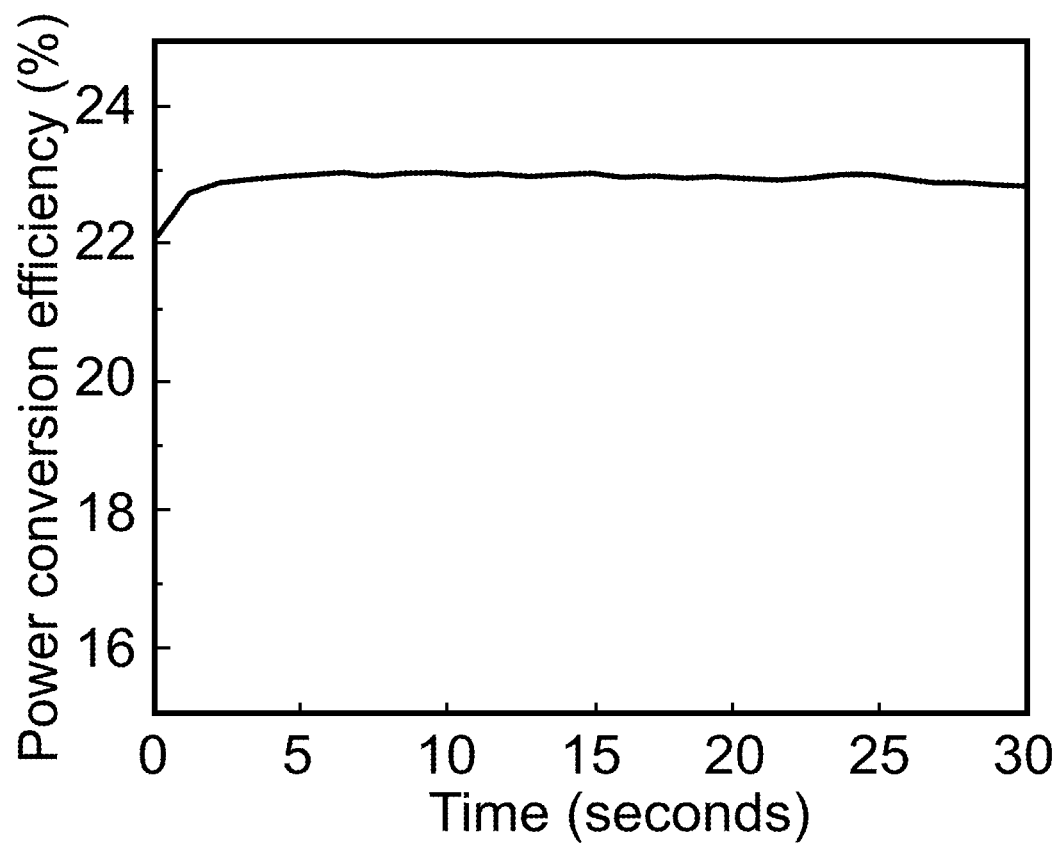

In an embodiment of the present disclosure, a tandem optoelectronic device may be constructed in which a DMA-containing perovskite active layer, as described above, may be used as the wide bandgap cell in combination with a low bandgap cell constructed of at least one of a tin-lead alloyed perovskite, silicon, and/or a CIGS alloy. As illustrated in FIGS. 6A and 6B, examples of perovskite-perovskite tandem devices fabricated with the DMA-containing perovskite active layer as the wide bandgap material demonstrated excellent efficiency and stabilized power output. The key performance metrics of the device represented by FIG. 6A are as follows: $J_{sc}$=16.0 mA/cm$^2$; $V_{oc}$=1.88 V; FF=0.77; and PCE=23.1%. The maximum efficiency measured in FIG. 6B is about 23%.

Figure 7:
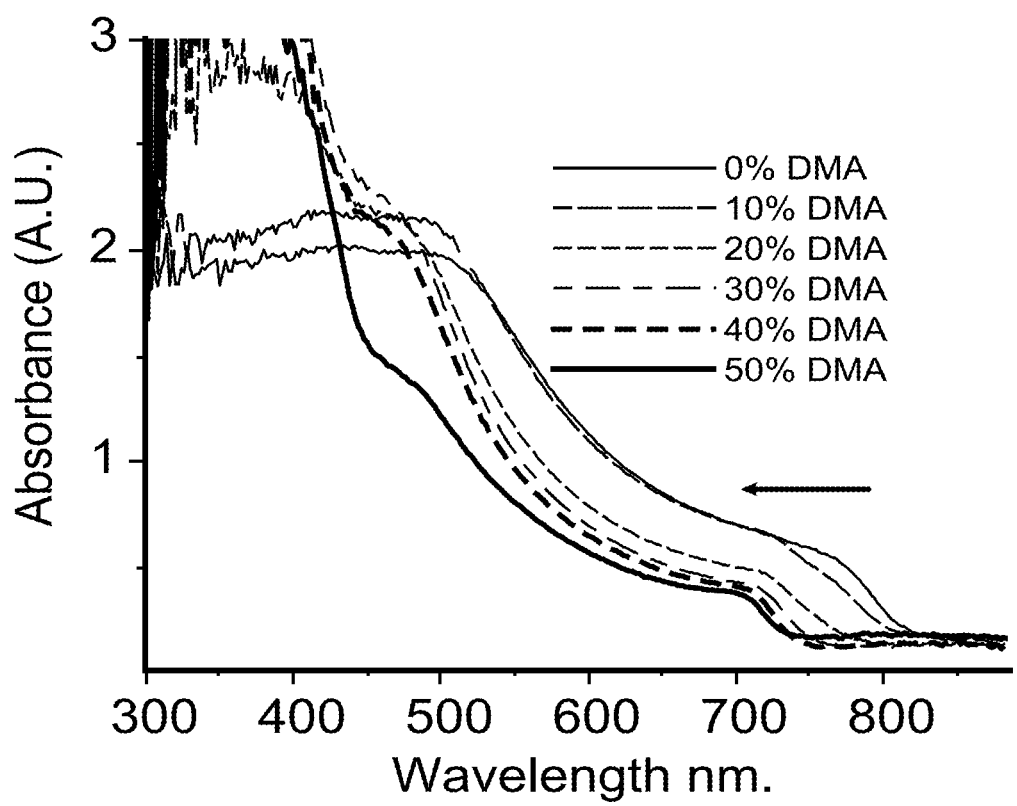
FIG. 7 illustrates absorption spectra of $DMA_xFA_yCs_{1-x-y}PbI_3$ showing an increase in bandgap with increasing DMA %, according to some embodiments of the present disclosure.
Figure 8:
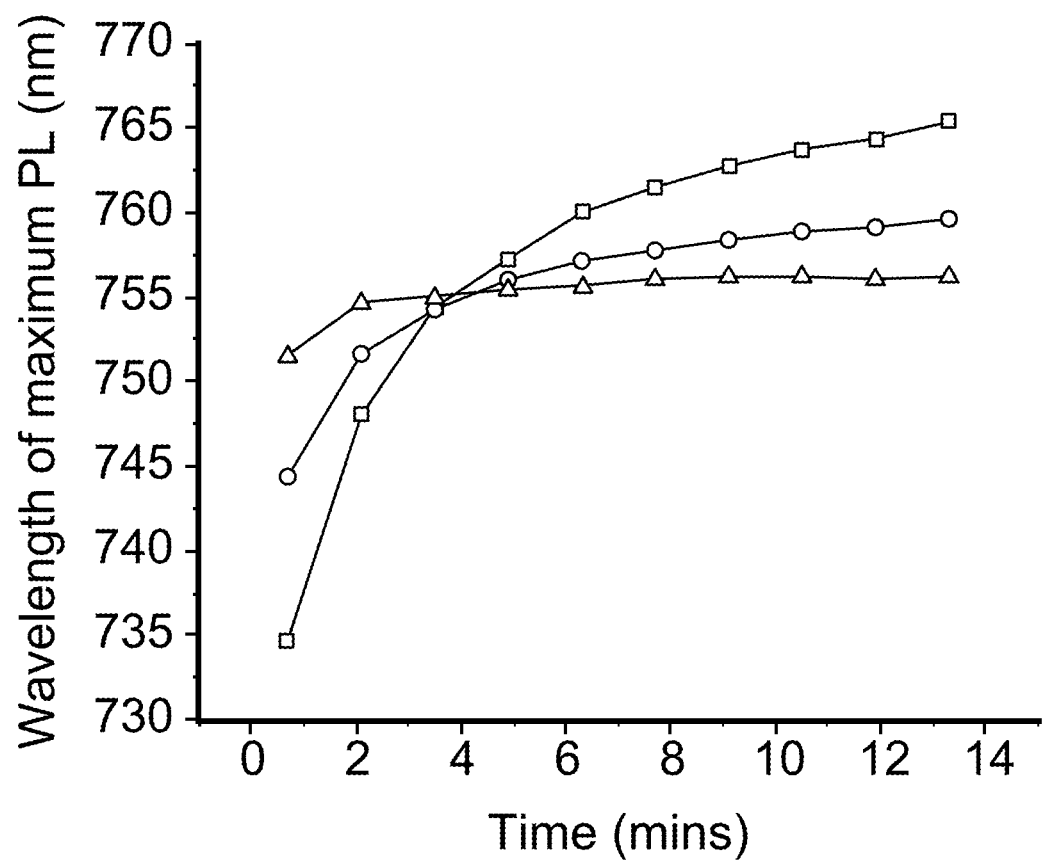
FIG. 8 illustrates photoluminescence peak wavelength over time when illuminated with a 1 mW 530 nm laser, ~1 mm$^2$ spot size, showing peak shift caused by phase segregation in no DMA, 12% DMA and 25% DMA containing compositions, according to some embodiments of the present disclosure.

Thus, the present disclosure may enable the manufacture of tandem optoelectronic devices (e.g. photovoltaic devices), which require a material having a relatively wide bandgap (1.7-1.9 eV). As shown in FIG. 7 (the arrow indicates increasing band gap), the bandgap may be increased by adding DMA to a perovskite halide material; this bandgap increase also occurs when the lattice size increase is compensated by increasing the fraction of cesium. Increasing the bandgap is normally achieved by adding a greater fraction of bromine (Br), but when the bromine concentration is above ~20% (z=2.4) it is observed that phase segregation of the material into iodine-rich and bromine-rich regions rapidly occurs under illumination. This phase segregation causes instability in the photovoltaic device's power output, which drops rapidly. A fraction of ~30% Br would be needed to attain a bandgap of 1.7 eV when no DMA is included. Measuring photoluminescence of a 1.7 eV perovskite composition deposited on a glass slide with 30% Br demonstrated very rapid phase segregation (see FIG. 8). According to some embodiments of the present disclosure, in contrast, using a composition with 10-12% DMA on the A-site (x=0.10-0.12), a 1.7 eV bandgap was attained using only 20% Br. This composition demonstrates less severe phase segregation as shown by photoluminescence under the same conditions (see FIG. 8). This reduced phase segregation in the perovskite active layer results in the improved long-term stability of photovoltaic device having the perovskite DMA-containing active layer. The legend for FIG. 8 is as follows: squares=0% DMA; circles=12% DMA; and triangles=25% DMA. Thus, these examples demonstrate a perovskite defined by $DMA_xCs_yFA_{1-x-y}Pb(I_zBr_{1-z})_3$ where $0.1 \leq x \leq 0.12$ and $0.8 \leq z \leq 0.9$ and $0.15 \leq y \leq 0.2$.

Figure 5:
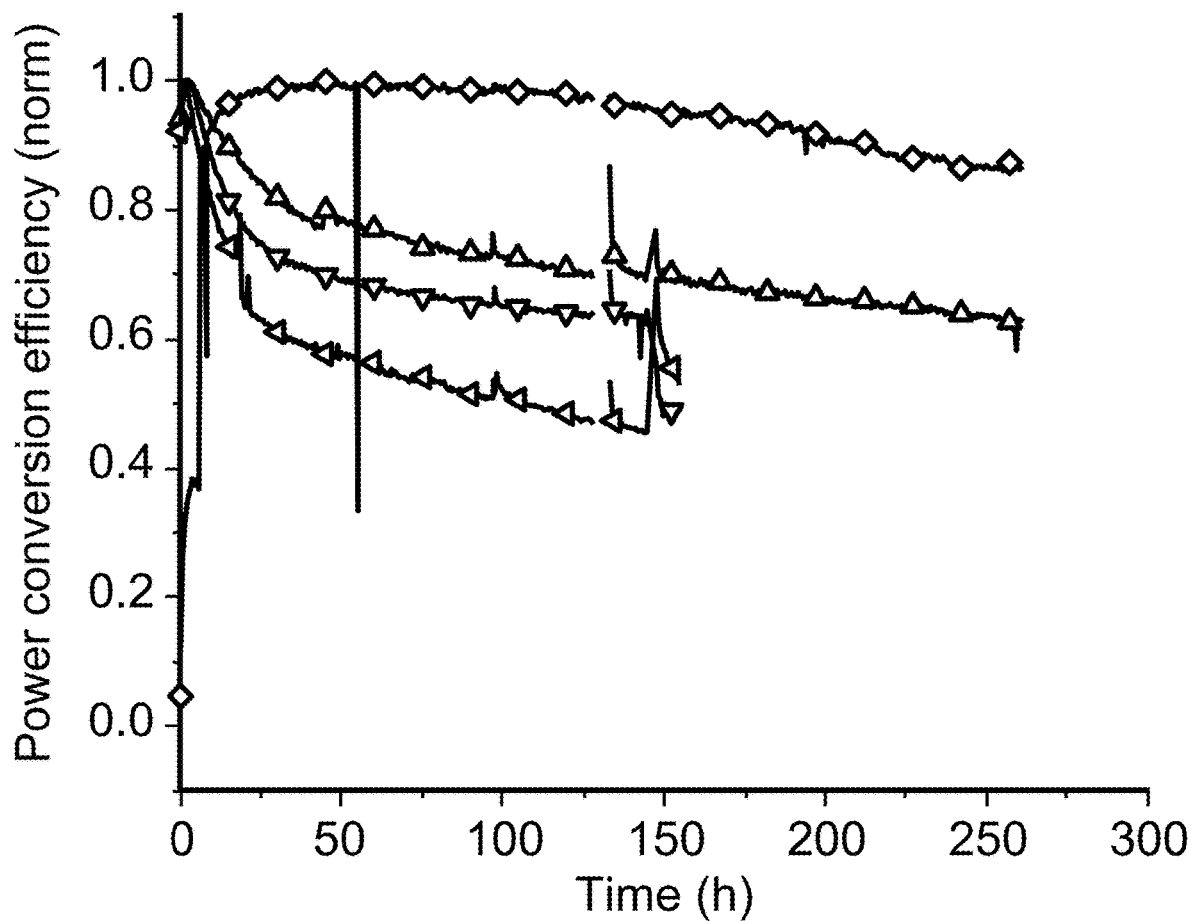
FIG. 5 illustrates long-term stability data of optoelectronic devices having 1.7 eV perovskite active layers in air, held under load, with and without DMA, according to some embodiments of the present disclosure. These devices, using the architecture illustrated in FIG. 3, were illuminated constantly with a sulfur plasma lamp and held at 20° C.
Figure 9:
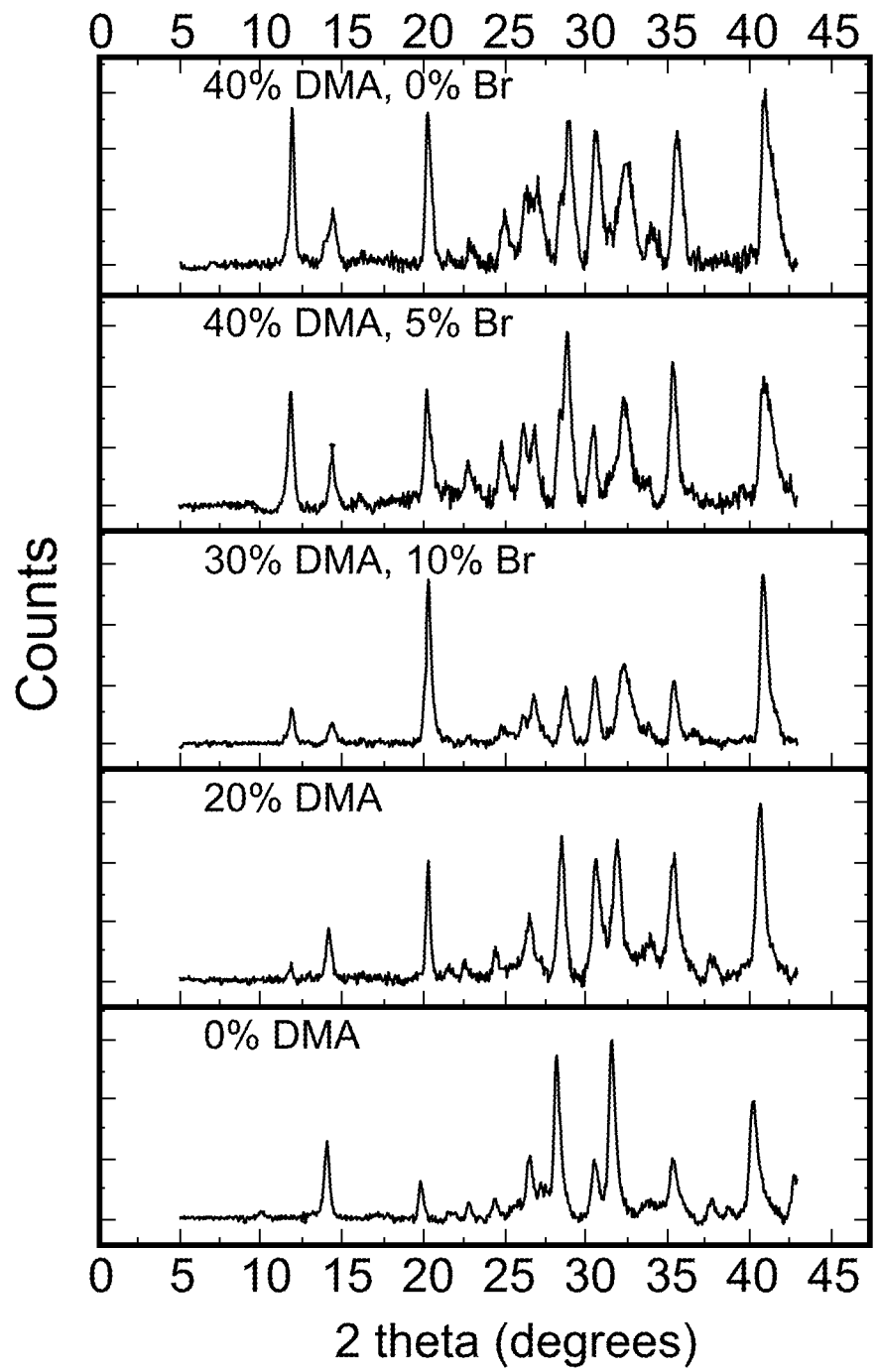
FIG. 9 illustrates X-ray diffraction data showing increase in non-perovskite phase (peak at ~12°) with increasing DMA %, according to some embodiments of the present disclosure.
Figure 10:
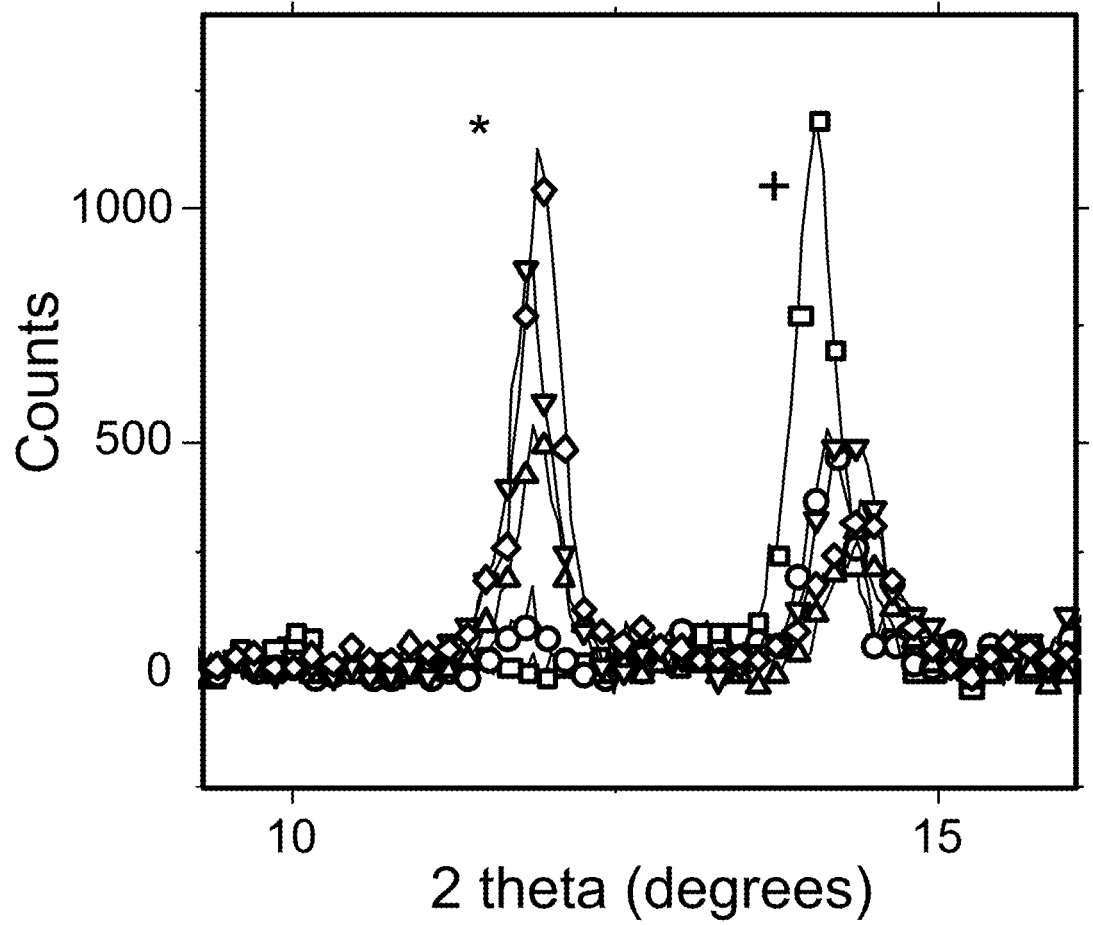
FIG. 10 illustrates magnified X-ray diffraction data in the region between 12 and 15°, where the perovskite phase has a peak at ~14°, according to some embodiments of the present disclosure.

Increasing the DMA fraction to 20% or above in the perovskite active layer resulted in the eventual formation of a non-perovskite yellow phase (see FIGS. 9 and 10), which is no longer an effective light absorbing material and thus photovoltaic devices made with these compositions also exhibited reduced long-term stability (see FIG. 5). The compositional range of bromine is therefore important for enabling wide bandgap perovskite films with reduced Br % and improved long-term stability. The legend for FIG. 10 is as follows: squares=0% DMA; circles=20% DMA, 0% Br; triangles=30% DMA, 10% Br; inverted triangles=40% DMA, 5% Br; and diamonds=40% DMA, 0% Br. * indicates non-perovskite phase and + indicates perovskite phase.

Figure 11A:
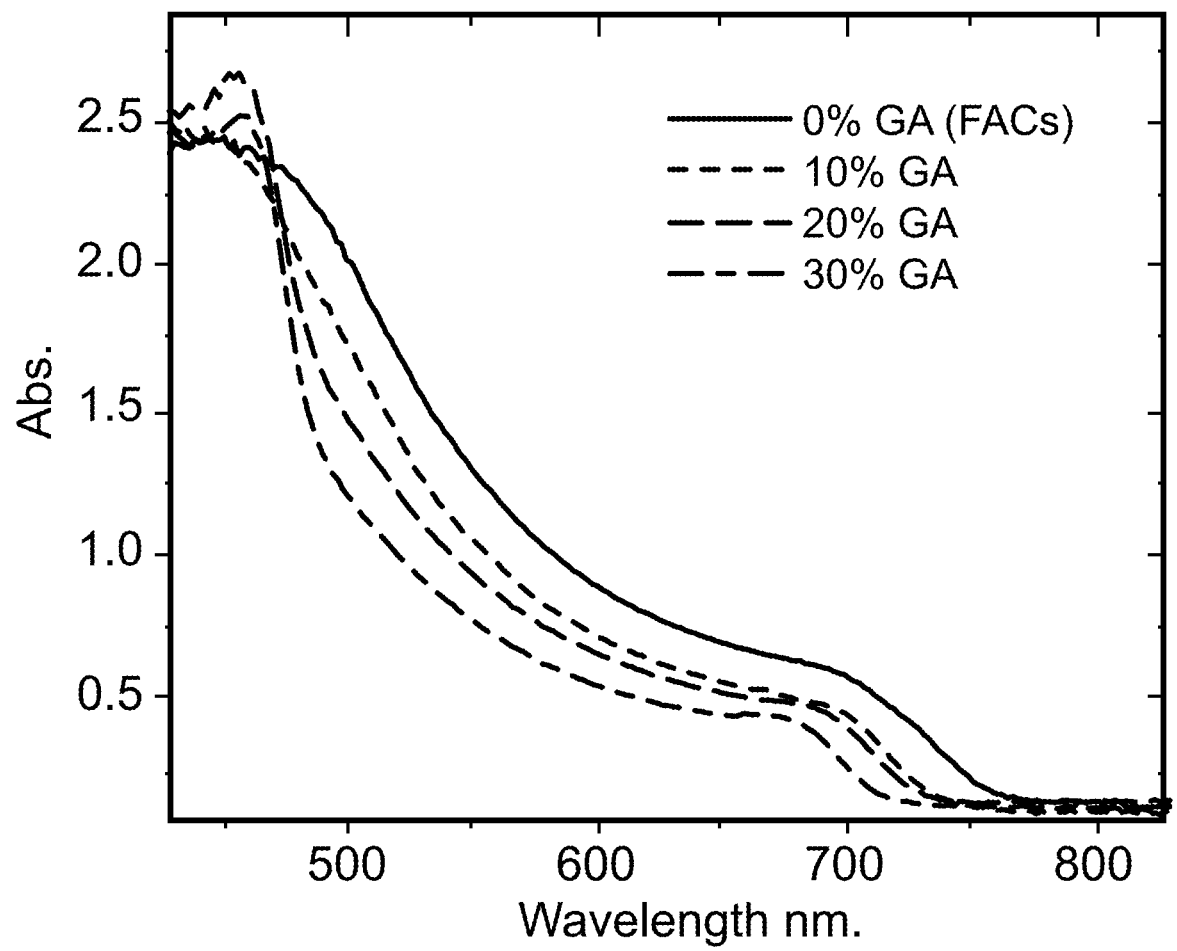
FIG. 11A illustrates UV-vis showing bandgap increases with GA (guanidinium) and bromine fixed at 20%, according to some embodiments of the present disclosure.
Figure 11B:
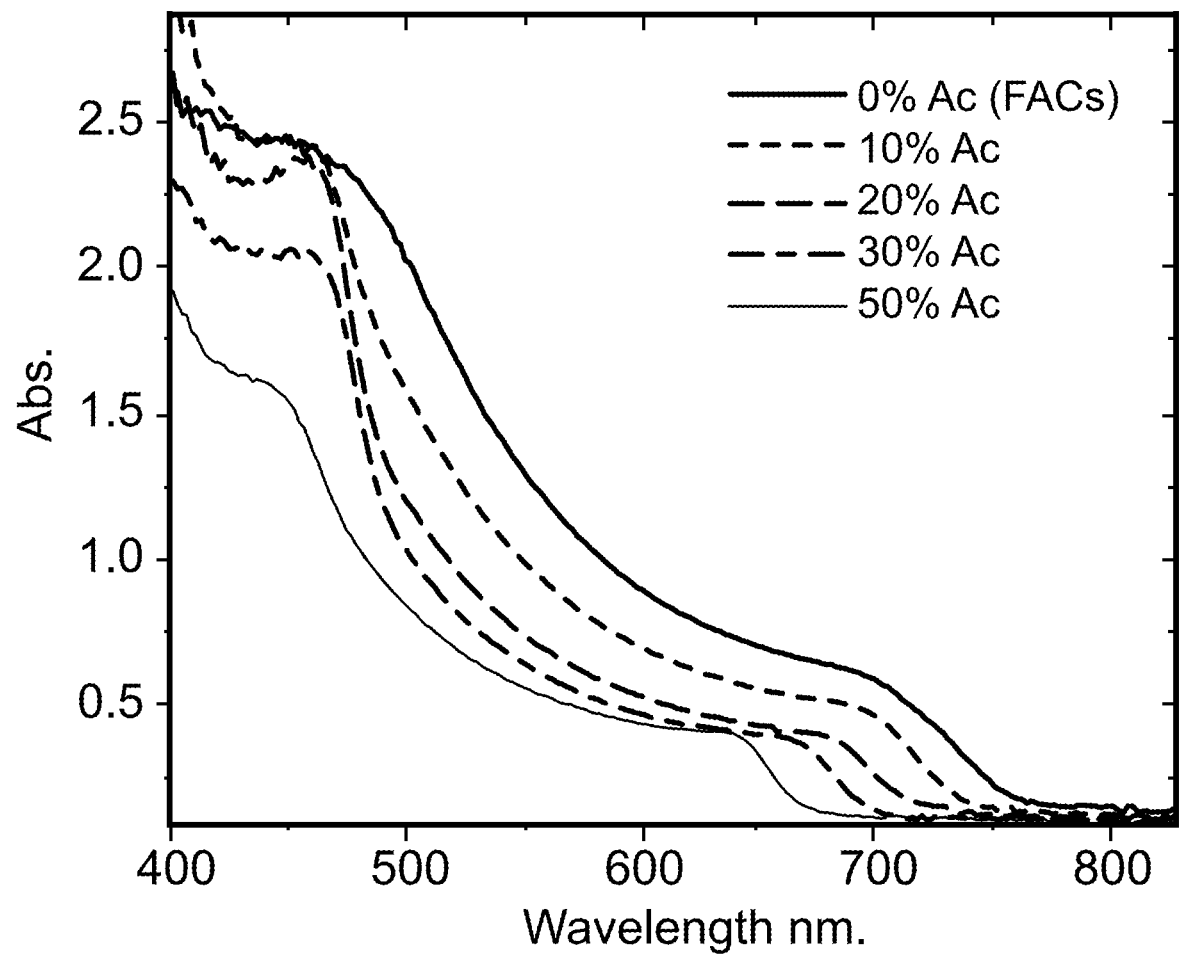
FIG. 11B illustrates UV-vis showing bandgap increases with Ac (acetamidinium) and bromine fixed at 20%, according to some embodiments of the present disclosure.
Figure 11C:
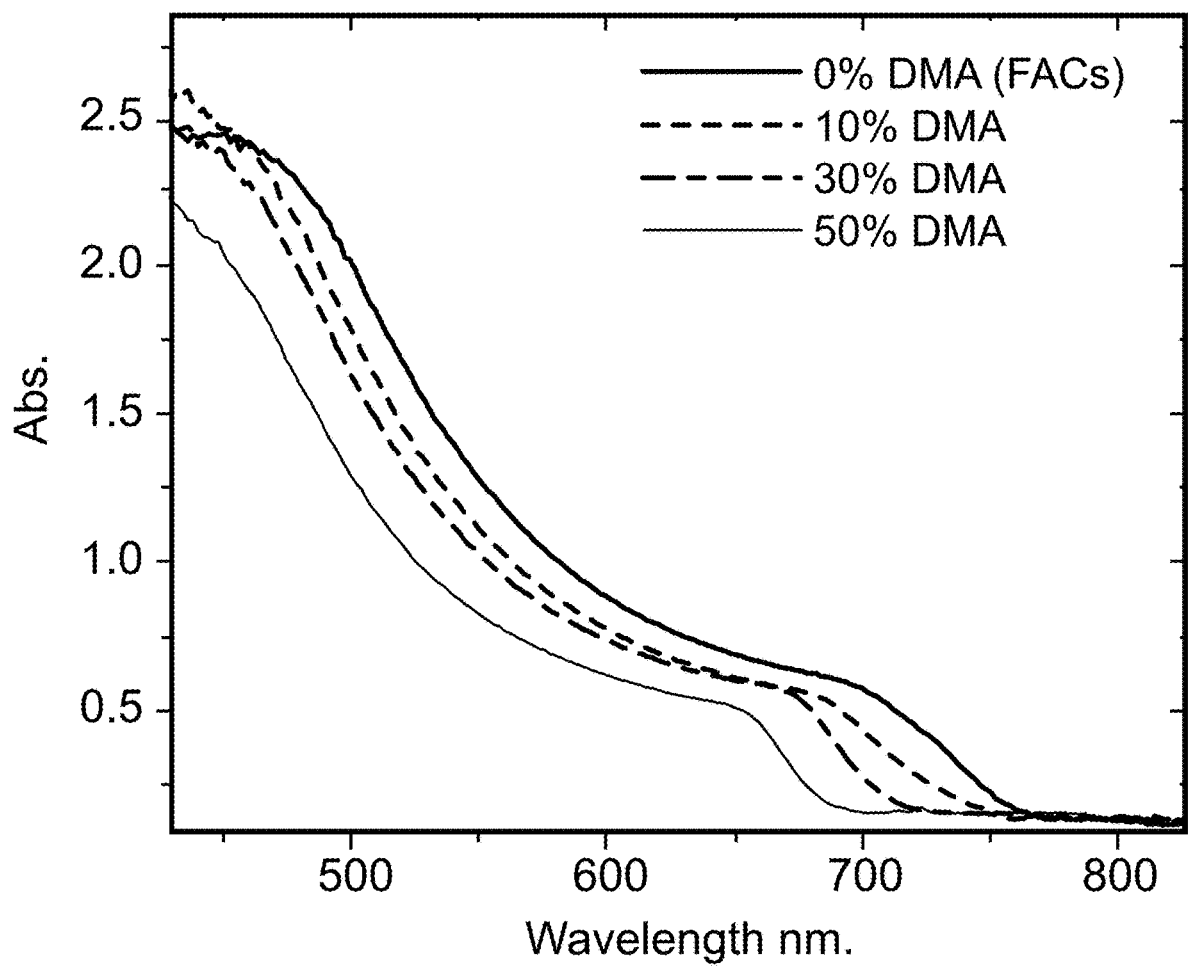
FIG. 11C illustrates UV-vis showing bandgap increases with DMA and bromine fixed at 20%, according to some embodiments of the present disclosure.
Figure 11D:
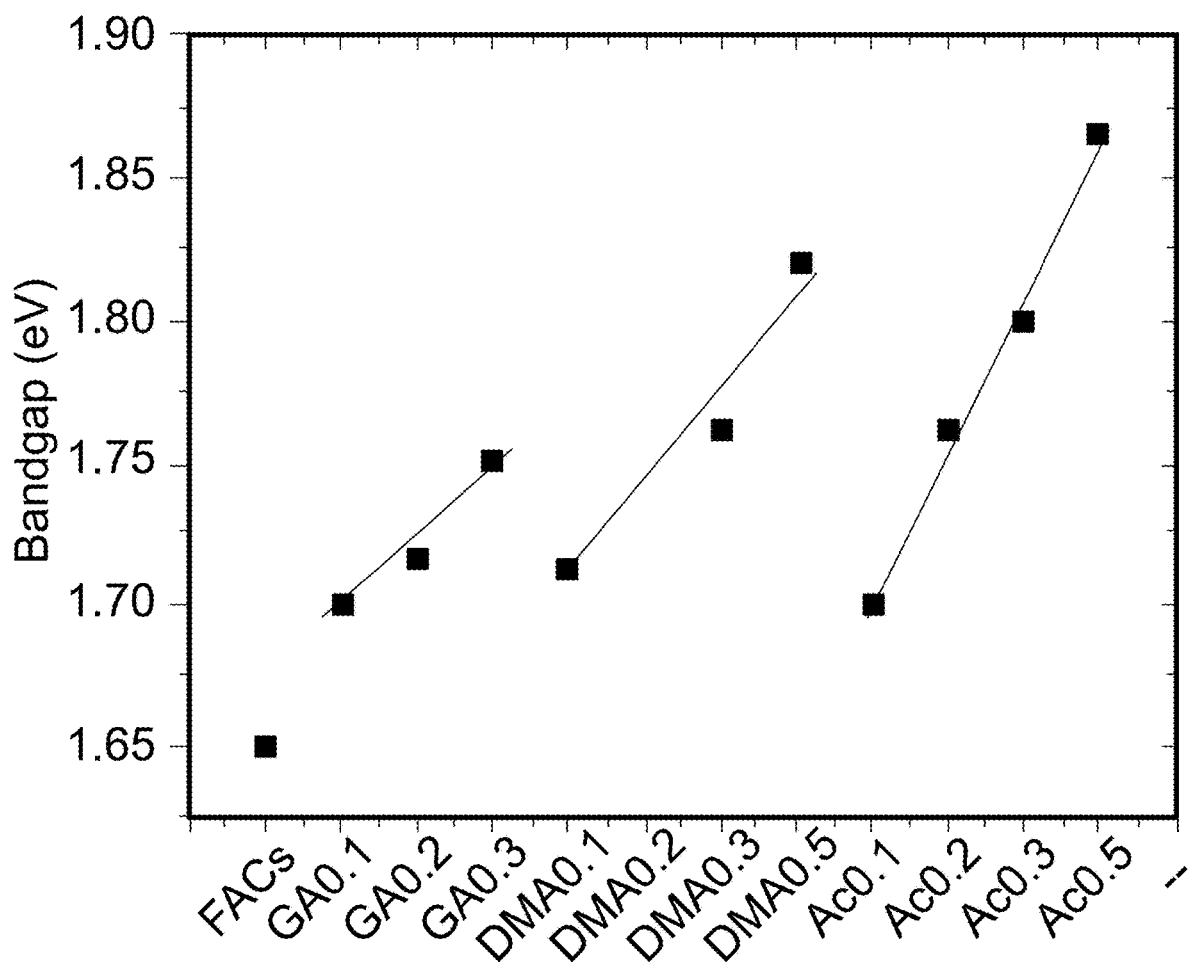
FIG. 11D illustrates bandgap extracted from Tauc plots showing increase in bandgap with adding large cations compensated with Cs, with Br fixed at 20%, according to some embodiments of the present disclosure. Lines added as an aid to the eye. Here, 'GA0.1' refers to 10% of the A-site cation being GA, and so forth.
Figure 12:
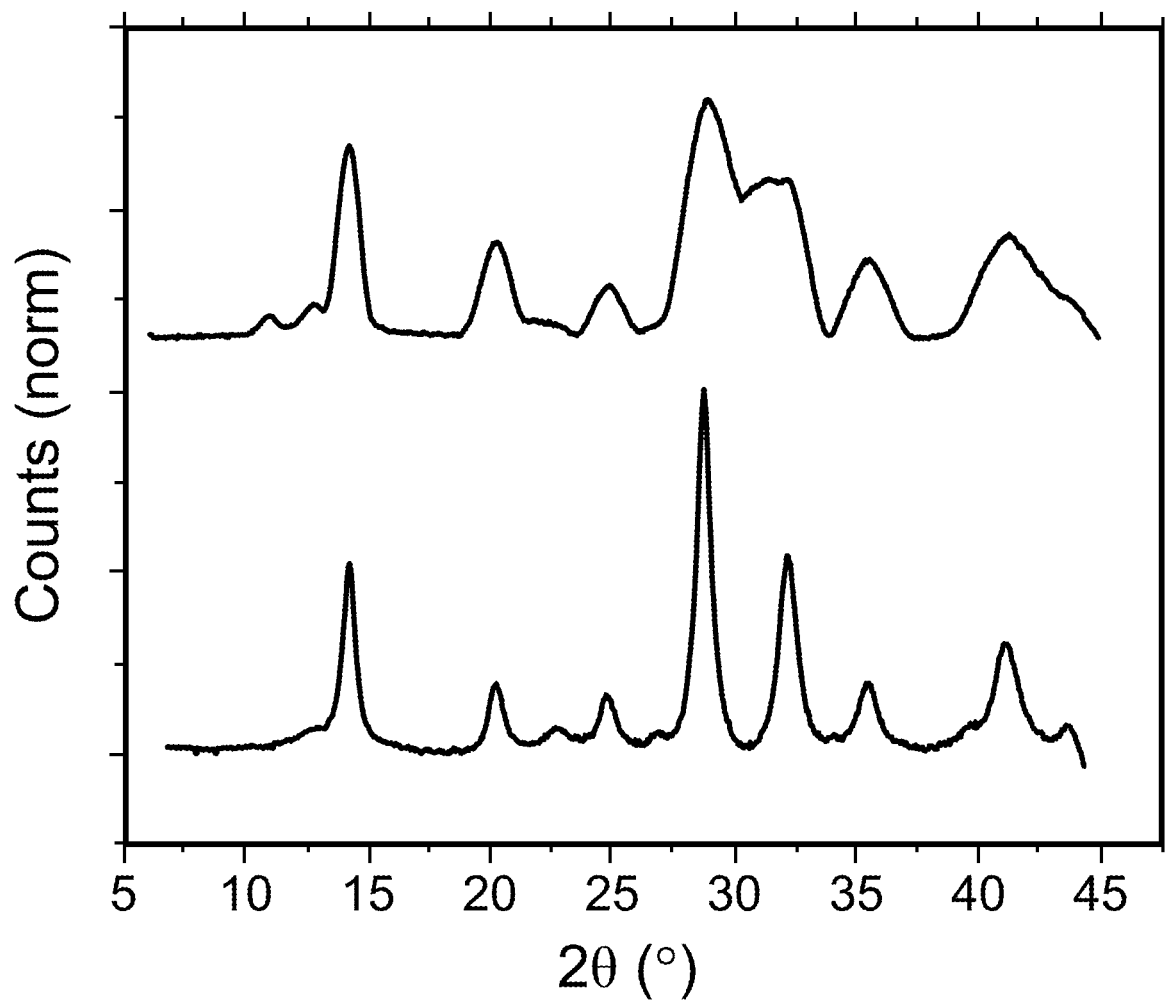
FIG. 12 illustrates XRD patterns for 10% DMA containing and non-DMA containing perovskite films, according to some embodiments of the present disclosure. No DMA=$FA_{0.8}Cs_{0.2}PbI_{2.1}Br_{0.9}$ (bottom curve), DMA=$DMA_{0.1}FA_{0.6}Cs_{0.3}PbI_{2.4}Br_{0.6}$ (top curve).

As shown herein, it was determined that compensating for large A-site cations with cesium worked to increase the bandgap for a range of larger cations, including acetamidinium (Ac), dimethylammonium (DMA), and guanidinium (GA) (see FIGS. 11A-C), which all appeared to increase the bandgap by a similar amount for a given fraction of the large cation. It was determined that films that used dimethylammonium as the large A-site cation were able to incorporate more of the large cation before forming a non-photoactive phase, so work was with this cation as the most promising option. FIG. 11D illustrates bandgap data extracted from Tauc plots showing increase in bandgap with adding large cations compensated with Cs, with Br fixed at 20%, according to some embodiments of the present disclosure. Lines added as an aid to the eye. Here, 'GA0.1' refers to 10 mol % of the A-site cation being GA, and so forth. Our initial x-ray examination (see FIG. 12) provides insufficient evidence favoring any one of the three hypotheses mentioned above, while the resulting changes in optical and device metrics are quite clear. (Referring to FIG. 12, the top curve is for 10% DMA/20% Br and the bottom curve is for no DMA/30% Br.)

Figure 13:
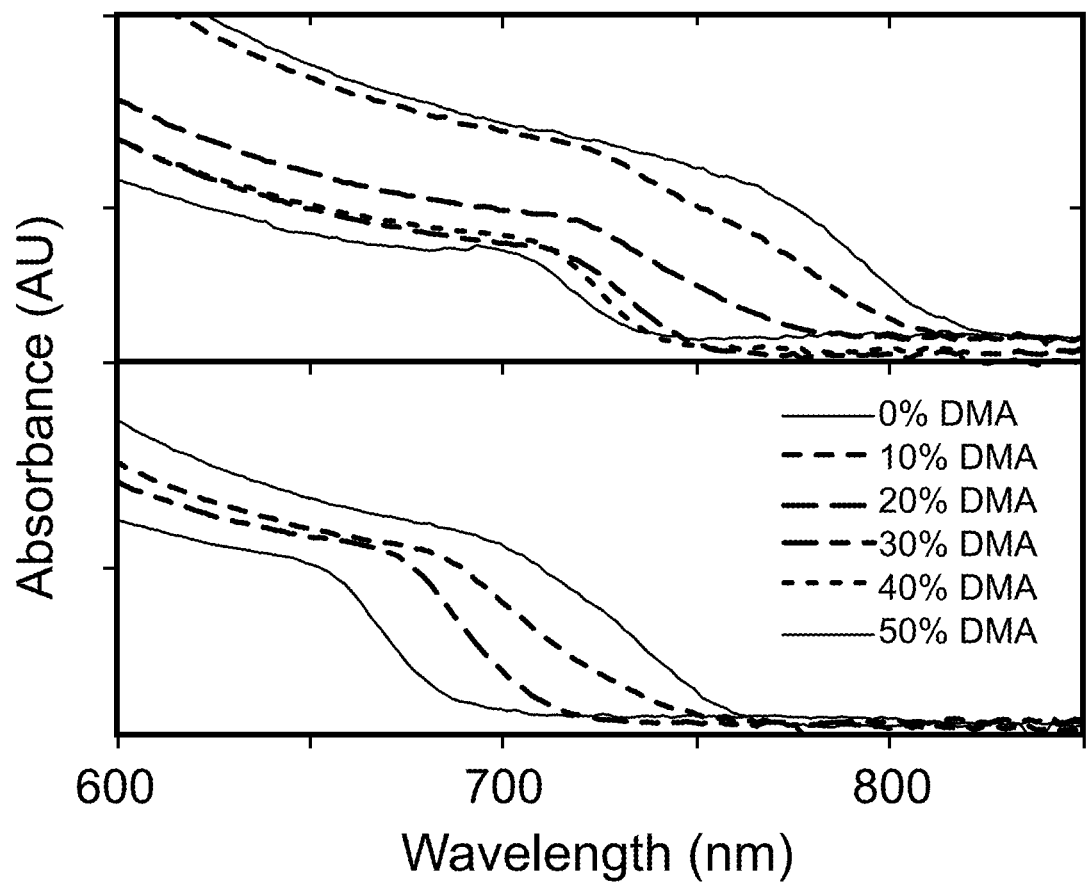
FIG. 13 illustrates UV-Vis absorbance spectra of perovskite films on glass made with increasing DMA % of the A-site, with (top) 0% bromine and (below) 20% Br, according to some embodiments of the present disclosure.
Figure 14:
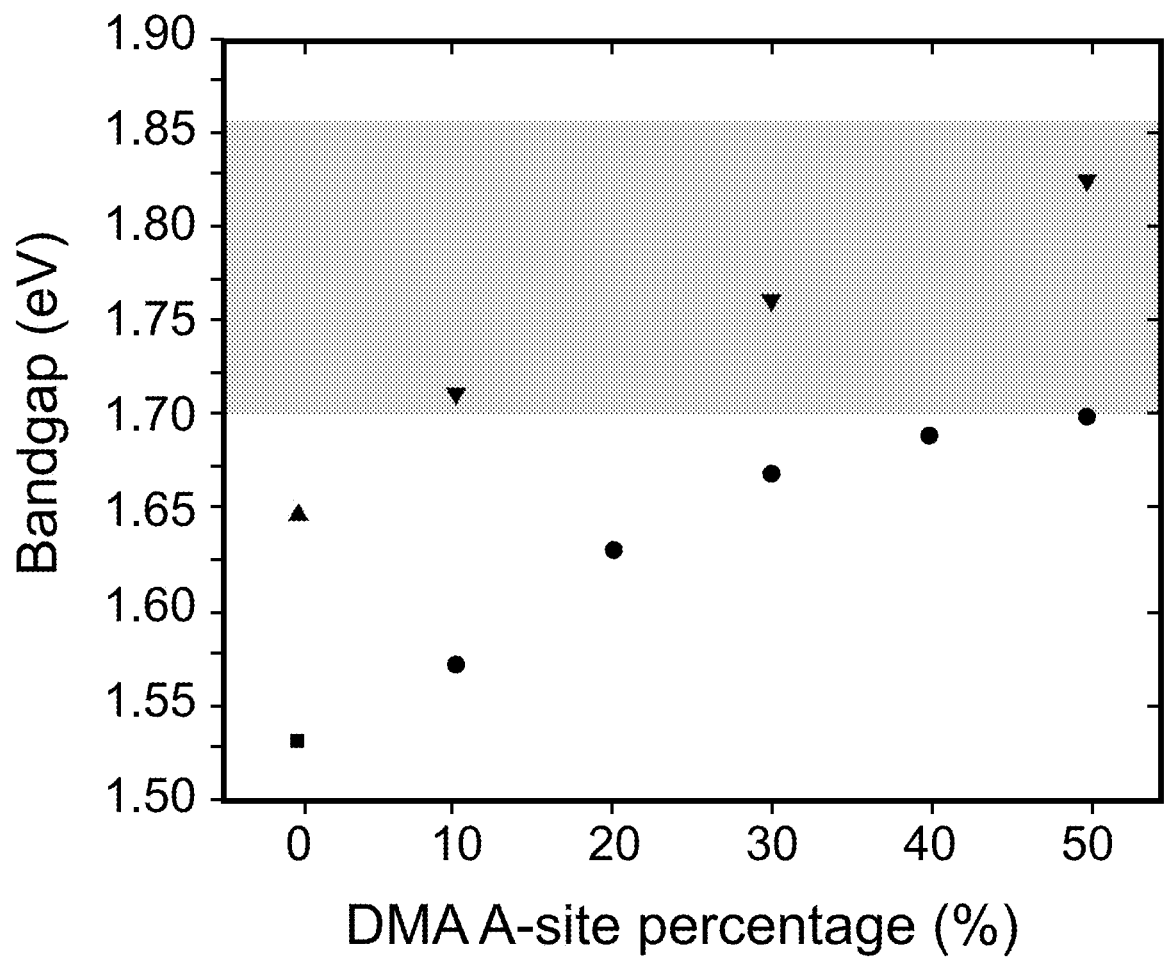
FIG. 14 illustrates bandgap data extracted from Tauc plots as a function of DMA % for 0 and 20% Br, according to some embodiments of the present disclosure. The region shaded blue represents the bandgaps relevant for wide gap subcells in perovskite tandems.
Figure 15:
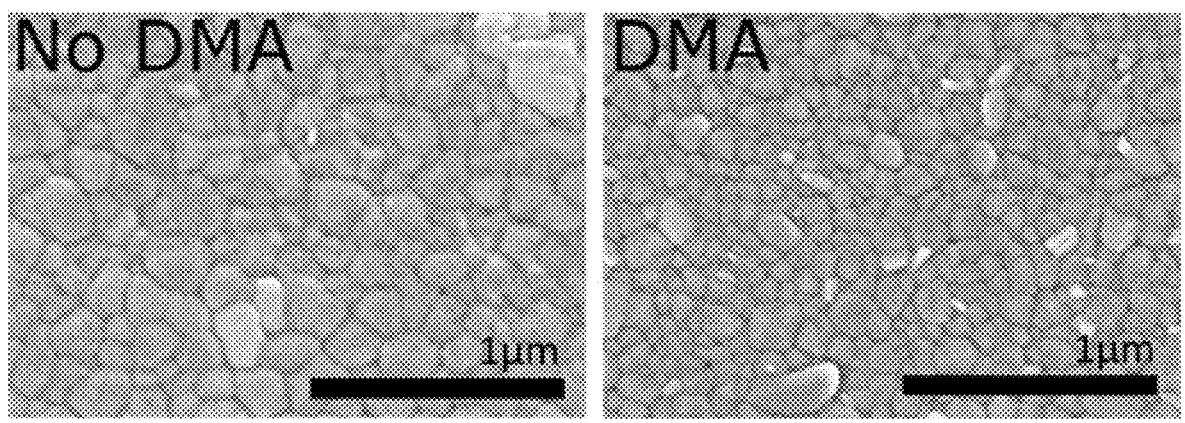
FIG. 15 illustrates scanning electron micrographs of perovskite films fabricated with and without DMA. No DMA=$FA_{0.8}Cs_{0.2}PbI_{2.1}Br_{0.9}$, DMA=$DMA_{0.1}FA_{0.6}Cs_{0.3}PbI_{2.4}Br_{0.6}$, according to some embodiments of the present disclosure.

Initially, tests were directed to determine whether wide enough bandgaps for tandems could be obtained using no bromine at all. FIG. 13 shows the absorption of $FA_{0.8(1-2x)}Cs_{0.2(1-2x)+x}DMA_xPbI_3$ with increasing DMA percentage, expressed as a fraction of the total A site (e.g. $0 \leq x \leq 0.50$). (The top curves correspond to zero percent Br; the bottom curves to 20% Br.) Note that here and hereafter, the formulae used for the composition refer to the composition of the precursor solution. A stable and efficient composition of 80% formamidinium, 20% cesium was initially synthesized. Next, the DMA % was increases, as was the Cs by an equimolar amount to compensate for the larger ionic radius of DMA. As DMA % increased, the absorption onset shifted to a shorter wavelength. Surprisingly, it was determined that one could add up to ~50% DMA before films became colorless—and 40-50% DMA enabled materials with a ~1.7 eV bandgap. However, XRD showed that at DMA percentages this high, there was a majority non-perovskite phase (see FIG. 9). Adding a small amount of bromine facilitated the formation of black phase perovskite (see FIG. 9), while also increasing the bandgap. 1.7 eV was targeted as the lowest optimal bandgap and it was found that majority black phase compositions with the correct bandgap existed between 0% DMA/30% Br and 25% DMA/10% Br. Bandgap tuning by increasing DMA % with a fixed amount of Br (20%) is shown in FIG. 14 (squares=0% Br; inverted triangles=20% Br). Tuning the bandgap with DMA in this way did not have a major effect on the perovskite film morphology (see FIG. 15).

Figure 16:
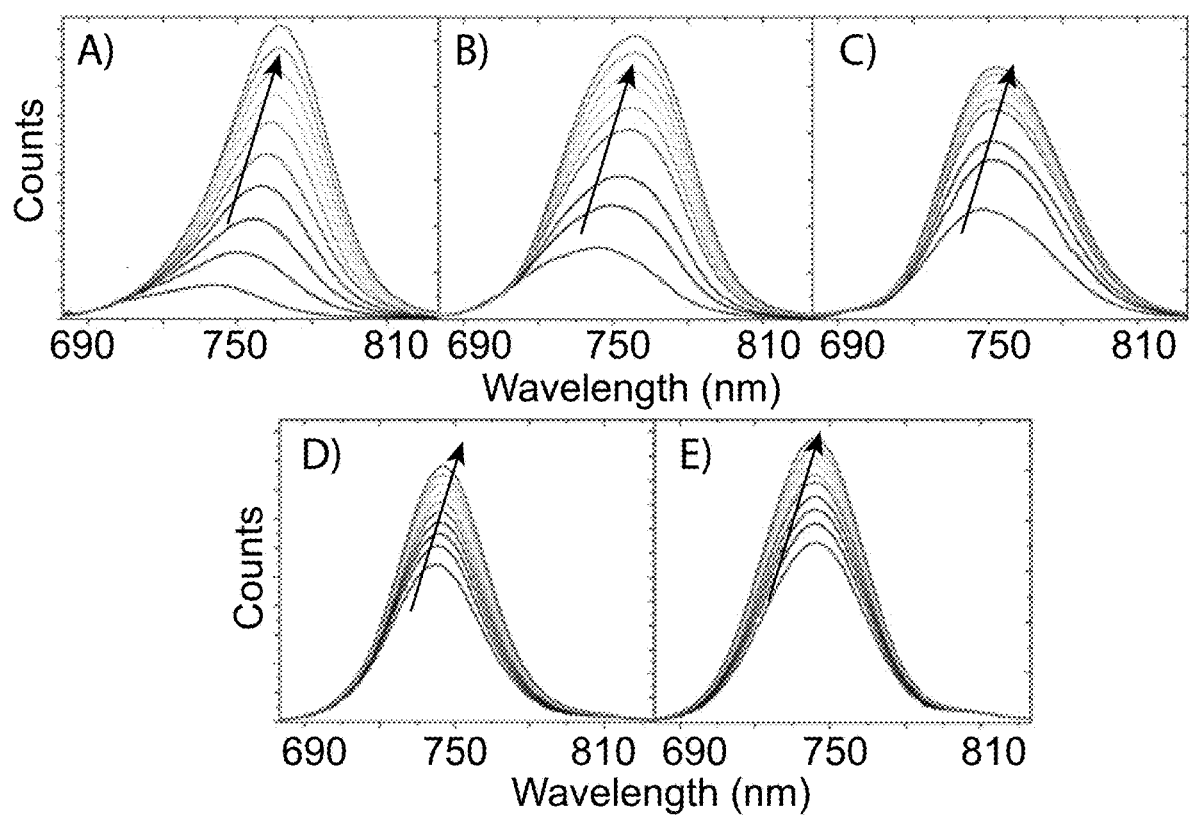
FIG. 16 illustrates photoluminescence spectra used to determine the peak shift over time plotted in FIG. 17, according to some embodiments of the present disclosure. Films were illuminated with a 1 mW 532 nm laser, spot size ~1 mm$^2$ continuously over the time measured (12.6 mins).
Figure 17:
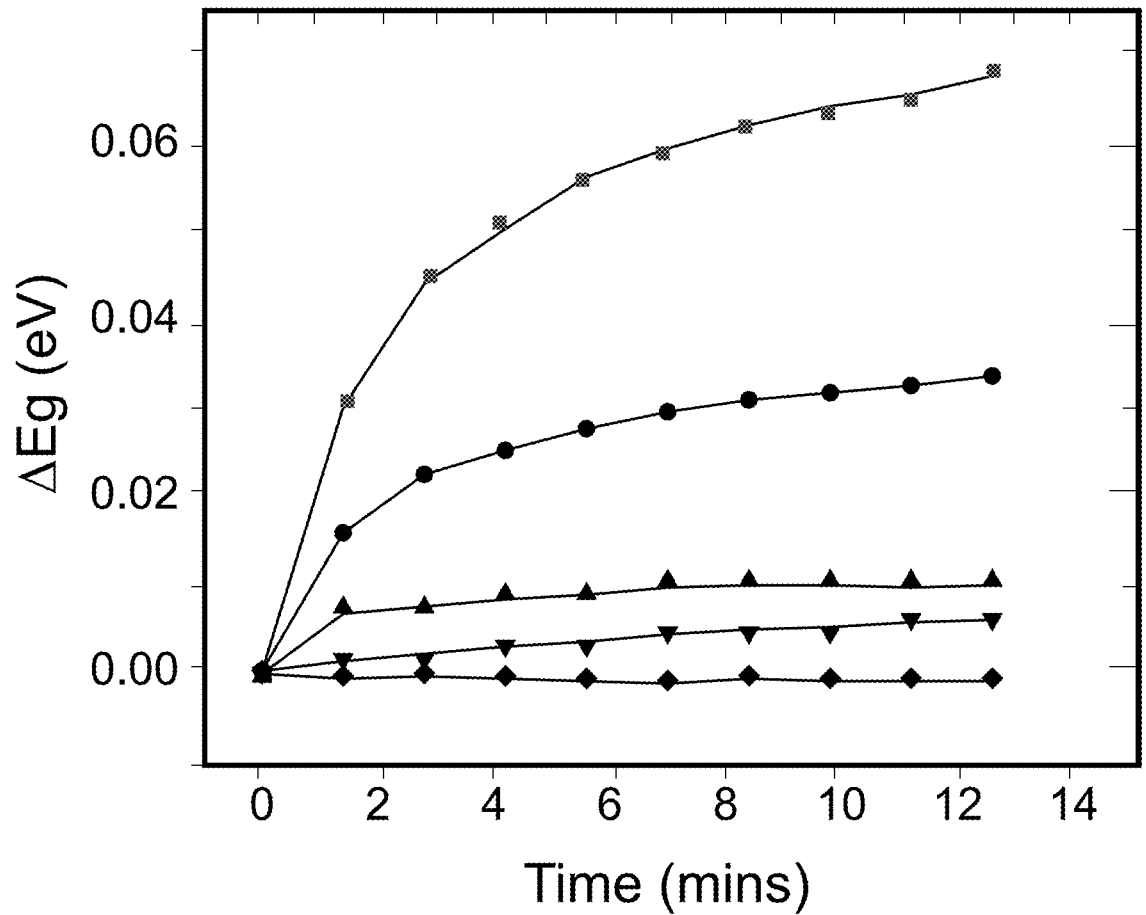
FIG. 17 illustrates the change in PL emission maximum as a function of time under illumination with a 1 mW 532 nm laser, spot size ~1 mm$^2$, for perovskite films with varying Br and DMA %, according to some embodiments of the present disclosure.

To test whether reduction of bromine, enabled by increasing DMA %, reduced the halide segregation relative to films with similar bandgaps, photoluminescence measurements were conducted under constant laser illumination (see FIG. 16). (Increasing time indicated by arrows from 0 minutes to 12.6 minutes, at 1.4 minute intervals. Panels A-E are as follows: A) 0% DMA/30% Br; B) 10% DMA/20% Br; C) 25% DMA/10% Br; D) 30% DMA/10% Br; and E) 40% DMA/0% Br) As shown in FIG. 17, it was determined that the films with reduced bromine showed a less severe change in the PL peak maximum over time, suggesting that halide segregation has indeed been reduced. The legend for FIG. 17 is as follows: squares=0% DMA/30% Br; circles=10% DMA/20% Br; triangles=25% DMA/10% Br; inverted triangles=30% DMA/10% Br; and diamonds=40% DMA/0% Br.

Figure 18:
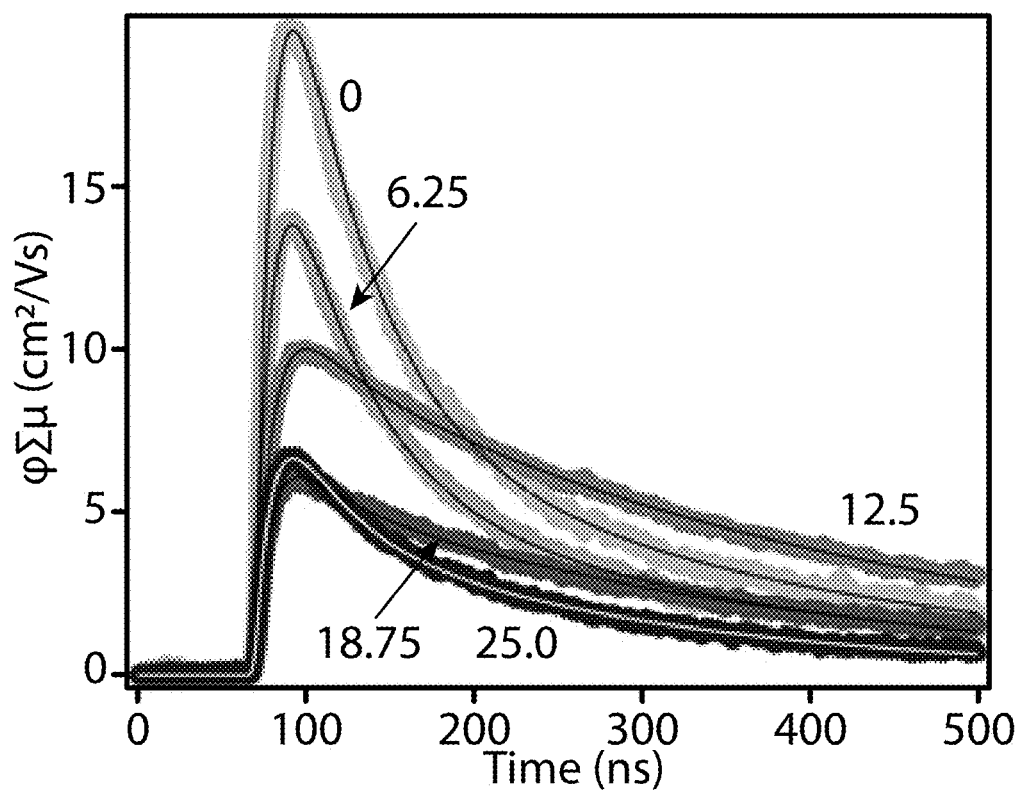
FIG. 18 illustrates microwave photoconductivity transients for samples with varying DMA content, according to some embodiments of the present disclosure. The measured transients are displayed as yield-mobility product and fitted with bi-exponential decays convoluted with the instrument response function. The excitation fluence for all samples is 1×10$^{10}$ cm$^{-2}$ at a wavelength of 580 nm.

A concern when adding large amounts of bulky organic, insulating cations such as DMA into the lattice is that the charge-carrier mobility may suffer as a result. To probe whether this would limit device performance, time-resolved microwave conductivity measurements were conducted (see FIG. 18) and found the lifetime of charge carriers in films of compositions with similar bandgap and varying DMA/Br %. (Numbers indicate the percent DMA.) Extracted mobility and lifetime as a function of DMA % is shown in FIG. 17. Indeed, addition of DMA does decrease charge-carrier mobility, dropping from 27 to 8 cm$^2$/Vs. This could be due to the inclusion of bulky organic species or a change in the band structure. However, it was also observed that upon increasing DMA from 0 to ~12%, the lifetime shows a large increase, before dropping as DMA % increases further. Combining the lifetime and mobility data, a composition with ~12% DMA would have a higher mobility-lifetime product than with no DMA, making it a superior material for solar cells.

Figure 19:
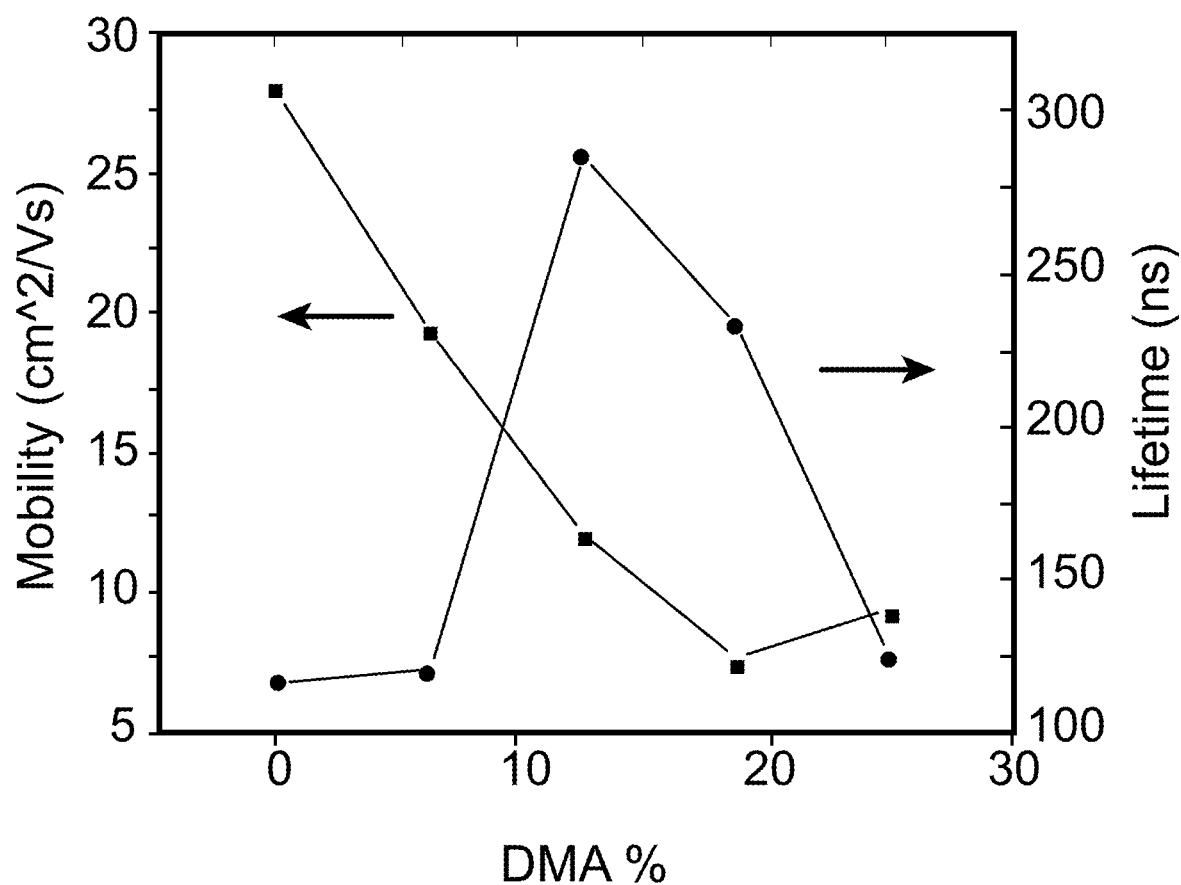
FIG. 19 illustrates mobility (squares) and charge-carrier lifetime (circles) extracted from time-resolved microwave conductivity as a function of DMA % for films with similar bandgap (attained by varying Br %), according to some embodiments of the present disclosure.
Figure 20:
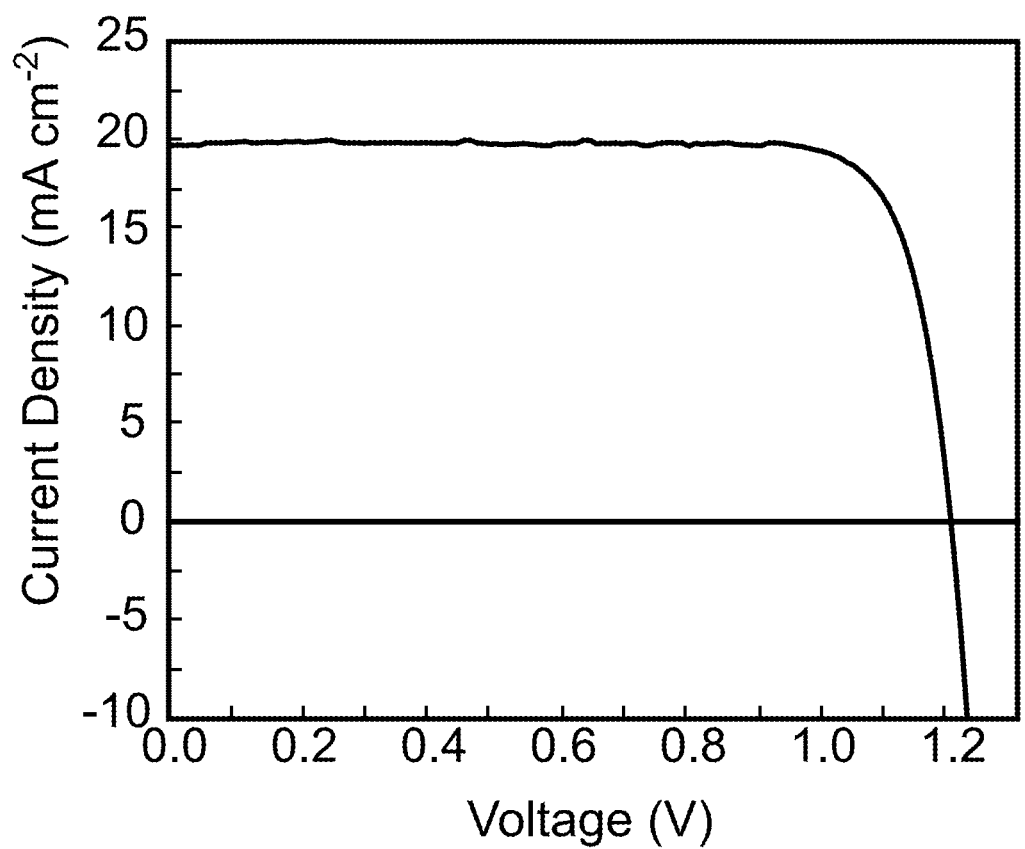
FIG. 20 illustrates current-voltage characteristics of champion DMA-containing device (10% DMA, 20% Br), according to some embodiments of the present disclosure.
Figure 21:
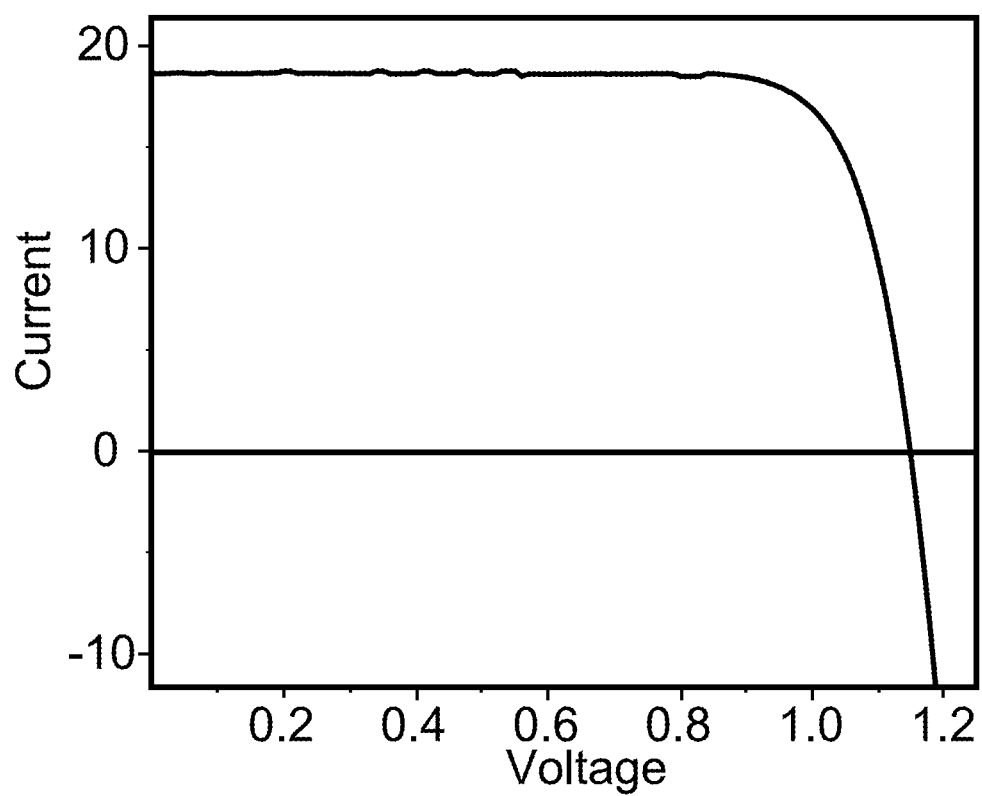
FIG. 21 illustrates current-voltage characteristics for control wide bandgap devices fabricated with no DMA (composition $FA_{0.8}Cs_{0.2}PbI_{2.1}Br_{0.9}$), according to some embodiments of the present disclosure.
Figure 22:
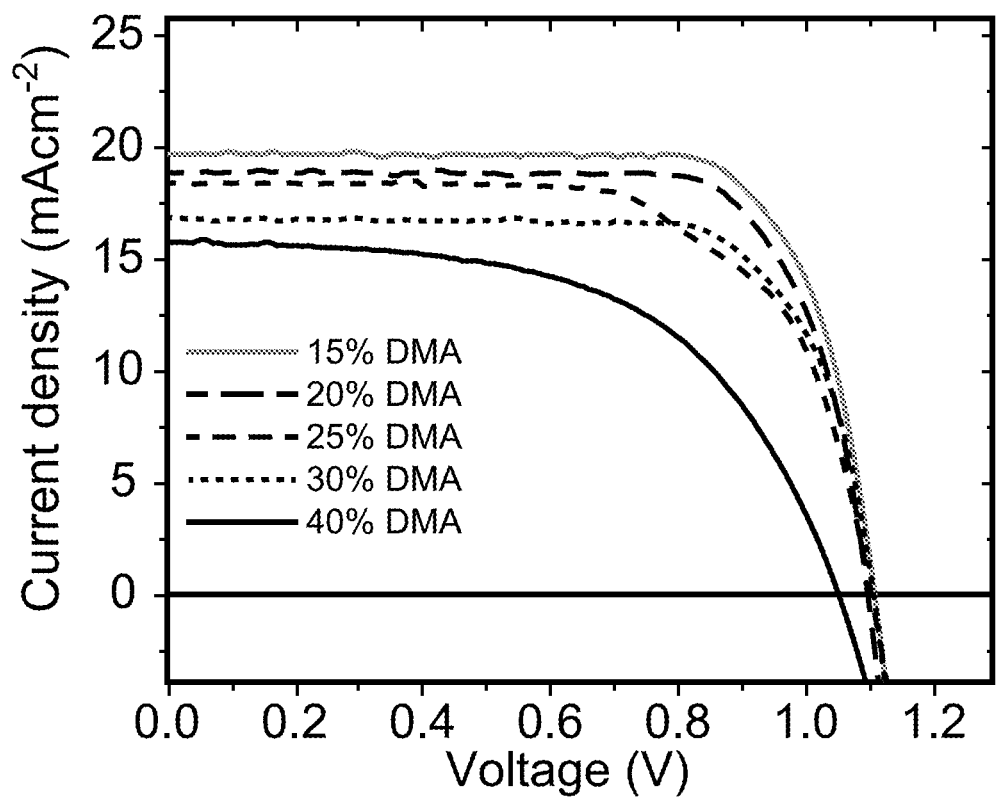
FIG. 22 illustrates current-voltage characteristics for wide bandgap devices manufactured with increasing DMA %, according to some embodiments of the present disclosure.
Figure 23:
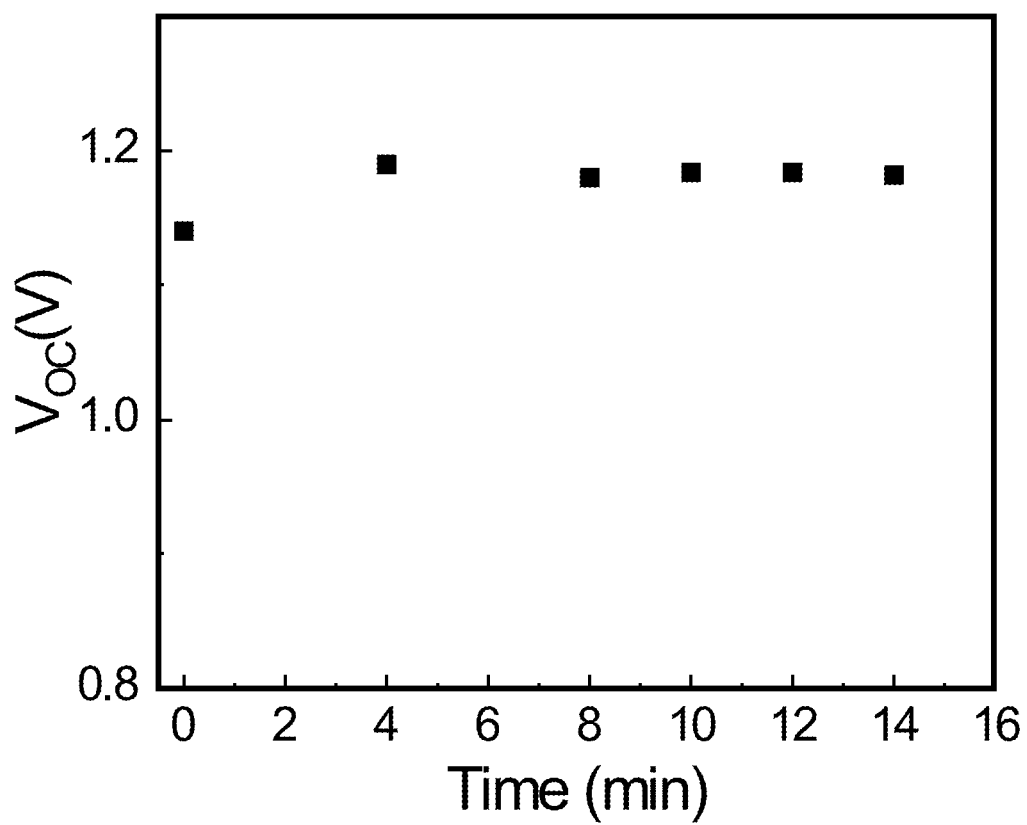
FIG. 23 illustrates open-circuit voltage of DMA-containing wide bandgap devices during light soaking under 1 sun AM1.5 illumination, according to some embodiments of the present disclosure.
Figure 24A:
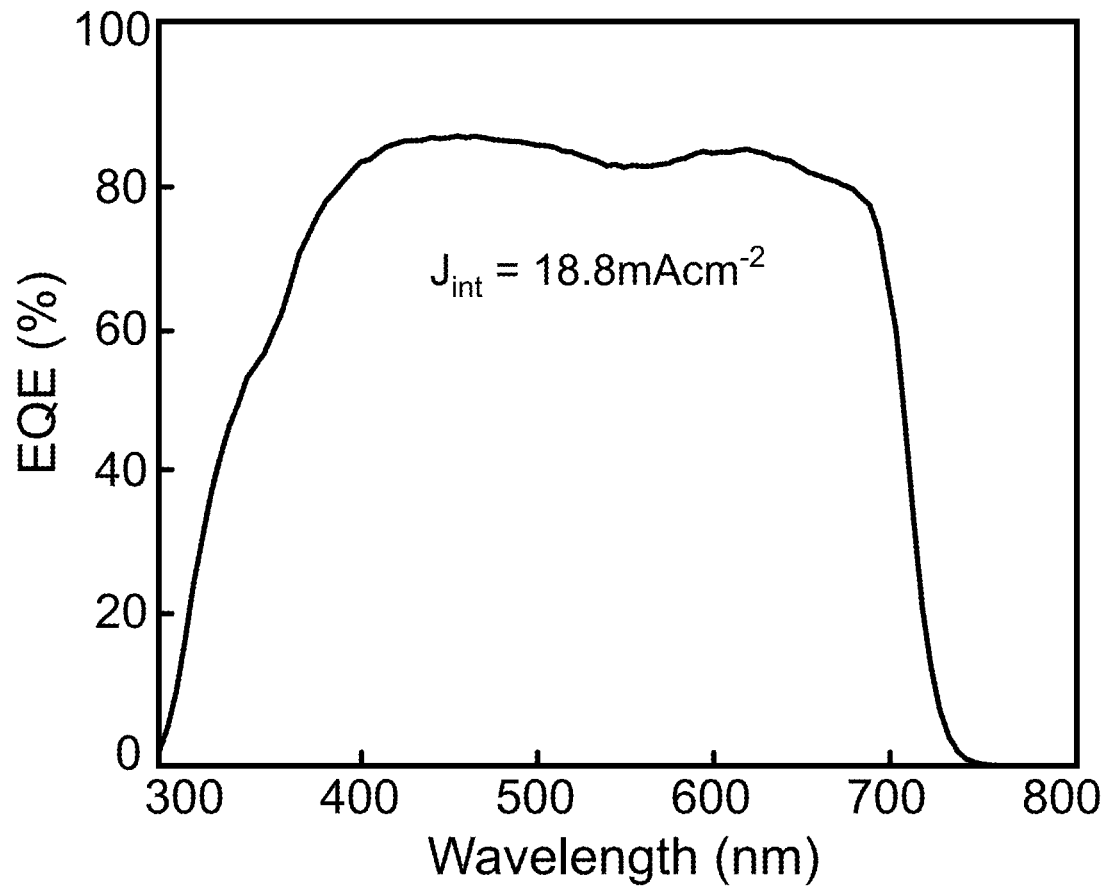
FIGS. 24A, 24B, and 24C illustrate, FIG. 24A external quantum efficiency spectrum.
Figure 24B:
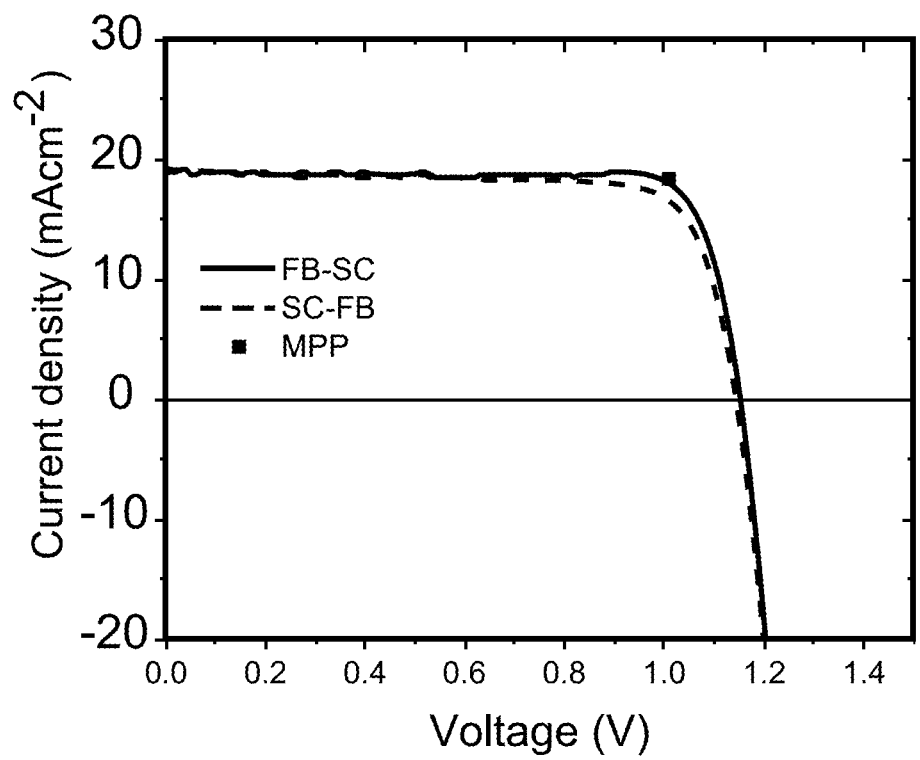
Figure 24C:
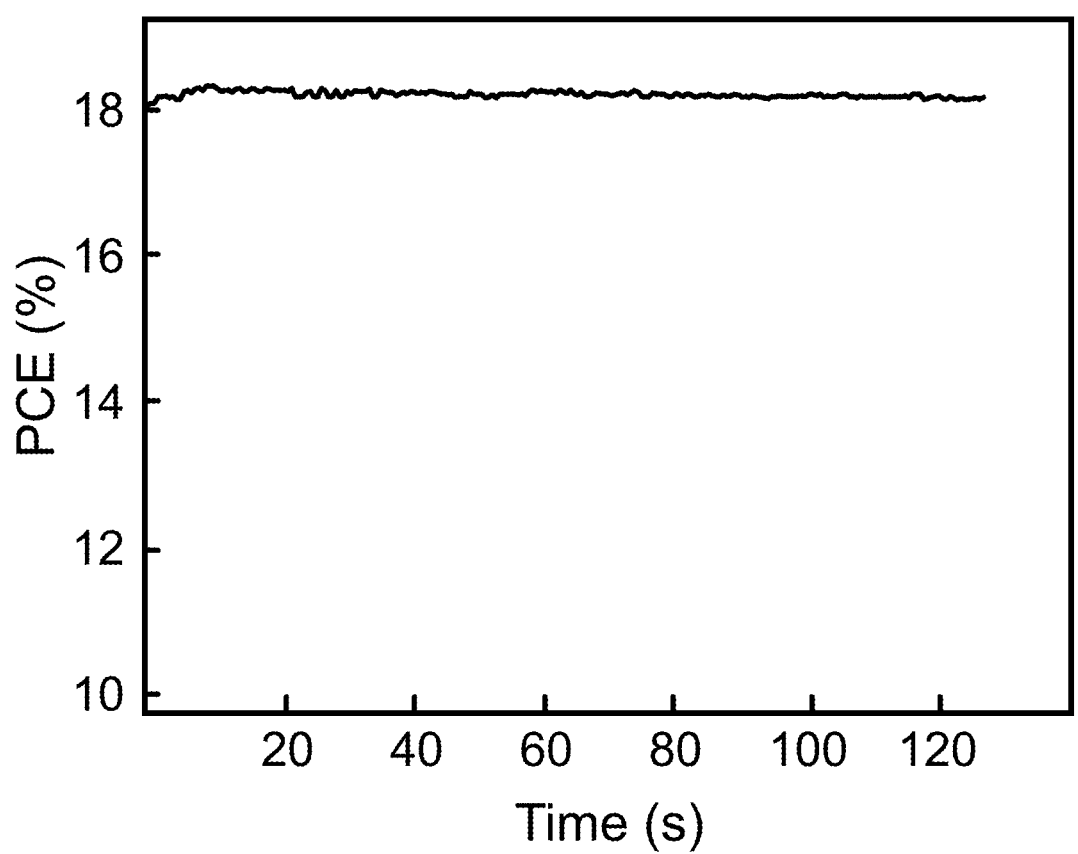

Thus, 10-12% DMA incorporation was chosen as the optimum composition for a 1.7 eV material, and fabricated PV devices with this perovskite (nominal composition of $DMA_{0.1}FA_{0.6}Cs_{0.3}PbI_{2.4}Br_{0.6}$), in the p-i-n architecture ITO/PolyTPD/PFN-Br/perovskite/LiF/C$_{60}$/AZO/IZO/Ag. Ultra-thin PFN-Br and LiF were utilized as effective recombination-suppressing interlayers. Champion devices with PCE ~19% were attained, as shown in FIG. 19. FIG. 20 illustrates current-voltage characteristics of a champion DMA-containing device (10% DMA, 20% Br); performance metrics as follows: $J_{sc}$=19.6 mA/cm2; Voc=1.20 V; FF=0.82; and PCE=19.2%. Control devices with no DMA attain high efficiencies, but voltage was limited to ~1.15V, at 0% DMA, 20% Cs, and 30% Br (see FIG. 21). Increasing DMA content further caused a drop in PV performance (see FIG. 22) with figures of merit in Table 1 below). DMA-containing devices attained voltages of 1.2V. Importantly, it was shown that this voltage was stable after light soaking at open circuit for 10 minutes, demonstrating negligible impact of phase segregation on device performance (see FIG. 23). External quantum efficiency for a DMA-containing perovskite cell is shown in FIG. 24A ($J_{int}$=18.8 ma/cm$^2$).

TABLE 1

| Performance parameters | | | | |
|---|---|---|---|---|
| DMA % | $J_{sc}$ (mAcm$^{-2}$) | $V_{oc}$ (V) | FF (%) | PCE (%) |
| 15 | 19.6 | 1.10 | 77 | 16.5 |
| 20 | 18.9 | 1.10 | 75 | 15.6 |
| 25 | 18.3 | 1.10 | 65 | 13.1 |
| 30 | 16.9 | 1.10 | 74 | 13.7 |
| 40 | 15.7 | 1.05 | 57 | 9.4 |

Figure 25:
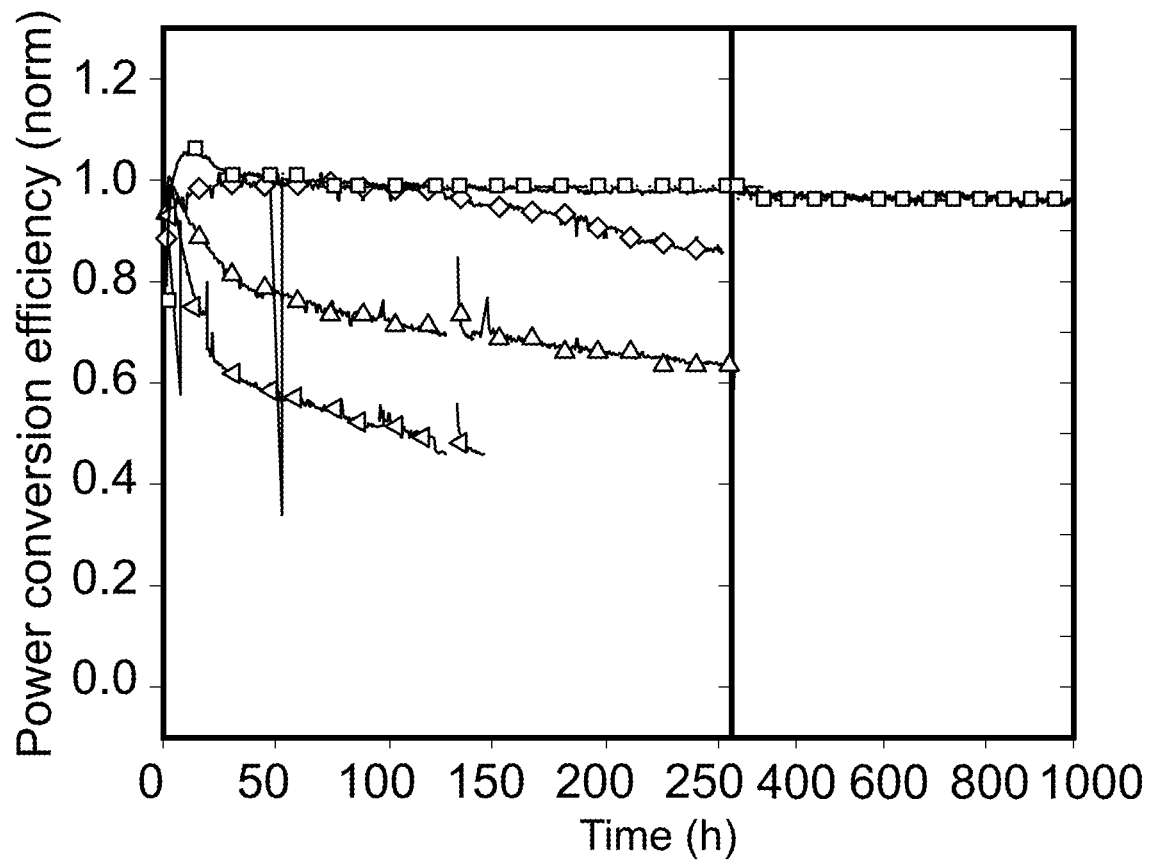
FIG. 25 illustrates long-term stability of perovskite devices with varying DMA and Br %, according to some embodiments of the present disclosure. Devices were held under load and constant illumination, in either air or N$_2$ environments as denoted in the caption. Note the change in axis scale at 260 hours. Devices in N$_2$ had the architecture ITO/PolyTPD/PFN-Br/perovskite/LiF/C60/BCP/Au, and the composition chosen was 10% DMA to correlate with the champion tandem. The 10% and 12% DMA device data are normalized at 50 hours. The legend for FIG. 25 is as follows: triangles=0% DMA/30% Br (air); diamonds=12% DMA/20% Br (air); circles=20% DMA/10% Br (air); and squares=10% DMA/20% Br (nitrogen).
Figure 26A:
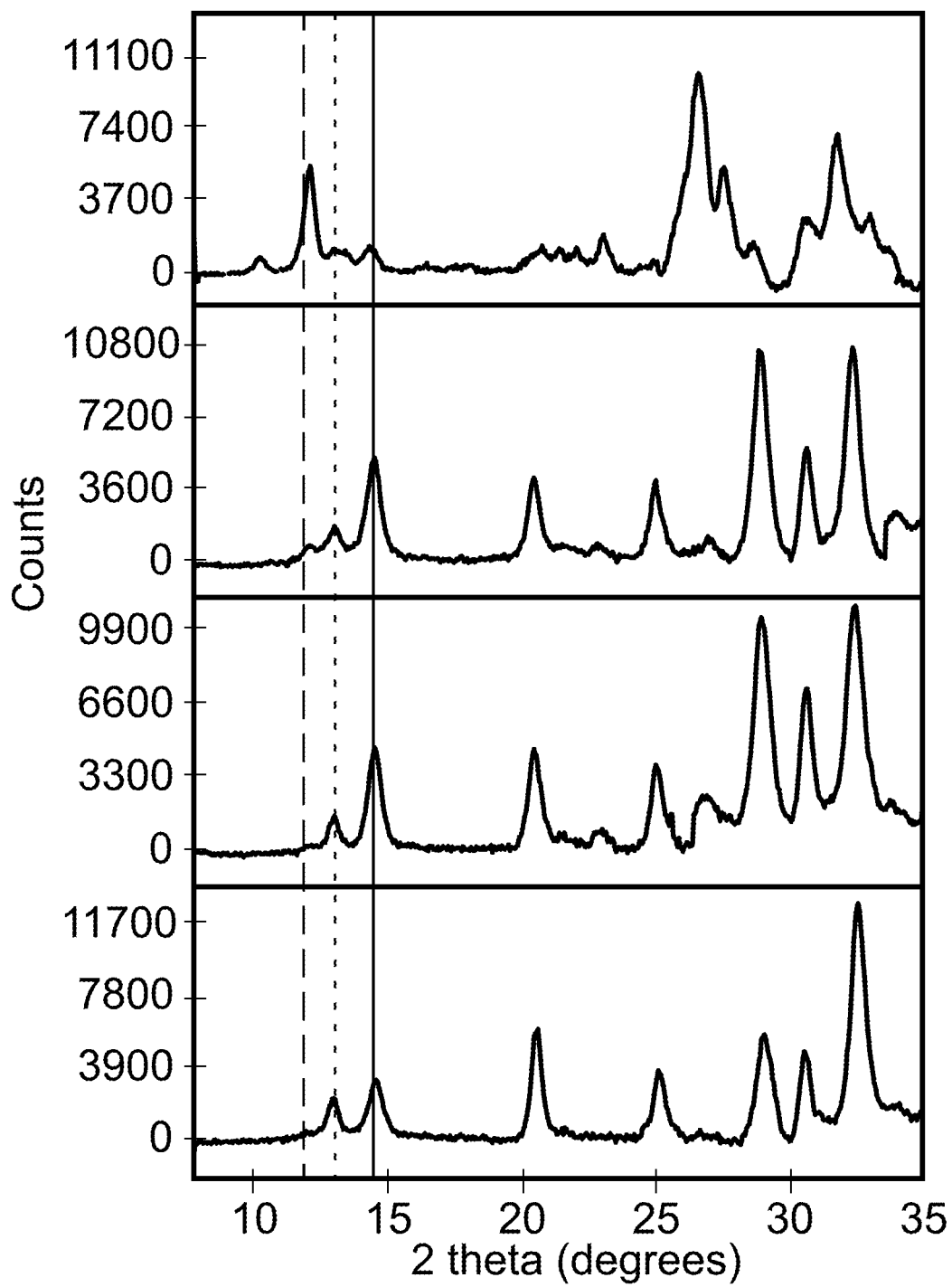
FIG. 26A illustrates XRD patterns of DMA-containing wide gap devices after air+light aging test for 1000 hours, according to some embodiments of the present disclosure. From top to bottom, 20% DMA, 12% DMA, 10% DMA, and 0% DMA. Solid vertical line=black perovskite phase; short dashed vertical line=PbI$_2$; and long dashed vertical line=DMA-rich yellow phase.
Figure 26B:
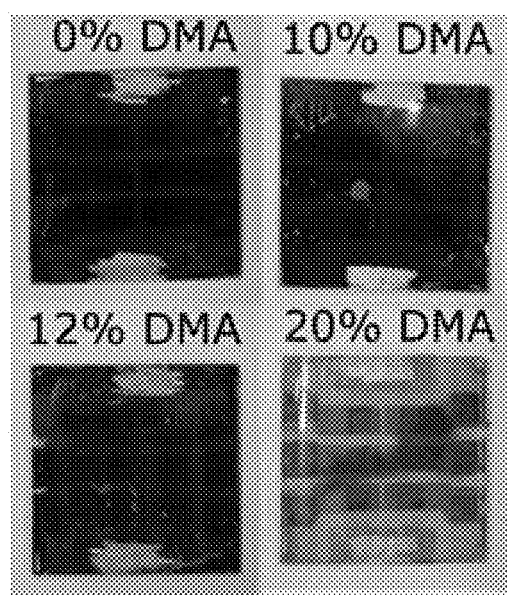
FIG. 26B illustrates photographs of the devices measured in FIG. 26A, after aging, according to some embodiments of the present disclosure.

Long-term stability tests were carried out on devices with varying DMA content. An ALD-grown Al$_2$O$_3$ was utilized as an encapsulant, and held devices under constant bias under illumination in air, at a constant 25° C. The performance over time for varying DMA content is shown in FIG. 25. It was observed that the 0% DMA control device drops to ~80% of its initial efficiency within 50 hours, having only ~70% of initial efficiency after 250 hours. Devices with 10-12% DMA fared better, retaining over 90% of initial PCE over the same time. At 20% DMA, stability was worse than 0% DMA. Examination of the 20% DMA cells after aging showed that these devices had discolored and undergone a phase transition to a non-perovskite phase (see FIGS. 26A and 26B). The superior long-term stability of the 10-12% DMA devices indicates that this material should be most suitable for the wide bandgap cell in a tandem, and superior to the 0% DMA material. To avoid the potential impact of atmospheric interactions, DMA-containing devices were also tested under illumination in nitrogen atmosphere. Over 1000 hours, no decrease in performance was observed, as plotted in FIG. 25.

Figure 27A:
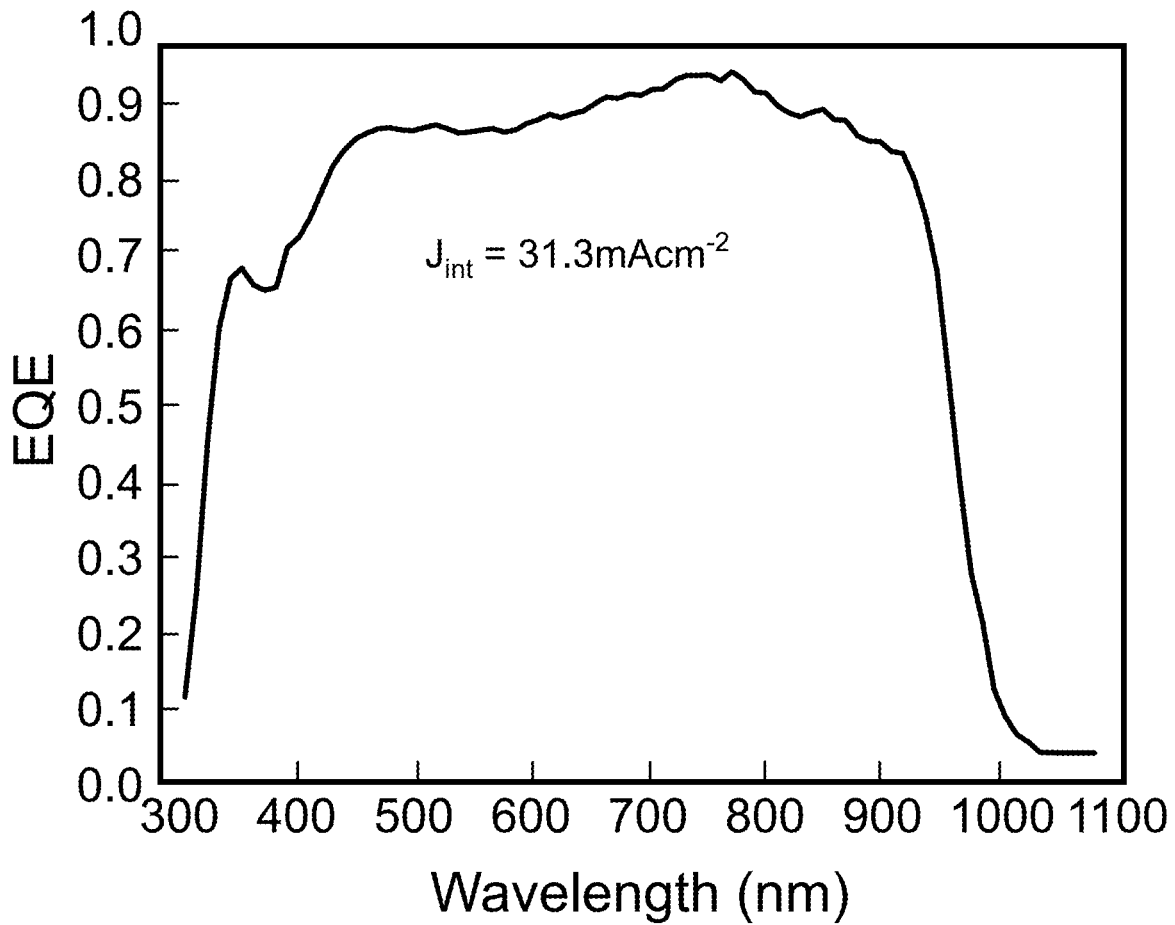
FIG. 27A illustrates external quantum efficiency spectrum for a DMA-containing perovskite, according to some embodiments of the present disclosure. For this same exemplary perovskite, FIG. 27B forward and reverse current-voltage scans, where FB-SC=forward bias to short circuit.
Figure 27B:
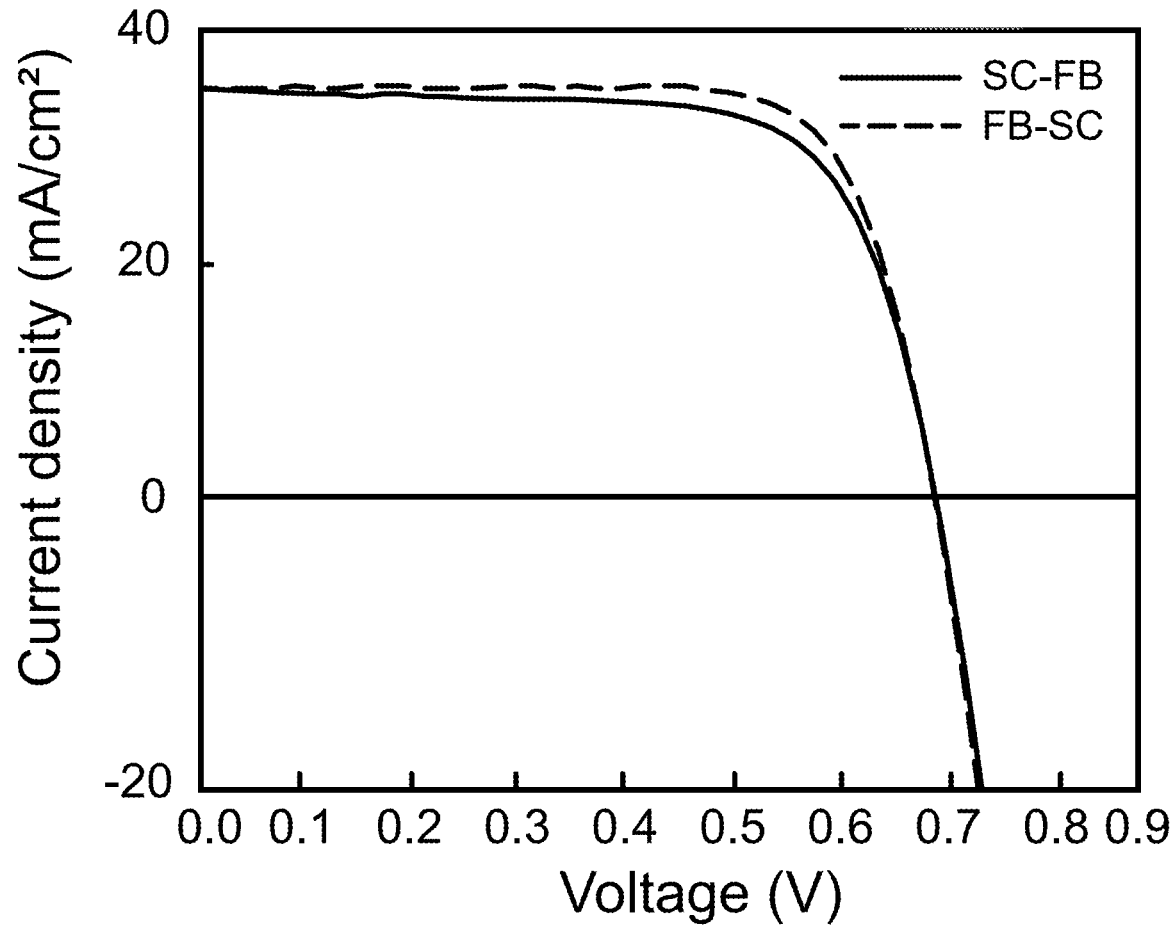
FIG. 27C maximum power point tracking data for single junction low bandgap devices, according to some embodiments of the present disclosure. $J_{sc}$ was 31.7 mA cm$^{-2}$ as measured on the solar simulator and 31.3 mA cm$^{-2}$ from integrating the measured EQE. Current-voltage scans were carried out at 0.47 V/s.
Figure 27C:
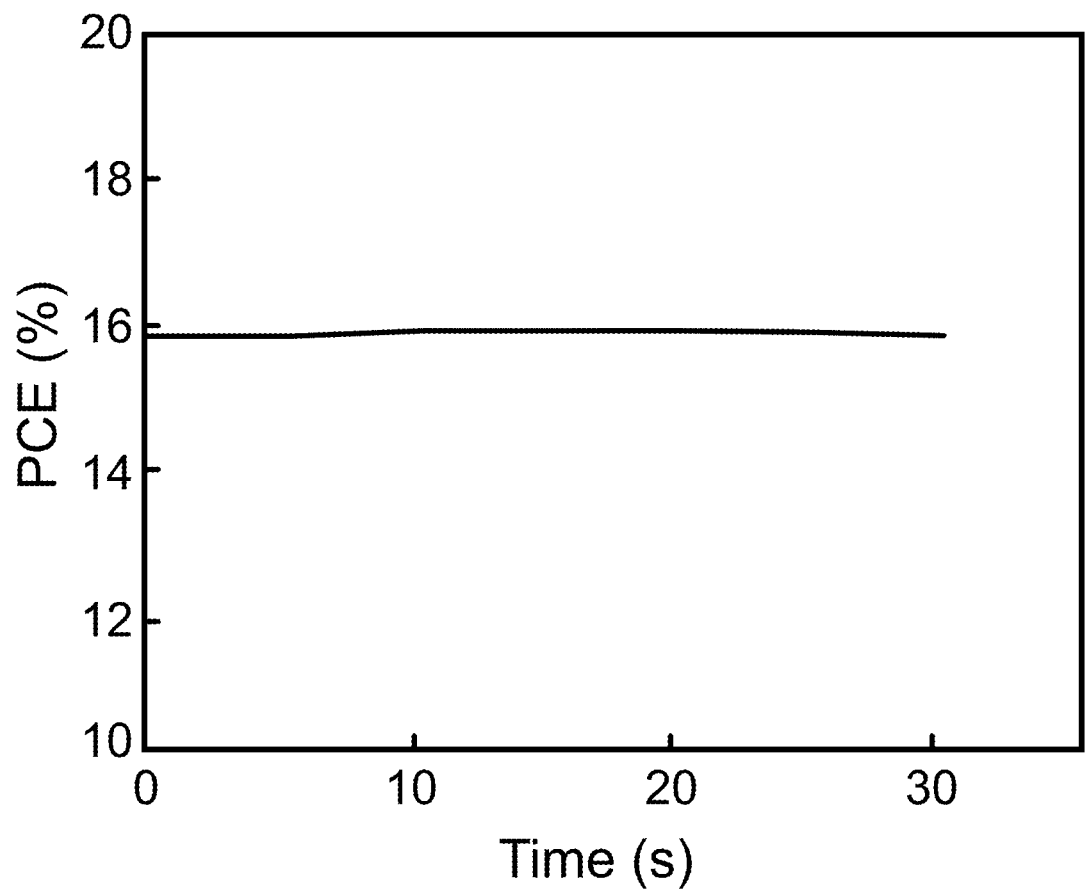

All-perovskite tandem devices were made by processing a low gap subcell on top of a DMA-containing wide gap subcell terminated with a recombination layer. The low gap device structure was PEDOT: PSS/perovskite/C$_{60}$/BCP/Ag, with a thick (~850 nm) low gap perovskite with composition $FA_{0.75}Cs_{0.25}Sn_{0.5}Pb_{0.5}I_3$. Single junction devices made using this composition were able to attain efficiencies of 16.5%, reaching short-circuit currents of over 31 mA/cm$^2$ with 0.69V, FF of about 0.76 as shown in FIGS. 27A-27C.

These efficiencies are not as high as those achieved with $MA_xFA_{1-x}Sn_{0.60}Pb_{0.40}I_3$ compositions but have more tractable stability challenges than the higher tin content perovskites. Thus, the more stable $FA_{0.75}Cs_{0.25}Sn_{0.5}Pb_{0.5}I_3$ composition was chosen for the tandem devices described herein.

Figure 28:
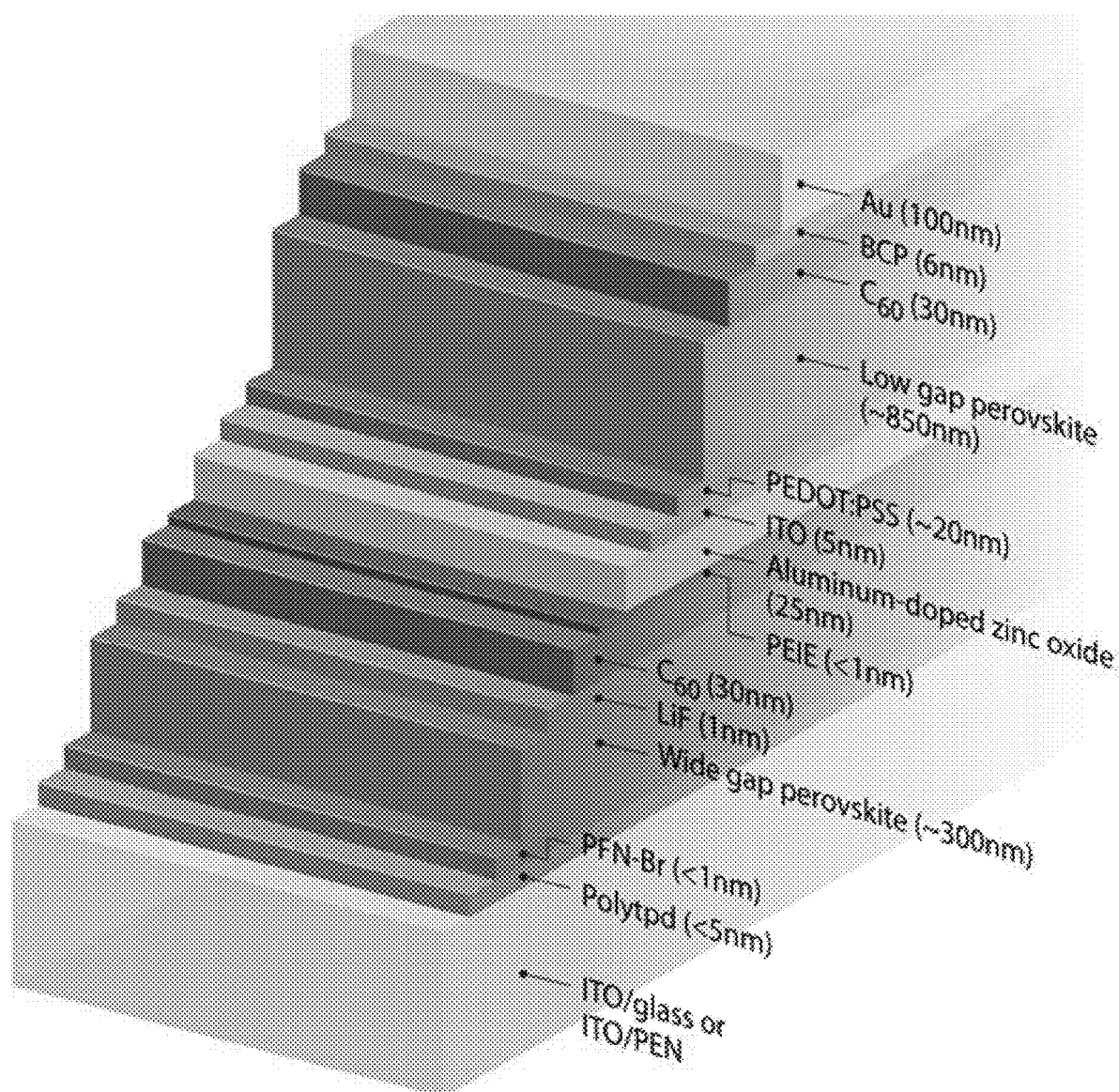
FIG. 28 illustrates a full tandem device stack schematic with approximate thicknesses of each layer, according to some embodiments of the present disclosure.
Figure 29:
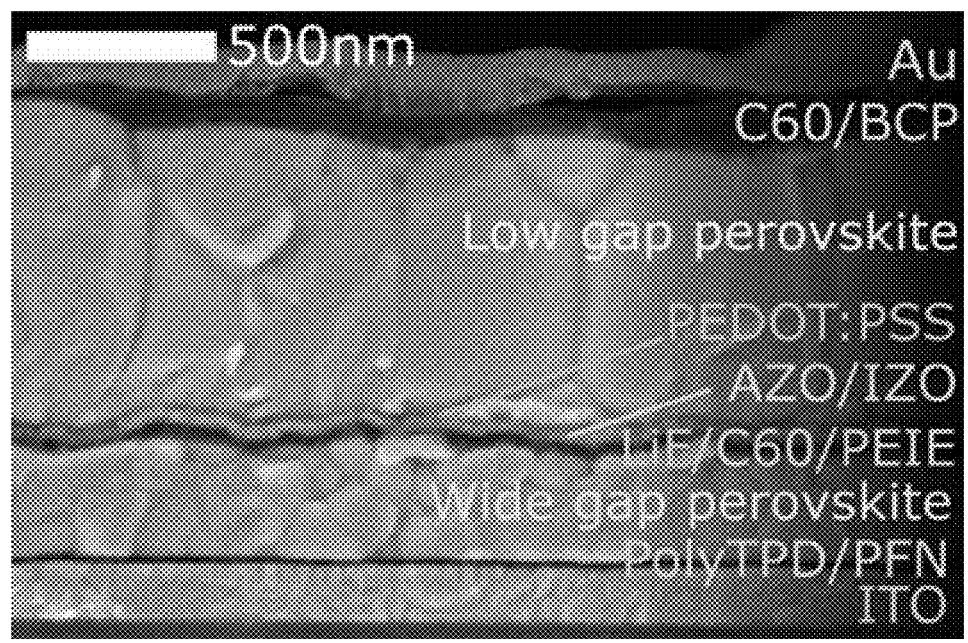
FIG. 29 illustrates a cross-sectional scanning electron micrograph of all-perovskite tandem, according to some embodiments of the present disclosure.
Figure 30A:
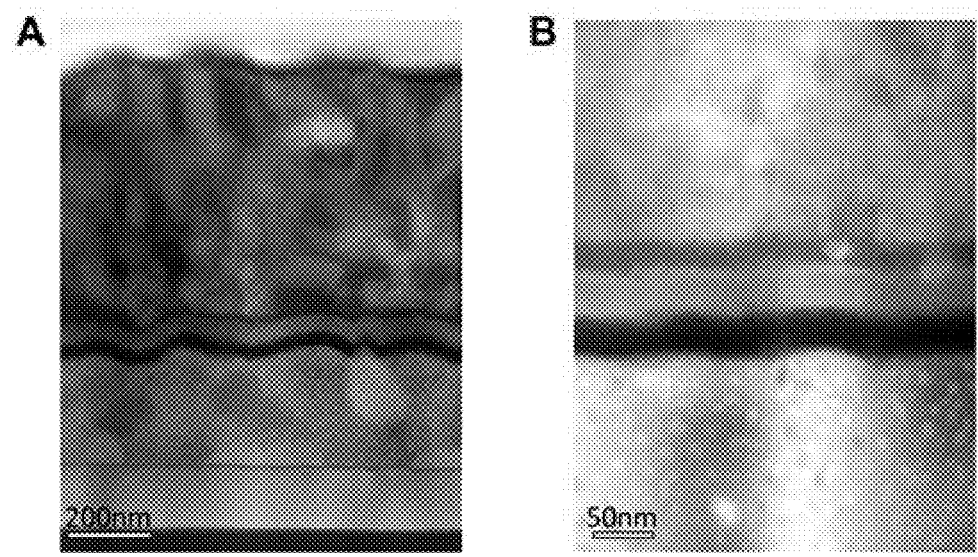
FIG. 30A illustrates Panel A and Panel B scanning electron microscopy high-angle annular dark-field (STEM HAADF) images of the full device stack and the $C_{60}$/PEIE/AZO/ITO recombination layer, respectively, according to some embodiments of the present disclosure.
Figure 30B:
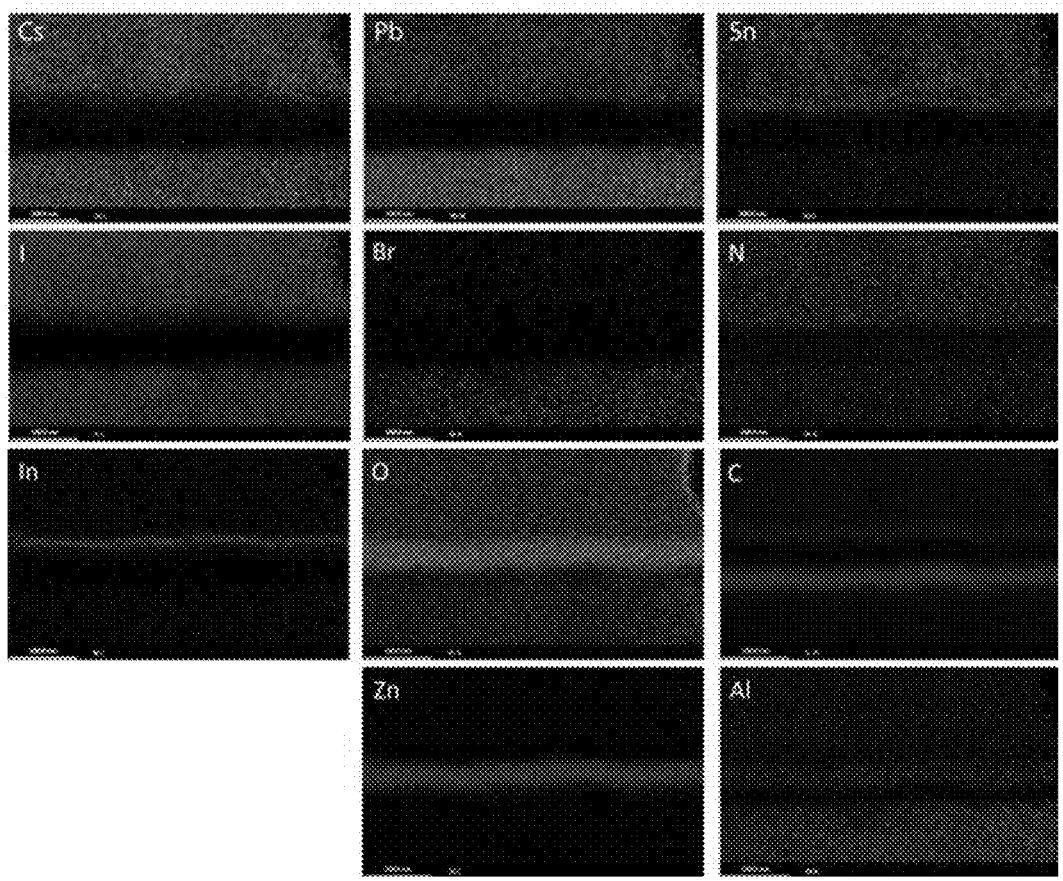
FIG. 30B illustrates energy dispersive x-ray elemental mapping of the recombination layer of Panel B of FIG. 30A, according to some embodiments of the present disclosure.
Figure 31:
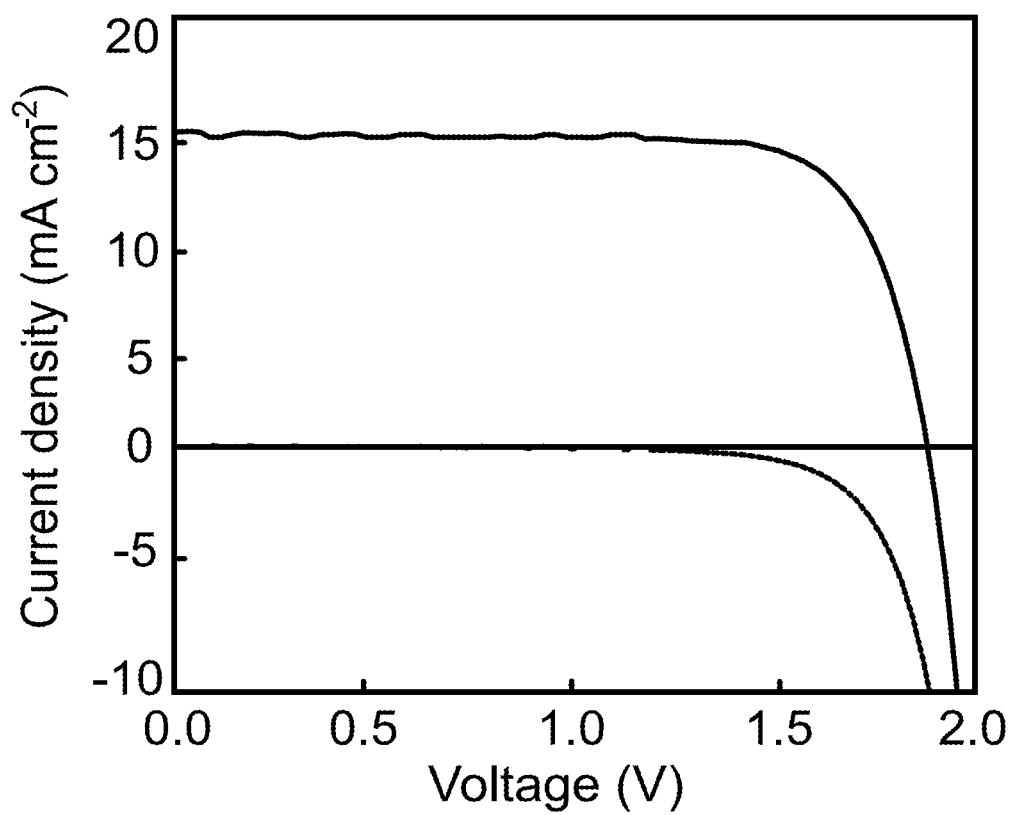
FIG. 31 illustrates current-voltage characteristics for an all-perovskite 2T tandem device, measured under AM1.5 illumination and ensuring minimal (<1.5%) mismatch between subcells, according to some embodiments of the present disclosure.
Figure 32A:
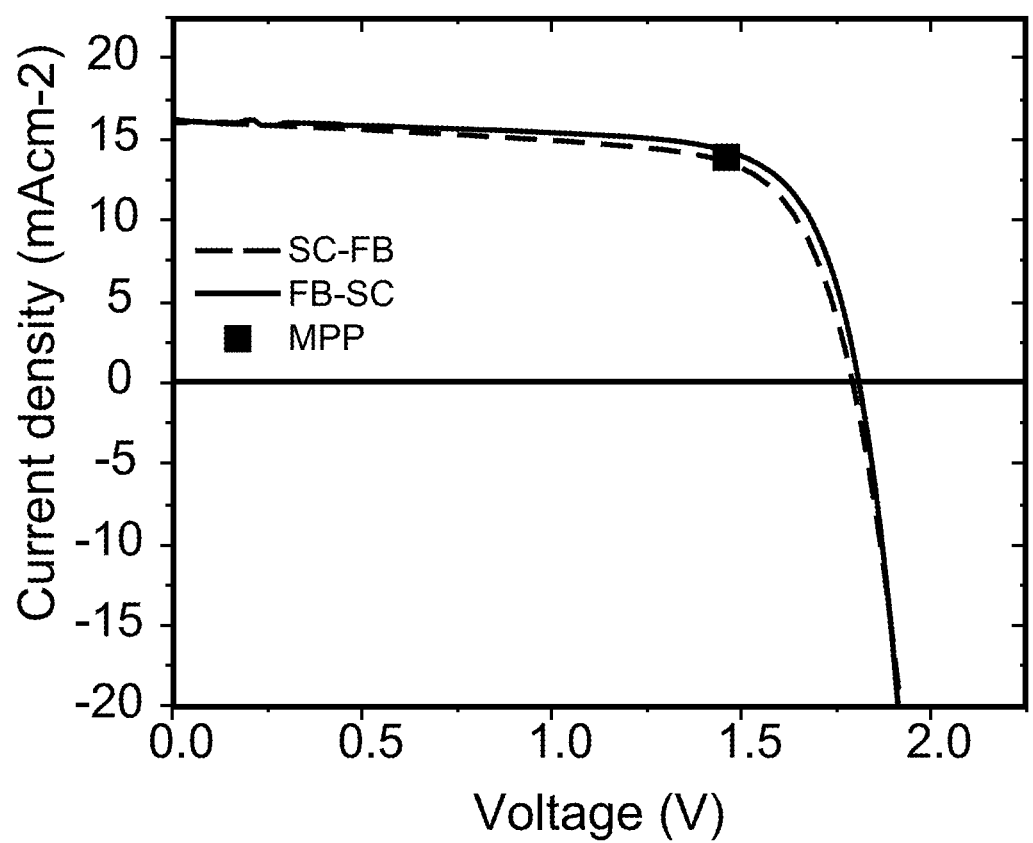
FIGS. 32A and 32B illustrate forward and reverse current-voltage scans for a tandem device and maximum power point tracking over 10 min for the same device, respectively, according to some embodiments of the present disclosure. The PCE determined from MPP is shown on the JV plot as a blue square. Current-voltage scans were carried out at 0.47V/s.
Figure 32B:
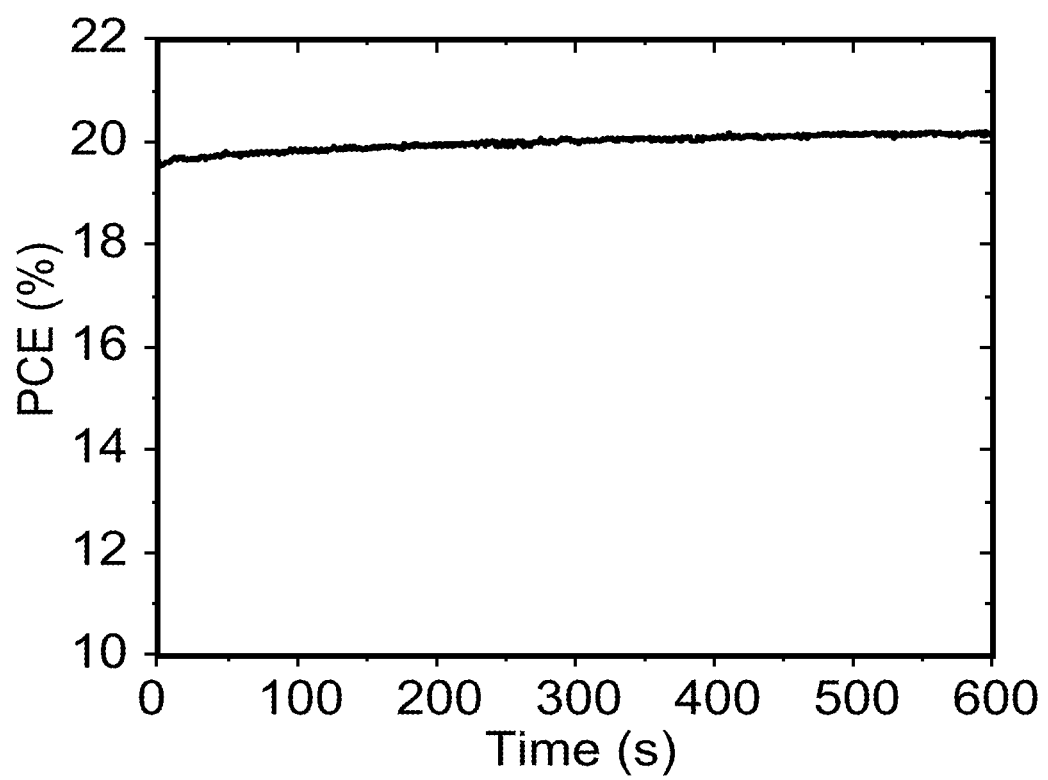
Figure 33:
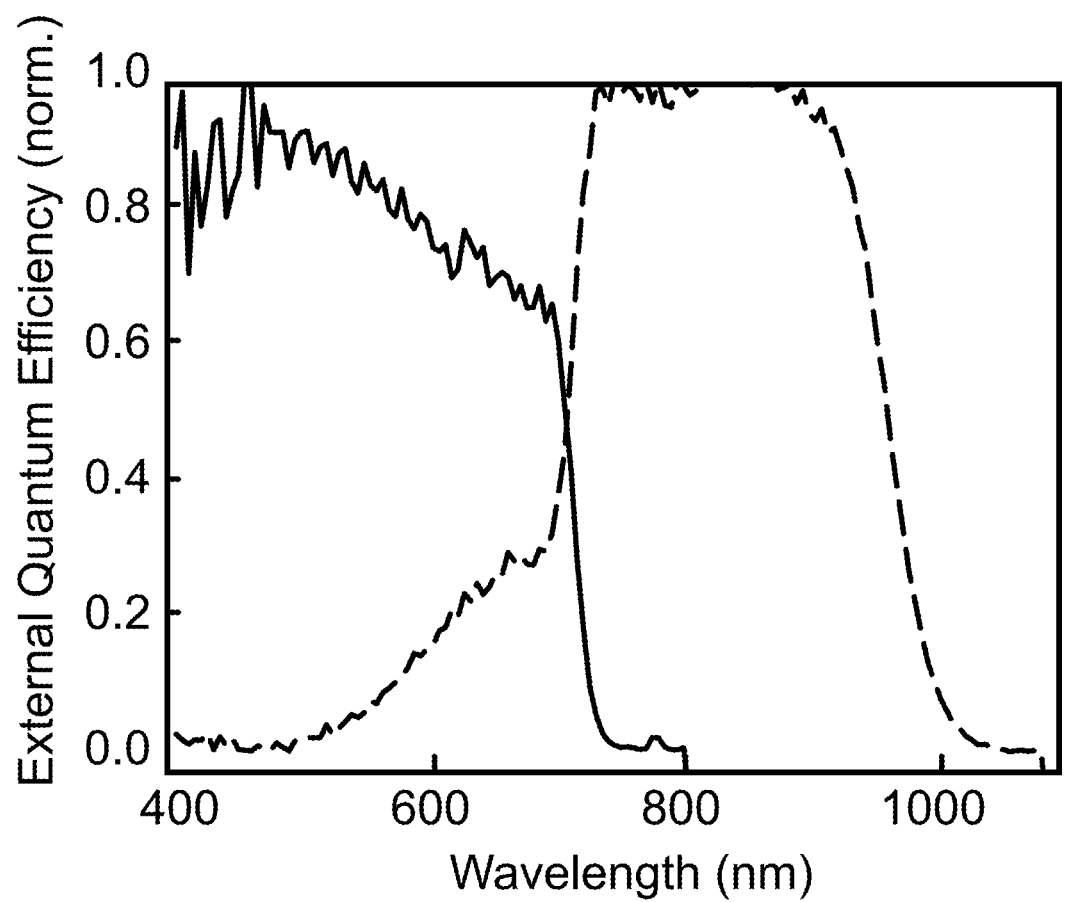
FIG. 33 illustrates normalized external quantum efficiency spectra for the sub-cells of the same tandem, according to some embodiments of the present disclosure.
Figure 34:
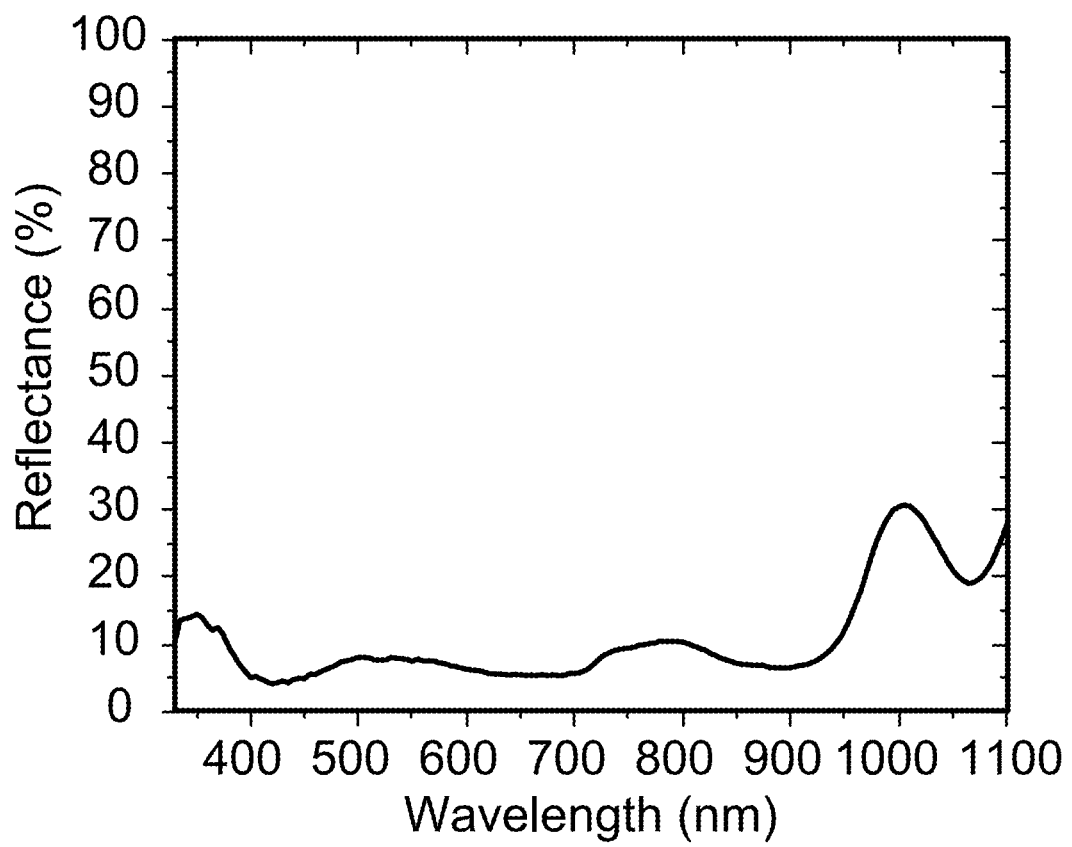
FIG. 34 illustrates reflectance spectrum for the champion tandem device, according to some embodiments of the present disclosure.
Figure 35:
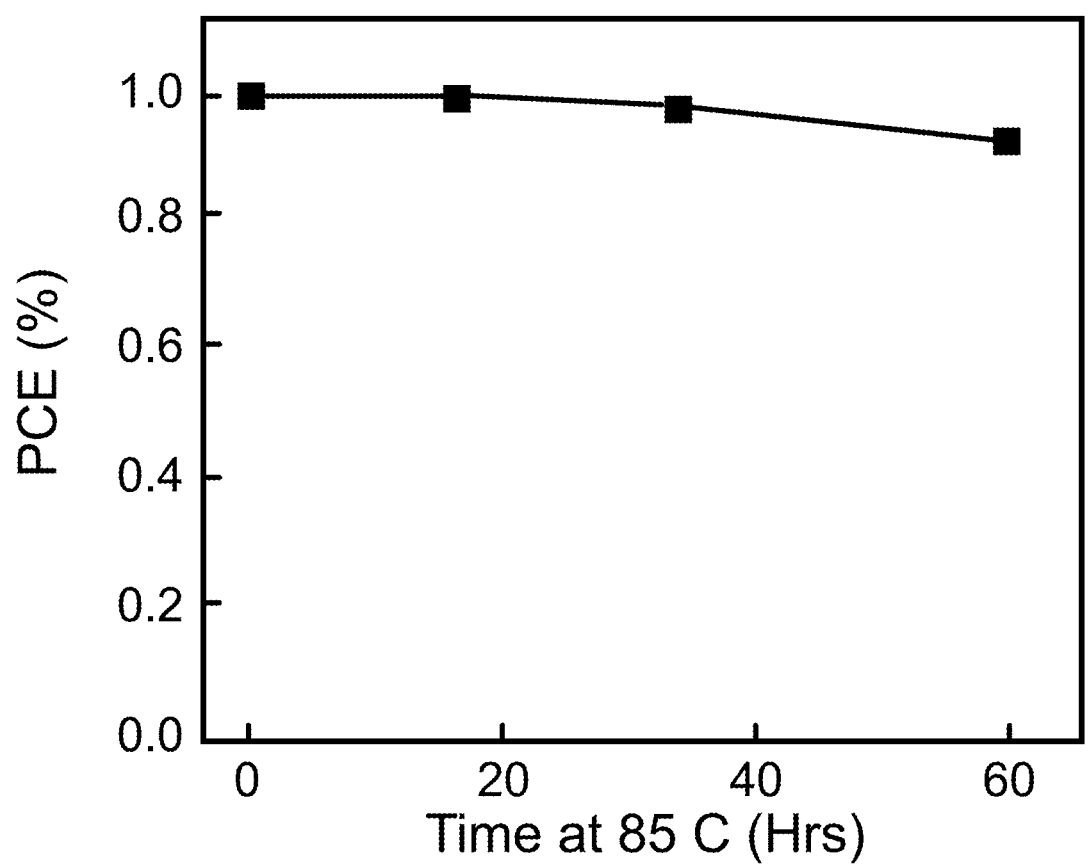
FIG. 35 illustrates tandem aging at 85° C. in dark and nitrogen environment for 50 hours, according to some embodiments of the present disclosure.

According to some embodiments of the present disclosure, a full tandem device stack is shown in FIG. 28. A cross-sectional scanning electron micrograph of the tandem device is shown in FIG. 29 and a TEM image with energy dispersive x-ray elemental mapping in FIGS. 30A and 30B, respectively. Current-voltage characteristics for an all-perovskite tandem device are shown in FIG. 31 (Key metrics: $J_{sc}$=16.0 mA/cm$^2$; $V_{oc}$=1.88V; FF=0.77, and PCE=23.1%). A 180 nm-thick layer of LiF was evaporated onto the glass side of the device as an antireflective coating. Optimization of the current matching in the subcells enabled attaining of a current density of about 16.0 mA/cm$^2$ in the tandem. Further, an open-circuit of 1.88V and FF of 77% were obtained, which are a significant improvement over the previous generation of devices. Together these performance parameters yielded a power conversion efficiency of 23.1%. No significant hysteresis was observed in these devices, as shown in FIG. 32A. FIG. 33 plots the normalized EQEs for the subcells of the tandem (wide gap=solid line; low gap=dashed line). The absolute reflectance spectrum is shown in FIG. 34. The normalized EQEs were used with the solar simulator spectrum to calibrate our efficiency measurements. Initial tests were also completed to validate the inherent stability of the tandem architecture described herein—a 21.5% tandem was operated at maximum power point under 1 sun for 13 hours with no observable drops in performance, while another tandem device exhibited minimal degradation upon aging at 85° C. in the dark in inert atmosphere for 50 hours (see FIG. 35).

Figure 36:
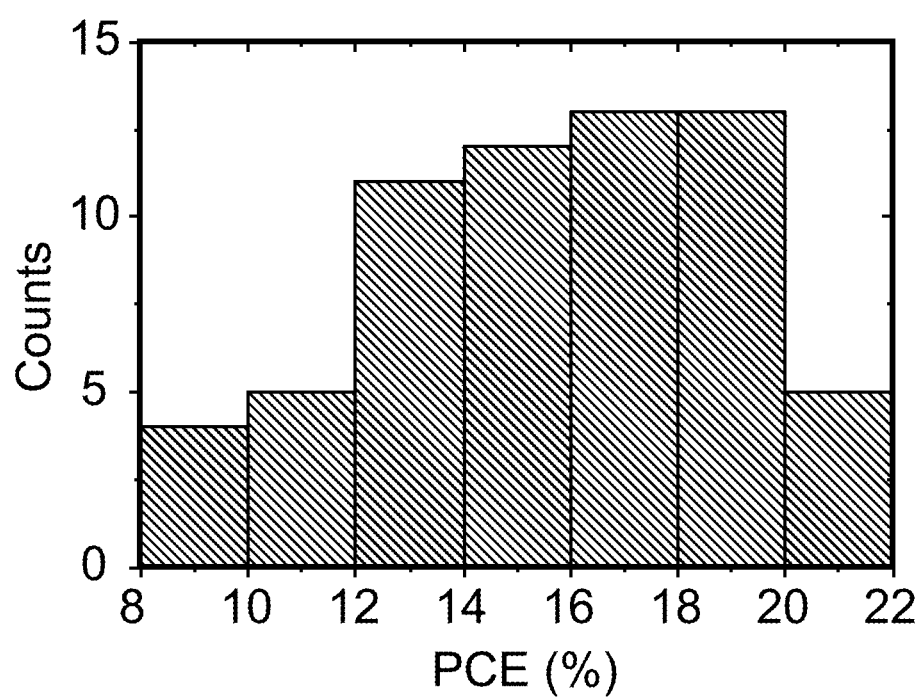
FIG. 36 illustrates PCE distribution for a typical batch of identical tandem devices, according to some embodiments of the present disclosure. We note that these did not have any antireflective coating applied, the lack of which drops the PCE somewhat.
Figure 37:
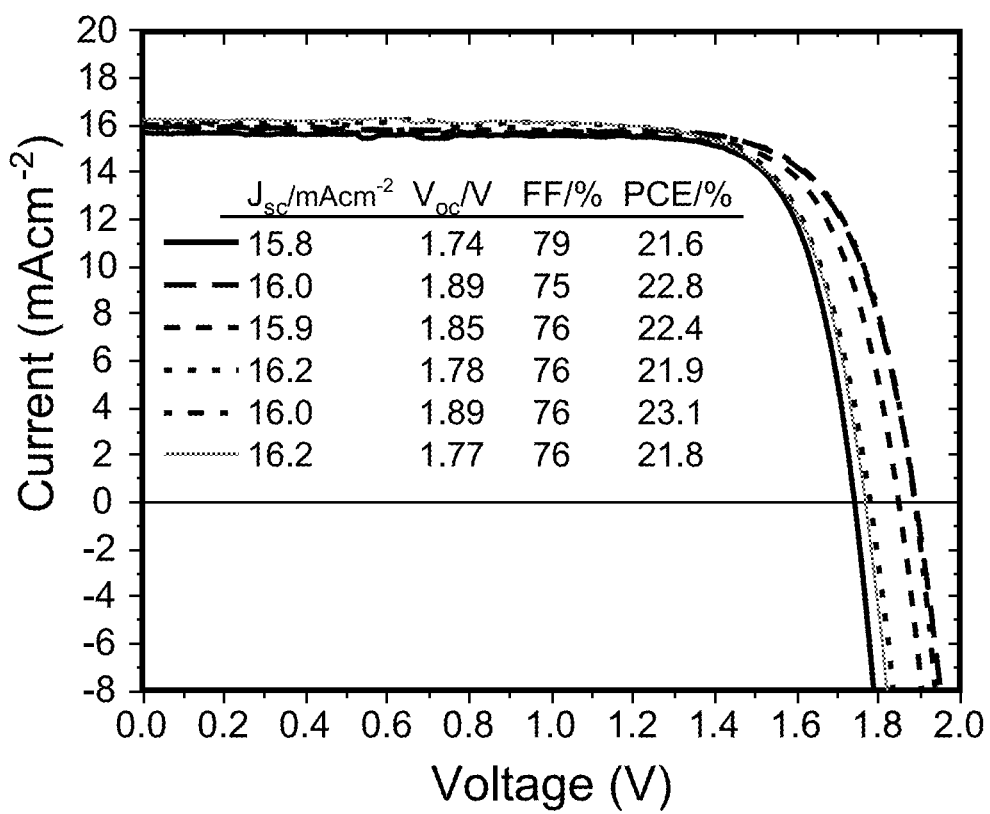
FIG. 37 illustrates current-voltage characteristics for the six best performing tandem devices, according to some embodiments of the present disclosure. Figures of merit are shown in the inset.

Tandem devices were also encapsulated using a combination of ALD-deposited alumina and an epoxy-sealed glass cover slide, and these devices were held in ambient conditions under constant illumination and constant load. After 500 hours of aging in this manner, these devices still retained above 90% of their initial efficiency. These initial stability tests indicate that there is no rapid photoinduced halide segregation occurring in our wide bandgap composition in the full tandem cell, nor is there rapid ion diffusion between the subcells. It is also noted, that while numerous devices in the 22-23% range were made, the performance distribution was wide and a non-negligible fraction of devices were shunted (see FIGS. 36 and 37).

Figure 38A:
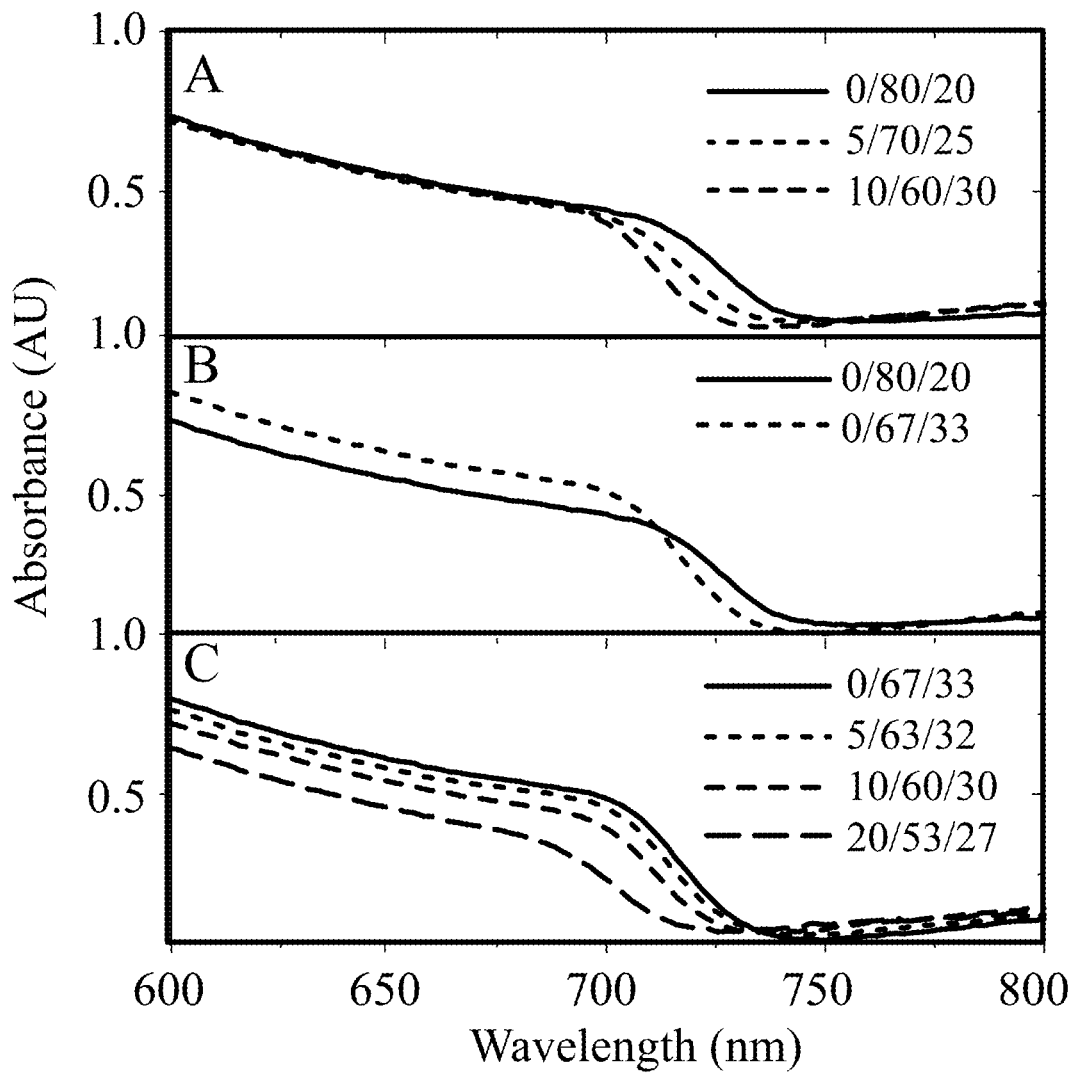
FIG. 38A illustrates absorbance spectra of films of varying compositions showing the effect of, Panel A) adding both DMA and Cs; Panel B) adding only Cs; and Panel C) adding only DMA, according to some embodiments of the present disclosure.
Figure 38B:
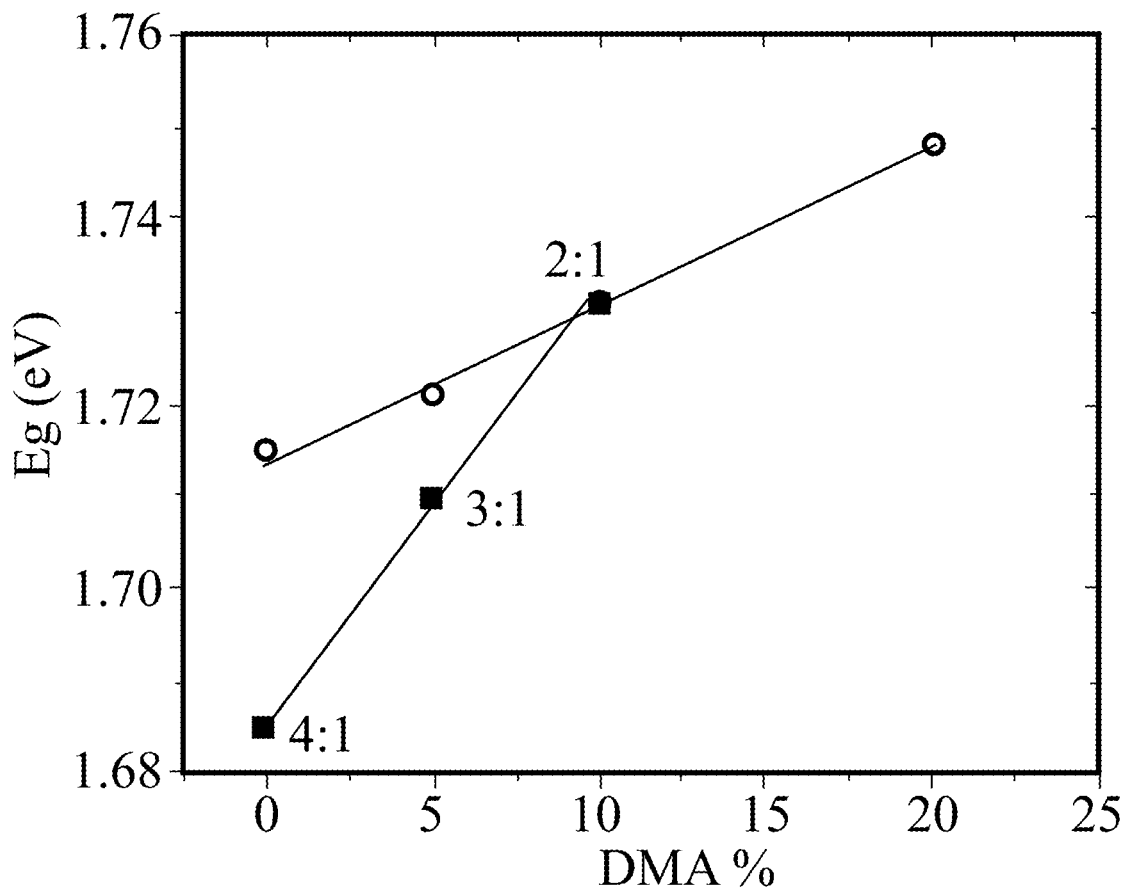
FIG. 38B illustrates bandgaps derived from the film absorbances in FIG. 38A derived via fitting Tauc plots, plotted as a function of DMA content, according to some embodiments of the present disclosure.

As shown in FIG. 38A (legend numbers, e.g. 0/80/20, refer to molar percentages of DMA/FA/Cs), changes in bandgap resulting from increasing the Cs:FA ratio and from increasing the DMA content were evaluated. DMA only appears to incorporate well into the lattice when combined with a higher Cs content, so to elucidate the impact of just adding DMA, starting with a high Cs fraction (FA:Cs=2:1), DMA was added up to 20%. This was compared to the strategy of compensating the added DMA with extra Cs, thereby changing the FA:Cs ratio. As shown in FIG. 38A, not only does increasing both DMA and Cs in the compensation strategy increase the bandgap (Panel A of FIG. 38A), but also increasing both Cs fraction and DMA fraction individually increases the bandgap (Panels B and C of FIG. 38A). The bandgap shifts are mapped out in FIG. 38B (legend: circles correspond to increasing DMA only with FA:Cs ratio held constant at 2:1; squares correspond to compensating DMA with Cs with the ratios of FA to Cs provided). This is a rather surprising finding. Increasing Cs would be expected to increase the bandgap, as it causes the crystal lattice to contract, assuming no other factors, the bandgap is normally considered to predominantly be defined by the crystal lattice spacing, with a larger lattice giving a narrower bandgap and a smaller lattice a wider one. However, since DMA is a larger cation than FA or Cs, its incorporation into the lattice may be assumed to expand the lattice and hence decrease the bandgap. Therefore, additional tests were conducted to ensure that the DMA was incorporated into the lattice.

Figure 39A:
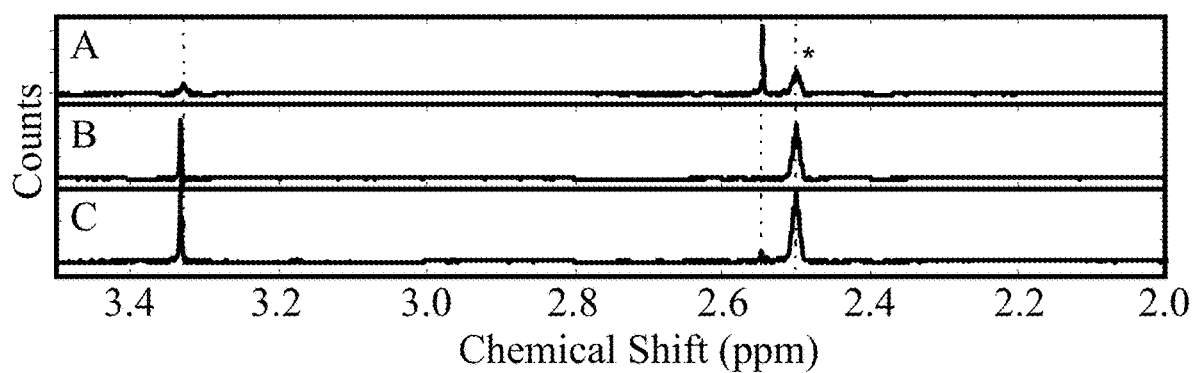
FIG. 39A illustrates 1H-NMR spectra of pure DMAI, perovskite film with no DMA ($FA_{67}Cs_{33}$) and a perovskite film with 10% DMA added ($DMA_{0.10}FA_{0.60}Cs_{0.30}PbI_{2.4}Br_{0.6}$), according to some embodiments of the present disclosure. Material was dissolved in d6-DMSO; the peak marked with a * corresponds to DMSO.

To rule out the possibility that DMA is for some reason washed or annealed out of the film during processing, 1H-NMR was completed on material scraped off thin films. As shown in FIG. 39A, it was determined that the peaks corresponding to the DMA cation are present in the $DMA_{0.10}FA_{0.60}Cs_{0.30}PbI_{2.4}Br_{0.6}$ film material but not the $FA_{0.67}Cs_{0.33}PbI_{2.4}Br_{0.6}$ film (top plot=DMAI reference; middle plot=$FA_{0.67}Cs_{0.33}PbI_{2.4}Br_{0.6}$; bottom plot=$DMA_{0.10}FA_{0.60}Cs_{0.30}PbI_{2.4}Br_{0.6}$). Integration of the peak intensities of FA and DMA characteristic peaks gave a DMA:FA ratio of 1.1:6, close to the ratio added into the starting solution, suggesting that for these cations at least the final composition is similar to the solution and the DMA is not lost during processing.

Figure 39B:
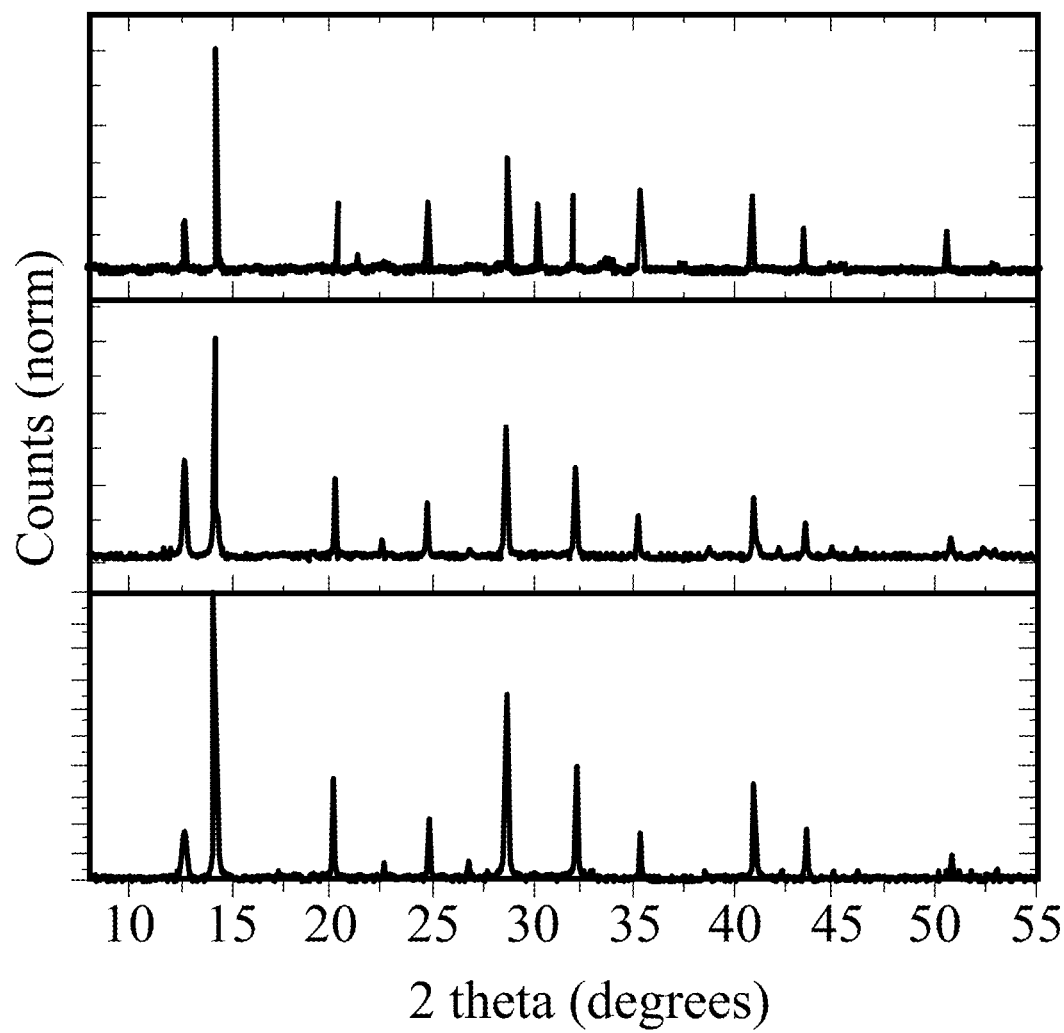
FIG. 39B illustrates X-ray diffraction data for perovskites with high and low Cs content ($FA_{0.80}Cs_{0.20}PbI_{2.4}Br_{0.6}$ and $FA_{0.67}Cs_{0.33}PbI_{2.4}Br_{0.6}$) and DMA-containing perovskite ($DMA_{0.10}FA_{0.60}Cs_{0.30}PbI_{2.4}Br_{0.6}$), according to some embodiments of the present disclosure.
Figure 39C:
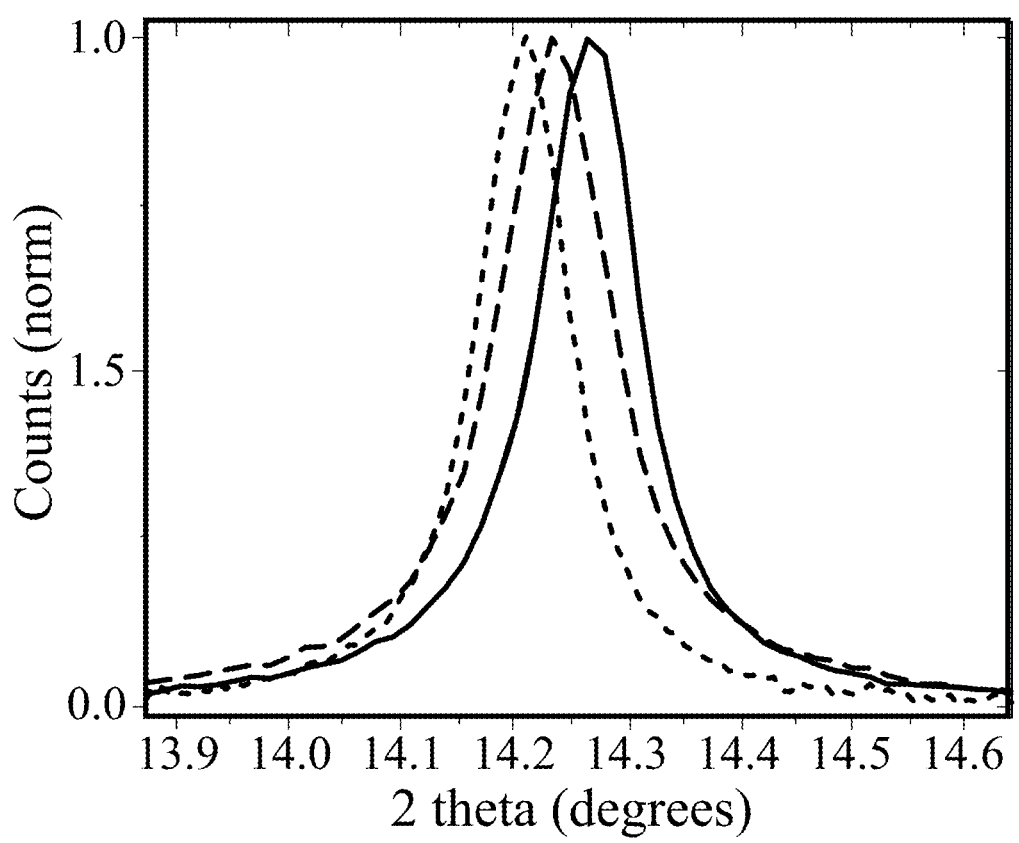
FIG. 39C illustrates zoomed-in view of the perovskite peak around 14.2° to show expansion and contraction of the lattice, according to some embodiments of the present disclosure.

In FIG. 39B, X-ray diffraction data are illustrated for $FA_{0.80}Cs_{0.20}PbI_{2.4}Br_{0.6}$, $FA_{0.67}Cs_{0.33}PbI_{2.4}Br_{0.6}$ and $DMA_{0.10}FA_{0.60}Cs_{0.30}PbI_{2.4}Br_{0.6}$ (top, bottom, and middle data sets, respectively). For all compounds, peaks corresponding to the perovskite structure were observed with no secondary phases present, such as those observed when the DMA content was too high. The only additional peaks observed are those corresponding to $PbI_2$ and the ITO substrate. From these fits, and as illustrated by a closer inspection of the (100) XRD peaks (see FIG. 39C), it is observed firstly that the increase in Cs content causes the lattice to contract, and secondly that adding DMA to the high Cs composition causes the lattice to expand (legend: solid line=$FA_{0.67}Cs_{0.33}PbI_{2.4}Br_{0.6}$; small dashes=$FA_{0.80}Cs_{0.20}PbI_{2.4}Br_{0.6}$; long dashes=$DMA_{0.10}FA_{0.60}Cs_{0.30}PbI_{2.4}Br_{0.6}$). Based on this X-ray and NMR data, one may conclude that the DMA is present in the final film and that it is incorporated into the crystal lattice, causing a lattice expansion. The fact that the bandgap increases rather than decreases upon addition of DMA is thus rather anomalous compared to what would normally be expected.

Figure 40:
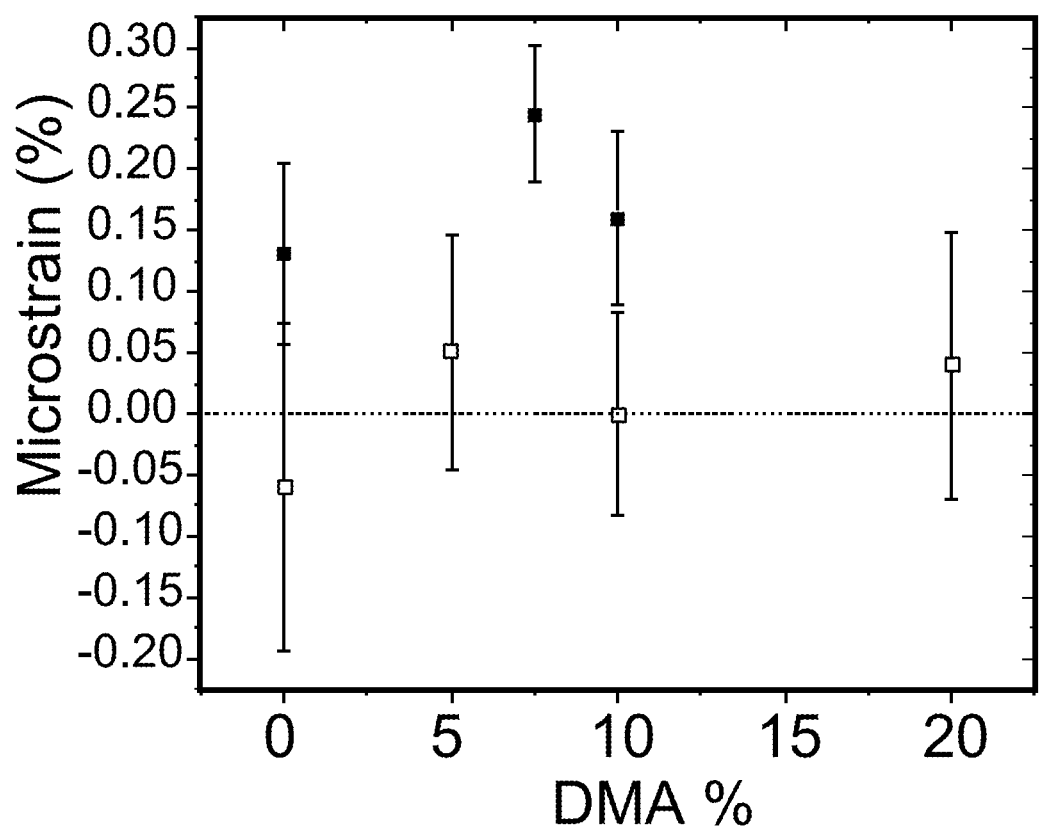
FIG. 40 illustrates microstrain determined by Williamson-hall analysis of the X-ray diffraction data for the strategy of adding both DMA and Cs into $FA_{0.80}Cs_{0.20}PbI_{2.4}Br_{0.6}$ (solid squares), and of adding only DMA to $FA_{0.67}Cs_{0.33}PbI_{2.4}Br_{0.6}$ (hollow squares), according to some embodiments of the present disclosure. Error bars are determined from the error in the linear fit to the Williamson-hall plot.

An increase in microstrain with adding GA and Cs cations into their perovskites has been observed, with 1.7× the microstrain found with addition of GA and Cs into an $FA_{0.83}Cs_{0.17}Br_{0.34}$ composition (complete composition with lead and iodide is $FA_{0.83}Cs_{0.17}PbI_2Br$) (going from ~0.3% to >0.5%). While this observed shift to higher bandgaps was correlated with an expected shrinking in lattice size, it is considered herein that microstrain could be the mechanism behind the observed increased bandgaps. As described herein, it was tested whether an increase in microstrain occurs when adding DMA and/or Cs into the lattice by carrying out Williamson-Hall fitting on high-resolution X-ray diffraction data. FIG. 40 shows the fitted microstrain in the case of increasing both DMA and Cs in an equimolar fashion, and in the case of just adding DMA to the high-Cs composition (legend: solid squares=DMA compensated with Cs to $FA_{0.80}Cs_{0.20}PbI_{2.4}Br_{0.6}$; hollow squares=DMA to $FA_{0.67}Cs_{0.33}PbI_{2.4}Br_{0.6}$). A significant increase was not observed in microstrain when adding DMA and Cs commensurately to $FA_{0.80}Cs_{0.20}PbI_{2.4}Br_{0.6}$. Furthermore, when just adding DMA to $FA_{0.67}Cs_{0.33}PbI_{2.4}Br_{0.6}$, no significant increase in strain is found. This lack of strain increase suggests that strain is not responsible for the bandgap increase when only adding DMA, so this hypothesis may be rejected.

X-ray diffraction data also determined that the volumes of $FA_{0.67}Cs_{0.33}PbI_{2.4}Br_{0.6}$ and $DMA_{0.10}FA_{0.60}Cs_{0.30}PbI_{2.4}Br_{0.6}$ perovskite unit cells were 480.62 Å$^3$ and 482.36 Å$^3$. Bulk perovskite film densities for $FA_{0.67}Cs_{0.33}PbI_{2.4}Br_{0.6}$ and $DMA_{0.10}FA_{0.60}Cs_{0.30}PbI_{2.4}Br_{0.6}$ where measured at 4.368±0.003 g/cm$^3$ and 4.336±0.006 g/cm$^3$, respectively.

Taking all this data together presents a conundrum—adding DMA to the perovskite causes the lattice to expand but widens the bandgap, while not causing a significant increase in microstrain. Without wishing to be bound by theory, it is proposed herein that the addition of DMA, rather than just causing strain, the DMA may be displacing B (e.g. lead) and X ions and producing a 'hollow' structure. In order to test this, the density of powders of the Cs-rich material with and without the incorporation of DMA was measured, attained by spin-coating films and then scraping them off for an exact comparison with the thin films relevant to devices. Given a measured decrease in density and the otherwise inexplicable properties of the material, it is proposed herein that addition of DMA is forming a hollow perovskite. In fact, this would also explain the somewhat larger amount of PbI$_2$ observed in the XRD data for the DMA-containing material—it could be formed from the displaced Pb and halides from the lattice.

Figure 41A:
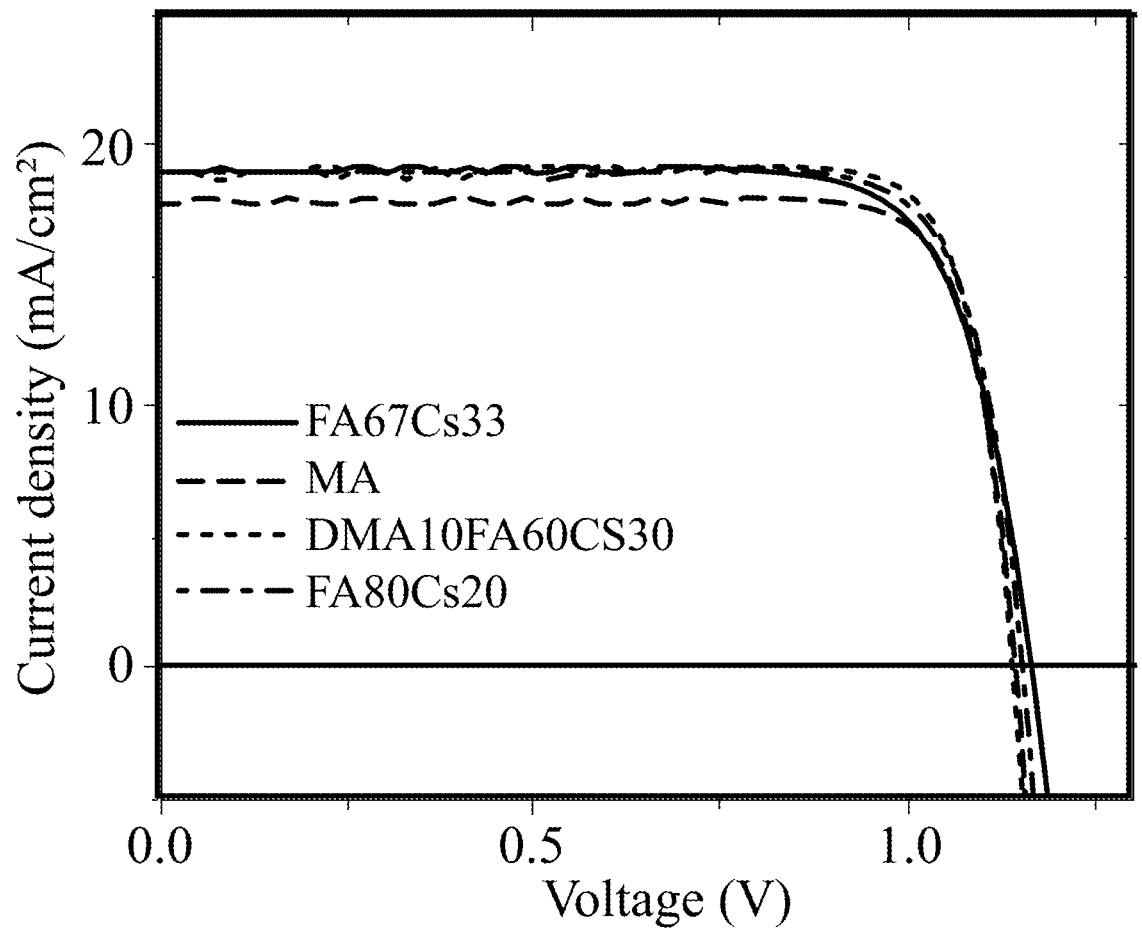
FIG. 41A illustrates current-voltage characteristics for solar cells fabricated with $FA_{0.67}Cs_{0.33}PbI_{2.4}Br_{0.6}$, $FA_{0.80}Cs_{0.20}PbI_{2.4}Br_{0.6}$, $MAPbI_{2.4}Br_{0.6}$, and $DMA_{0.10}FA_{0.60}Cs_{0.30}PbI_{2.4}Br_{0.6}$ compositions, according to some embodiments of the present disclosure.

A concern when introducing large numbers of vacancies into the perovskite structure is that such a 'damaged' crystal structure may be somewhat unstable. However, as shown herein, the optimal DMA-containing material is stable under light and load for >1000 hrs, but thermal stability may be a concern—the high vacancy population may catalyze breakdown of the perovskite structure. Furthermore, the presence of many A-site cations may cause phase instability if they were to phase segregate into pure A-site phases over time. To test this, solar cells were fabricated based on high- and low-Cs content films without DMA and the optimized DMA-containing composition, as well as control pure methylammonium-based devices (which would not be expected to show A-site phase instability), in the p-i-n structure PFN-Br/poly-TPD/perovskite/LiF/C$_{60}$/BCP/Au. Current-voltage data for these devices are shown in FIG. 41A. The devices were then subjected to continual heating for >1500 hrs, holding them on a hotplate at 85° C. at open circuit in the dark. Current-voltage characteristics of devices were then tested at periodic intervals.

Figure 41B:
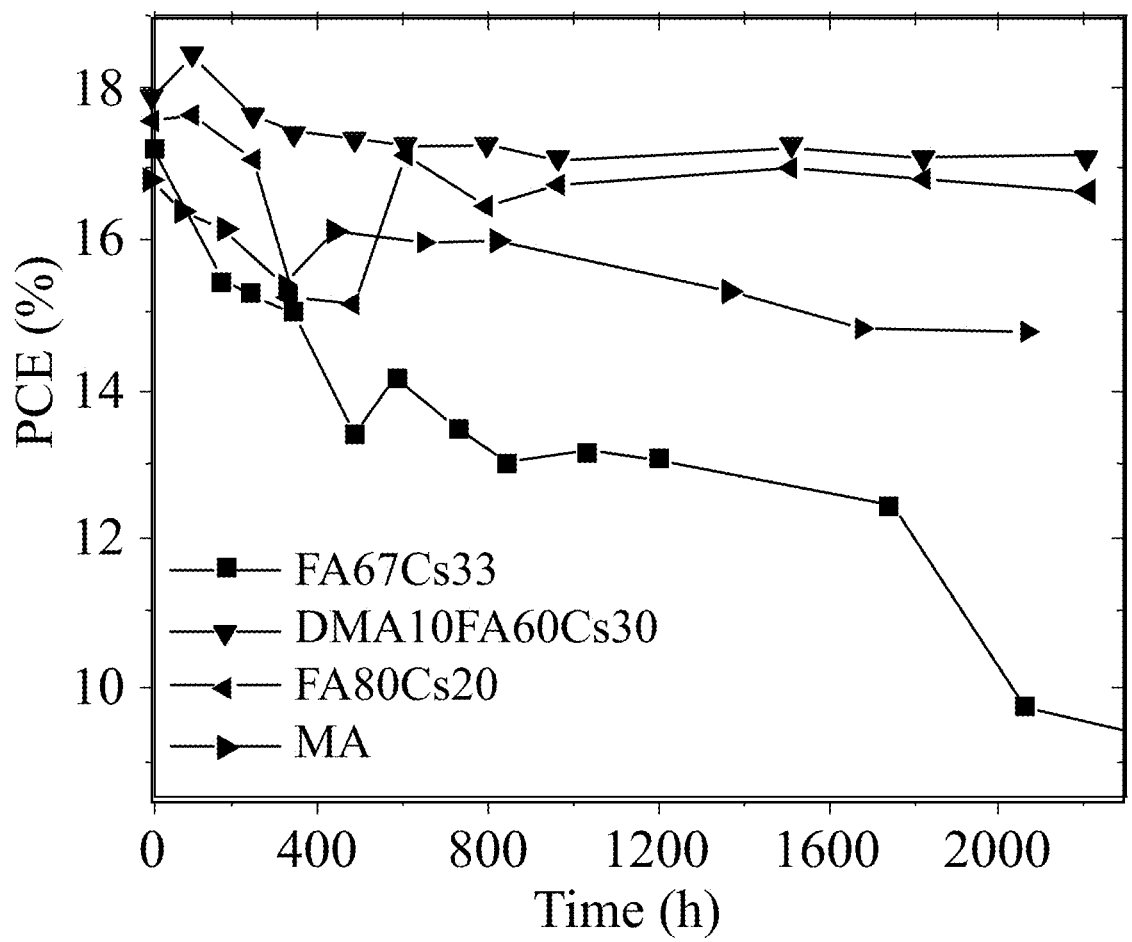
FIG. 41B illustrates thermal stability data of the same devices: power conversion efficiency measured at various intervals while devices are aged at 85° C. in the dark, at open circuit, in a nitrogen atmosphere, according to some embodiments of the present disclosure.

A plot of the PCE over time for devices of each type is shown in FIG. 41B. It is observed that the Cs-rich films degrade quite rapidly upon heating, to 90% of the initial PCE (17.2%) after only 200 hours. By eye, a transition to a colorless non-perovskite phase is observed in these devices. This may be assigned to possible segregation into the delta phases of CsPbX$_3$ and FAPbX$_3$. Despite the lack of phase segregation, the pure MA devices also notably degrade, to 90% of the initial (16.8%) after 1450 hrs. By eye these appear to be forming PbI$_2$, which would be expected due to the volatility of the MA cation. The low-Cs (FA$_{80}$Cs$_{20}$) devices are very stable, retaining 95% of the initial PCE (17.6%) after 2200 hours. Despite the hollow nature of the material, the DMA-containing devices also appear very stable to heating, retaining 96% of the initial PCE (17.9%) after 2200 hrs. Therefore, it may be concluded that the 'hollowing' of the structure is not a cause for concern in terms of stability.

The DMA-containing perovskite compositions synthesized, tested, and described above are examples. The following list provides a complete listing of the various DMA-containing perovskites made according to some of the embodiments of the present disclosure:
$DMA_{0.10}FA_{0.60}Cs_{0.30}PbI_{2.4}Br_{0.6}$,
$DMA_{0.10}FA_{0.60}Cs_{0.30}PbI_{2.4}Br_{0.6}Cl_{0.06}$, $DMA_{0.5}Cs_{0.50}PbI_3$,
$DMA_{0.5}Cs_{0.50}PbI_{2.4}Br_{0.6}$, $DMA_{0.1}FA_{0.58}Cs_{0.32}PbI_3$,
$DMA_{0.1}FA_{0.58}Cs_{0.32}PbI_{2.4}Br_{0.6}$,
$DMA_{0.2}FA_{0.435}Cs_{0.365}PbI_3$,
$DMA_{0.2}FA_{0.435}Cs_{0.365}PbI_{2.4}Br_{0.6}$,
$DMA_{0.3}FA_{0.29}Cs_{0.41}PbI_3$, $DMA_{0.3}FA_{0.29}Cs_{0.41}PbI_{2.4}Br_{0.6}$,
$DMA_{0.4}FA_{0.145}Cs_{0.455}PbI_3$,
$DMA_{0.4}FA_{0.145}Cs_{0.455}PbI_{2.4}Br_{0.6}$,
$DMA_{0.4}FA_{0.145}Cs_{0.455}PbI_{2.85}Br_{0.15}$,
$DMA_{0.3}FA_{0.29}Cs_{0.41}PbI_{2.6}Br_{0.3}$,
$DMA_{0.2}FA_{0.435}Cs_{0.365}PbI_{2.76}Br_{0.24}$,
$DMA_{0.3}FA_{0.29}Cs_{0.41}PbI_{2.55}Br_{0.45}Cl_{0.06}$,
$DMA_{0.15}FA_{0.53}Cs_{0.32}PbI_{2.55}Br_{0.45}Cl_{0.06}$,
$DMA_{0.2}FA_{0.44}Cs_{0.36}PbI_{2.55}Br_{0.45}Cl_{0.06}$,
$DMA_{0.25}FA_{0.38}Cs_{0.37}PbI_{2.55}Br_{0.45}Cl_{0.06}$,
$DMA_{0.3}FA_{0.30}Cs_{0.40}PbI_{2.55}Br_{0.45}Cl_{0.06}$,
$DMA_{0.15}FA_{0.64}Cs_{0.21}PbI_{2.55}Br_{0.45}Cl_{0.06}$,
$DMA_{0.2}FA_{0.60}Cs_{0.2}PbI_{2.55}Br_{0.45}Cl_{0.06}$,
$DMA_{0.25}FA_{0.56}Cs_{0.19}PbI_{2.55}Br_{0.45}Cl_{0.06}$,
$DMA_{0.3}FA_{0.52}Cs_{0.18}PbI_{2.55}Br_{0.45}Cl_{0.06}$,
$DMA_{0.2}FA_{0.4}Cs_{0.4}PbI_{2.55}Br_{0.45}Cl_{0.06}$,
$DMA_{0.2}FA_{0.48}Cs_{0.32}PbI_{2.55}Br_{0.45}Cl_{0.06}$,
$DMA_{0.25}FA_{0.5}Cs_{0.25}PbI_{2.55}Br_{0.45}Cl_{0.06}$,
$DMA_{0.25}FA_{0.45}Cs_{0.3}PbI_{2.55}Br_{0.45}Cl_{0.06}$,
$DMA_{0.2}FA_{0.4}Cs_{0.4}PbI_{2.55}Br_{0.45}Cl_{0.06}$,
$DMA_{0.12}FA_{0.65}Cs_{0.23}PbI_{2.55}Br_{0.45}Cl_{0.06}$,
$DMA_{0.1}FA_{0.6}Cs_{0.3}PbI_{1.5}Br_{1.5}$,
$DMA_{0.1}FA_{0.6}Cs_{0.3}PbI_{2.85}Cl_{0.15}$,
$DMA_{0.1}FA_{0.6}Cs_{0.3}PbI_{2.94}Cl_{0.06}$,
$DMA_{0.1}FA_{0.6}Cs_{0.3}PbI_{2.9}Cl_{0.1}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_{2.55}Br_{0.3}$,
$DMA_{0.1}FA_{0.6}Cs_{0.3}PbI_{2.4}Br_{0.3}Cl_{0.3}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_3$,
$DMA_{0.1}FA_{0.6}Cs_{0.3}PbI_{2.4}Br_{0.45}Cl_{0.15}$,
$DMA_{0.1}FA_{0.6}Cs_{0.3}PbI_{2.55}Br_{0.45}$,
$DMA_{0.1}FA_{0.6}Cs_{0.3}PbI_{2.4}Br_{0.15}Cl_{0.45}$,
$DMA_{0.05}FA_{0.7}Cs_{0.25}PbI_{2.4}Br_{0.6}Cl_{0.06}$,
$DMA_{0.05}FA_{0.63}Cs_{0.32}PbI_{2.4}Br_{0.6}Cl_{0.06}$,
$DMA_{0.2}FA_{0.53}Cs_{0.27}PbI_{2.4}Br_{0.6}Cl_{0.06}$.

Table 2 summarizes the composition ranges for each component as defined by these synthesized exemplary perovskites. These examples clearly illustrate the ability to produce DMA-containing perovskites defined by the general formula $DMA_xFA_yCs_{1-x-y}PbI_{3-v-z}Br_zCl_v$, where, for the specific examples synthesized, 0.05≥x≥0.5; 0.29≥y≥0.70; 0≥z≥1.5; 0≥v≥0.45).

TABLE 2

Synthesized Perovskite Molar Composition Ranges

| component | low | high |
|---|---|---|
| DMA (x) | 0.05 | 0.50 |
| FA (y) | 0.29 | 0.70 |
| Cs (1−x−y) | 0.18 | 0.41 |
| I (3−v−z) | 1.50 | 3.00 |

TABLE 2-continued

Synthesized Perovskite Molar Composition Ranges

| component | low | high |
|---|---|---|
| Br (z) | 0.00 | 1.50 |
| Cl (v) | 0.00 | 0.45 |

Experimental:

Perovskite precursor solutions: All perovskite precursor chemicals were used as received and stored inside a nitrogen glovebox. Perovskite solution preparation and film deposition was conducted in a nitrogen glovebox. Low gap perovskite precursor solutions were prepared by dissolving Formamidinium Iodide (Greatcell), Cesium Iodide (Sigma Aldrich), Tin (II) Iodide (Sigma Aldrich or Alfa Aesar, 99.999% beads), and Lead (II) Iodide (Alfa Aesar), to produce a 2M solution of nominal composition $FA_{0.75}Cs_{0.25}Sn_{0.5}Pb_{0.5}I_3$, in anhydrous N,N-dimethylformamide (DMF, Sigma Aldrich) and Dimethylsulfoxide (DMSO, Sigma Aldrich) at a ratio of 3:1 by volume. Additionally, 0.1M of $SnF_2$ (Sigma) was added to the solution to suppress oxidation of tin. Wide gap perovskite precursor solutions were prepared by dissolving Formamidinium Iodide (Greatcell), Dimethylammonium iodide (Sigma), Cesium Iodide (Sigma Aldrich), Lead (II) Iodide (Alfa Aesar), Lead (II) bromide and Lead (II) Chloride (Alfa Aesar) to produce a 1M solution of $FA_xCs_{1-x-y}DMA_yPbI_{3-z}Br_z$ in DMF:DMSO with a ratio of 3:1 v/v. For the 1.7 eV material used in tandems, a nominal composition of $FA_{0.6}Cs_{0.3}DMA_{0.1}PbI_{2.4}Br_{0.6}$ was used. For the champion devices, a small amount of $PbCl_2$ (0.02M) was also added in stoichiometric excess.

Tandem device fabrication: ITO-coated glass substrates were initially cleaned by sonicating in acetone, propan-2-ol, and then UV ozone treating for 10 min. PolyTPD (Poly(N, N'-bis-4-butylphenyl-N,N'-bisphenyl)benzidine, 1-material) was coated by spin-coating from a 1 mg/ml solution in anhydrous chlorobenzene, at 4000 rpm for 30 s, depositing the solution dynamically. PFN-Br (poly[(9,9-bis(3'-(N,N-dimethylamino)propyl)-2,7-fluorene)-alt-2,7-(9,9-dioctylfluorene)], 1-material)) was coated as a wetting layer by spin-coating a 0.5 mg/ml solution in anhydrous methanol, at 5000 rpm for 20 s, depositing the solution dynamically. The wide gap perovskite was deposited by spin-coating the solution described above at 5000 rpm for 60 s, spreading the solution on the substrate before spinning, and depositing anhydrous methyl acetate onto the spinning wet film at 25 s into the spin cycle. After finishing spinning, the film is then annealed at 100° C. for 60 min. Following deposition of the perovskite film, a thin (1 nm) layer of lithium fluoride was then deposited by thermal evaporation at a rate of 0.2 Å/s. 30 nm of $C_{60}$ (Lumtec or Sigma-Aldrich) was then deposited by thermal evaporation at a deposition rate of 0.2 Å/s for the first 10 nm and 0.5 Å/s for the remaining 20 nm. For single junction wide bandgap cells, a 6 nm layer of bathocuproine (BCP, Sigma) and 120 nm of silver were then deposited to finish the devices, (Kurt J. Lesker) both by thermal evaporation. For tandems, a thin layer of PETE (polyethylenimine ethoxylated) was then deposited by spin-coating a 0.025 wt % solution, made up by diluting the purchased PETE/water solution (40 wt %, Sigma-Aldrich) with anhydrous propan-2-ol. This was spin-coated at 5000 rpm for 20 s, deposited statically before spinning. The films were then annealed at 100° C. for 2 min. 25 nm of AZO was then grown by atomic layer deposition in a Beneq TFS200 ALD system at 85° C. using trimethylaluminum (TMA), diethylzinc (DEZ), and water. Chamber and process nitrogen flows were set to 250 and 450 sccm, respectively. All precursors were unheated and pulsed off of room-temperature vapor pressures. The 25 nm AZO film was deposited with of 3 cycles of $Al_2O_3$ followed by 12 supercycles of AZO; a single AZO supercycle consists of 19 cycles ZnO and 1 cycle $Al_2O_3$. The recipe used for both the $Al_2O_3$ and ZnO cycles proceeded by: a metalorganic (TMA or DEZ, respectively) pulse (0.2 s), purge (5 s), $H_2O$ pulse (0.25 s), and purge (5 s). Our measured growth rates at 85° C. for $Al_2O_3$ and AZO[19:1] are 1.1 Å/cycle and 20 Å/supercycle, respectively. IZO or ITO were then deposited by sputtering. In the final tandems, a 5 nm layer was used. ITO was RF sputtered from a ceramic source at room temperature and 25 mTorr with Ar—0.5% $O_2$ mixture flowing at 5 sccm. Low conductivity Indium Zinc Oxide (IZO) was RF sputter deposited from a 2"×11" ceramic target (In:Zn=70:30) at room temperature in an Argon-Oxygen atmosphere (0.75 vol. % $O_2$ in Argon) at a pressure of 5 mTorr using a power of 100 W. For flexible tandem devices IZO was also used as the bottom contact. For this a 200 nm conductive film was deposited in a less oxygen rich argon-oxygen atmosphere (0.15 vol. % $O_2$ in Argon), with the other parameters unchanged from the conditions mentioned above. PEDOT:PSS was then deposited as the HTL for the low gap subcell. Neutral PEDOT:PSS (Sigma-Aldrich) solution was filtered with a nylon filter (0.4 um pore size) and diluted 1:3 with methanol. This was spin coated in air at 4000 rpm for 20 s followed by heating at 140° C. for 10 min, after which substrates were immediately transferred into a nitrogen glovebox for low gap perovskite deposition. The low gap perovskite was deposited by spin-coating the solution described above at 5000 rpm for 80 s, spreading the solution on the substrate before spinning, and depositing anhydrous diethyl ether (Sigma) onto the spinning wet film at 25 s into the spin cycle. Films were then annealed at 120° C. for 10 min. 30 nm of $C_{60}$ (Lumtec or Sigma-Aldrich) was then deposited by thermal evaporation at a deposition rate of 0.2 Å/s for the first 10 nm and 0.5 Å/s for the remaining 20 nm. Devices were then finished by depositing a 6 nm layer of bathocuproine (BCP, Sigma-Aldrich) and 120 nm of either silver or gold, (Kurt J. Lesker) both by thermal evaporation. Single junction low bandgap devices were made in the structure ITO/PEDOT:PSS/low gap perovskite/$C_{60}$/BCP/Ag by using the processes described above, but the low gap material was deposited differently—diethyl ether was dripped onto the film at 35 s after starting the spin cycle, and annealing was carried out at 100° C. for 10 min.

Encapsulation: Tandem devices were encapsulated by firstly growing a ~50 nm-thick layer of $Al_2O_3$ on top of the whole device via atomic layer deposition, at 60° C. We then additionally covered the device with a glass cover slide in nitrogen atmosphere and sealed it around the edge of the glass slide (avoiding contact with the active area) with a UV-curable epoxy.

Current-voltage characteristics measurement: Solar cells were tested on an Oriel Sol3A class AAA solar simulator from Newport inside a nitrogen glovebox, using a shadow mask with aperture area 0.058 $cm^2$. For single junctions, lamp intensity was calibrated using short-circuit current produced in a calibrated KG2-filtered silicon photodiode. By measuring the external quantum efficiency curve of the solar cell (conducted on a Newport system in ambient air), the spectral mismatch factor was calculated and used to appropriately adjust the intensity of the solar simulator lamp to provide one sun illumination. For tandems, it is critical that both subcells experience the same mismatch factor, so neither subcell is artificially over- or under-illuminated compared to the real one sun condition. In order to achieve this, we had to restrict the amount of infra-red illumination coming from our xenon bulb. This was achieved by employing a 950 nm cutoff filter (Thorlabs) in the illumination path. Based on this modification of the simulator spectrum, and using the EQE spectra of each subcell, we calculated the mismatch factors to be 3% and 1.5% for the wide and low gap subcells respectively. We thus set the lamp intensity to correspond to the 1.5% mismatch, meaning that the wide gap cell was only over-saturated by 1.5%. We verified that the currents measured in our system were accurate by using a second solar simulator system normally used to measure III-V multi junction devices, that uses an array of different colored LEDs to change the spectrum of a xenon lamp in order to eliminate mismatch between sub cells. The current attained on both systems matched well. We found that our wide gap and tandem devices exhibited some non-reversible light soaking resulting in an increase in $V_{oc}$. Our best devices were measured after light soaking at open circuit under 1 sun illumination for 5+ minutes, and we note that the resultant performance increase did not disappear when devices were rested in the dark.

External quantum efficiency measurement: EQE spectra were measured on a custom-built system equipped with an array of LEDs of various wavelengths. To measure EQE for each subcell, the other subcell was light biased with these LEDs to saturate it, and a voltage applied across the device to balance that which would be produced by the biased subcell. Current was measured using a Stanford SRS 830 lock-in, with the excitation light provided by a monochromated xenon lamp, chopped at 305 Hz, and a reference diode measured simultaneously. Specular reflectance was measured at the same time, with no bias LED light applied, using a photodiode mounted near the sample. The LEDs used for biasing each subcell had emission wavelength maxima of 470 nm and 850 nm. For measuring the wide gap EQE, a bias of 0.7V was applied, and for measuring the low gap, a bias of 1V was applied.

Device efficiency measurement: The normalized EQEs were used, together with the solar simulator spectrum, to calculate the mismatch per subcell and consequently adjust the solar simulator spectrum using a filter so that each subcell was operated with minimal mismatch. The methodology of adjusting the solar simulator spectral shape to ensure low mismatch between the two subcells is adapted from standard practice in the long existing III-V multijunction community, because it is the only way to ensure that an accurate fill factor is measured for the tandem solar cell. (1) In addition, the $J_{sc}$ measured under the solar simulator (when correctly calibrated) is preferred over measurements of the absolute EQEs because they are not affected by leakage current between subcells or light bias and frequency-dependent collection efficiencies. We note that the integrated EQE of the limiting subcell should not necessarily be the same as the device $J_{sc}$ in a tandem device where there is some shunt current leaking through the limiting subcell from the non-limiting one. Any current leaking through from the non-limiting subcell at short circuit will add to the measured $J_{sc}$ and cause it to be greater than that of the integrated EQE from the limiting subcell, with fill factor reduced accordingly. Some shunt current leakage is still observed in our best devices (the slope of the JV plot is non-zero near $J_{sc}$). This further points to the necessity to use a mismatch-corrected solar simulator spectrum based on normalized subcell EQEs for current-voltage measurements, rather than relying on integrated subcell EQEs to determine the $J_{sc}$.

Stability measurement: Ambient: Solar cells were loaded into a custom-built degradation testing setup. The setup consists of cooling tubes to keep the cell housing at room temperature, electrical housing, and electronics that switch between devices, measures JV curves, and holds the devices under resistive load, and a light source to provide constant illumination. In this study, devices were kept in air underneath a sulfur plasma lamp at ~0.8 suns and held under a resistive load of 510 Ohms. Every 30 minutes, the system removes the resistive load and takes a JV scan using a Keithley 2450 source-measure unit. JV curves are then analyzed to extract relevant parameters. Nitrogen: Solar cells were tested in inert atmosphere using a similar setup, with the main difference that cells were loaded in sealed flow chambers with nitrogen constantly flowing through them.

Lifetime and mobility measurements: For the TRMC measurements, the perovskite was deposited onto quartz substrates (2.5 cm$^2$ area). The samples are pumped with a 5 ns pulse width beam (650 nm) from an OPO pumped by the third harmonic of an Nd:YAG laser and probed by microwaves at around 9 GHz. The microwave field is absorbed by photogenerated mobile carriers in the perovskite, and its relative change in power $\Delta P$ can be measured. The change in microwave power relates to the photoconductivity $\Delta G$ through $\Delta P/P=-K\Delta G$ where K is an empirically determined calibration factor for the microwave cavity used in this experiment. The photoconductivity is proportional to the number of charges and their mobility. It can be expressed as $\Delta G=e\beta F_A I_0(\phi\Sigma\mu)$ where e is the elementary charge, $\beta=2.2$ is the geometric factor for the X-band waveguide used, $I_0$ is the incident photon flux, $F_A$ the fraction of light absorbed at the excitation wavelength, $\phi$ is the quantum efficiency of free carrier generation per photon absorbed and $\Sigma\mu=\mu_e+\mu_h$ the sum of the mobilities of electrons and holes. Bi-exponential fits of the photoconductivity decay transients were weighted to calculate the average carrier lifetime using the equation: $\tau_{avg}=(A_{0\tau 0}+A_{1\tau 1})/(A_0+A_1)$. For a charge-carrier yield of $\phi=1$, the combined charge carrier mobility ($\Sigma\mu$) at t=0 can be derived from the sum of the pre-exponential factors ($\Sigma A$) of the fits.

Atomic force microscopy: Atomic force microscopy images were measured with a commercial Park XE-70 AFM setup in an acoustic box with air table vibration isolation. Measurements were made in intermittent-contact mode using Budget Sensors Tapp300A1-G cantilevers.

Transmission electron microscopy: Transmission electron microscopy (TEM) imaging was conducted using an FEI Tecnai ST30 microscope at 300 keV with a Gatan camera. Samples were prepared on a 300 mesh copper TEM grid (EMS) coated with a 5-6 nm amorphous carbon film by mounting the TEM grid to a glass slide with kapton tape, evaporating 5 nm of $C_{60}$, and depositing AZO by ALD. Energy-dispersive X-ray spectroscopy (EDX) measurements were taken on the same microscope using an Ametek EDX system with the sample at an alpha tilt of 20°.

EXAMPLES

Example 1

A perovskite comprising $ABX_3$, wherein: A comprises an organic cation, B comprises a second cation, X comprises an anion, and the perovskite has a film density ($\rho$) of less than 4.37 g/cm$^3$.

Example 2

The perovskite of Example 1, wherein 4.1 g/cm$^3$≤ρ≤4.37 g/cm$^3$.

Example 3

The perovskite of Example 1, wherein the organic cation comprises at least one of dimethylammonium (DMA), guanidinium (GA), or acetamidinium (Ac).

Example 4

The perovskite of Example 3, wherein A further comprises cesium.

Example 5

The perovskite of Example 4, comprising DMA$_x$Cs$_{1-x}$BX$_3$, wherein 0≤x≤0.8.

Example 6

The perovskite of Example 5, wherein A further comprises formamidinium (FA).

Example 7

The perovskite of Example 6, comprising DMA$_x$Cs$_{1-x-y}$FA$_y$BX$_3$, wherein 0.40≤y≤0.90.

Example 8

The perovskite of Example 1, wherein B comprises at least one of lead or tin.

Example 9

The perovskite of Example 8, comprising DMA$_x$Cs$_{1-x-y}$FA$_y$PbX$_3$.

Example 10

The perovskite of Example 1, wherein the anion comprises at least one of chlorine, bromine, or iodine.

Example 11

The perovskite of Example 10, comprising DMA$_x$Cs$_{1-x-y}$FA$_y$PbI$_{3-v}$Cl$_v$, wherein 0<v<3.

Example 12

The perovskite of Example 10, comprising DMA$_x$Cs$_{1-x-y}$FA$_y$PbI$_{3-z}$Br$_z$, wherein 0<z<3.

Example 13

The perovskite of Example 10, comprising DMA$_x$Cs$_{1-x-y}$FA$_y$PbI$_{3-v-z}$Br$_z$Cl$_v$, wherein 0<v<3, and 0<z<3.

Example 14

The perovskite of Example 10, comprising DMA$_x$Cs$_{1-x-y}$FA$_y$PbI$_{3-v-z}$Br$_z$Cl$_v$, wherein 0.05≤x≤0.50, 0.29≤y≤0.70, 0≤v≤0.45, and 0≤z≤1.5.

Example 15

The perovskite of Example 14, comprising at least one of DMA$_{0.10}$FA$_{0.60}$Cs$_{0.30}$PbI$_{2.4}$Br$_{0.6}$, DMA$_{0.10}$FA$_{0.60}$Cs$_{0.30}$PbI$_{2.4}$Br$_{0.6}$Cl$_{0.06}$, DMA$_{0.5}$Cs$_{0.50}$PbI$_3$, DMA$_{0.5}$Cs$_{0.50}$PbI$_{2.4}$Br$_{0.6}$, DMA$_{0.1}$FA$_{0.58}$Cs$_{0.32}$PbI$_3$, DMA$_{0.1}$FA$_{0.58}$Cs$_{0.32}$PbI$_{2.4}$Br$_{0.6}$, DMA$_{0.2}$FA$_{0.435}$Cs$_{0.365}$PbI$_3$, DMA$_{0.2}$FA$_{0.435}$Cs$_{0.365}$PbI$_{2.4}$Br$_{0.6}$, DMA$_{0.3}$FA$_{0.29}$Cs$_{0.41}$PbI$_3$, DMA$_{0.3}$FA$_{0.29}$Cs$_{0.41}$PbI$_{2.4}$Br$_{0.6}$, DMA$_{0.4}$FA$_{0.145}$Cs$_{0.455}$PbI$_3$, DMA$_{0.4}$FA$_{0.145}$Cs$_{0.455}$PbI$_{2.4}$Br$_{0.6}$, DMA$_{0.4}$FA$_{0.145}$Cs$_{0.455}$PbI$_{2.85}$Br$_{0.15}$, DMA$_{0.3}$FA$_{0.29}$Cs$_{0.41}$PbI$_{2.6}$Br$_{0.3}$, DMA$_{0.2}$FA$_{0.435}$Cs$_{0.365}$PbI$_{2.76}$Br$_{0.24}$, DMA$_{0.3}$FA$_{0.29}$Cs$_{0.41}$PbI$_{2.55}$Br$_{0.45}$Cl$_{0.06}$, DMA$_{0.15}$FA$_{0.53}$Cs$_{0.32}$PbI$_{2.55}$Br$_{0.45}$Cl$_{0.06}$, DMA$_{0.2}$FA$_{0.44}$Cs$_{0.36}$PbI$_{2.55}$Br$_{0.45}$Cl$_{0.06}$, DMA$_{0.25}$FA$_{0.38}$Cs$_{0.37}$PbI$_{2.55}$Br$_{0.45}$Cl$_{0.06}$, DMA$_{0.3}$FA$_{0.30}$Cs$_{0.40}$PbI$_{2.55}$Br$_{0.45}$Cl$_{0.06}$, DMA$_{0.15}$FA$_{0.64}$Cs$_{0.21}$PbI$_{2.55}$Br$_{0.45}$Cl$_{0.06}$, DMA$_{0.2}$FA$_{0.60}$Cs$_{0.2}$PbI$_{2.55}$Br$_{0.45}$Cl$_{0.06}$, DMA$_{0.25}$FA$_{0.56}$Cs$_{0.19}$PbI$_{2.55}$Br$_{0.45}$Cl$_{0.06}$, DMA$_{0.3}$FA$_{0.52}$Cs$_{0.18}$PbI$_{2.55}$Br$_{0.45}$Cl$_{0.06}$, DMA$_{0.2}$FA$_{0.4}$Cs$_{0.4}$PbI$_{2.55}$Br$_{0.45}$Cl$_{0.06}$, DMA$_{0.2}$FA$_{0.48}$Cs$_{0.32}$PbI$_{2.55}$Br$_{0.45}$Cl$_{0.06}$, DMA$_{0.25}$FA$_{0.5}$Cs$_{0.25}$PbI$_{2.55}$Br$_{0.45}$Cl$_{0.06}$, DMA$_{0.25}$FA$_{0.45}$Cs$_{0.3}$PbI$_{2.55}$Br$_{0.45}$Cl$_{0.06}$, DMA$_{0.2}$FA$_{0.4}$Cs$_{0.4}$PbI$_{2.55}$Br$_{0.45}$Cl$_{0.06}$, DMA$_{0.12}$FA$_{0.65}$Cs$_{0.23}$PbI$_{2.55}$Br$_{0.45}$Cl$_{0.06}$, DMA$_{0.1}$FA$_{0.6}$Cs$_{0.3}$PbI$_{1.5}$Br$_{1.5}$, DMA$_{0.1}$FA$_{0.6}$Cs$_{0.3}$PbI$_{2.85}$Cl$_{0.15}$, DMA$_{0.1}$FA$_{0.6}$Cs$_{0.3}$PbI$_{2.94}$Cl$_{0.06}$, DMA$_{0.1}$FA$_{0.6}$Cs$_{0.3}$PbI$_{2.9}$Cl$_{0.1}$, DMA$_{0.1}$FA$_{0.6}$Cs$_{0.3}$PbI$_{2.55}$Br$_{0.3}$Cl$_{0.15}$, DMA$_{0.1}$FA$_{0.6}$Cs$_{0.3}$PbI$_{2.55}$Br$_{0.3}$Cl$_{0.15}$, DMA$_{0.1}$FA$_{0.6}$Cs$_{0.3}$PbI$_{2.55}$Br$_{0.3}$, DMA$_{0.1}$FA$_{0.6}$Cs$_{0.3}$PbI$_{2.4}$Br$_{0.3}$Cl$_{0.3}$, DMA$_{0.1}$FA$_{0.6}$Cs$_{0.3}$PbI$_{2.55}$Br$_{0.3}$Cl$_{0.15}$, DMA$_{0.1}$FA$_{0.6}$Cs$_{0.3}$PbI$_3$, DMA$_{0.1}$FA$_{0.6}$Cs$_{0.3}$PbI$_{2.4}$Br$_{0.45}$Cl$_{0.15}$, DMA$_{0.1}$FA$_{0.6}$Cs$_{0.3}$PbI$_{2.55}$Br$_{0.45}$, DMA$_{0.1}$FA$_{0.6}$Cs$_{0.3}$PbI$_{2.4}$Br$_{0.15}$Cl$_{0.45}$, DMA$_{0.05}$FA$_{0.7}$Cs$_{0.25}$PbI$_{2.4}$Br$_{0.6}$Cl$_{0.06}$, DMA$_{0.05}$FA$_{0.63}$Cs$_{0.32}$PbI$_{2.4}$Br$_{0.6}$Cl$_{0.06}$, or DMA$_{0.2}$FA$_{0.53}$Cs$_{0.27}$PbI$_{2.4}$Br$_{0.6}$Cl$_{0.06}$.

Example 16

The perovskite of Example 1, further comprising a unit cell volume greater than 480 Å$^3$.

Example 17

The perovskite of Example 2, wherein the unit cell volume is between greater than 480 Å$^3$ and 485 Å$^3$.

Example 18

The perovskite of Example 1, further comprising a bandgap between 1.65 eV and 1.9 eV, inclusively.

Example 19

The perovskite of Example 18, wherein the bandgap is between 1.70 eV and 1.85 eV, inclusively.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A perovskite comprising:
a tilt angle not equal to 180 degrees; and
$DMA_xCs_{1-x-y}FA_yBX_3$, wherein:
DMA is dimethylammonium,
FA is formamidinium,
B comprises a cation,
X comprises an anion,
$0 \leq x \leq 0.8$,
$0.40 \leq y \leq 0.90$,
the tilt angle is the angle at the anion (X) between two neighboring cations (B), and
the perovskite has a film density ($\rho$) of less than 4.37 g/cm$^3$.

2. The perovskite of claim 1, wherein X comprises at least one of chlorine, bromine, or iodine.

3. The perovskite of claim 2, comprising $DMA_xCs_{1-x-y}FA_yPbI_{3-v-z}Br_zCl_v$, wherein $0.05 \leq x \leq 0.50$, $0.29 \leq y \leq 0.70$, $0 \leq v \leq 0.45$, and $0 \leq z \leq 1.5$.

4. The perovskite of claim 3, comprising at least one of
$DMA_{0.10}FA_{0.60}CS_{0.30}PbI_{2.4}Br_{0.6}$,
$DMA_{0.10}FA_{0.60}CS_{0.30}PbI_{2.4}Br_{0.6}Cl_{0.06}$, $DMA_{0.5}Cs_{0.50}PbI_3$,
$DMA_{0.5}Cs_{0.50}PbI_{2.4}Br_{0.6}$, $DMA_{0.1}FA_{0.58}Cs_{0.32}PbI_3$,
$DMA_{0.1}FA_{0.58}Cs_{0.32}PbI_{2.4}Br_{0.6}$,
$DMA_{0.2}FA_{0.435}Cs_{0.365}PbI_3$,
$DMA_{0.2}FA_{0.435}Cs_{0.365}PbI_{2.4}Br_{0.6}$,
$DMA_{0.3}FA_{0.29}Cs_{0.41}PbI_3$, $DMA_{0.3}FA_{0.29}Cs_{0.41}PbI_{2.4}Br_{0.6}$,
$DMA_{0.4}FA_{0.145}Cs_{0.455}PbI_3$,
$DMA_{0.4}FA_{0.145}Cs_{0.455}PbI_{2.4}Br_{0.6}$,
$DMA_{0.4}FA_{0.145}Cs_{0.455}PbI_{2.85}Br_{0.15}$,
$DMA_{0.3}FA_{0.29}Cs_{0.41}PbI_{2.6}Br_{0.3}$,
$DMA_{0.2}FA_{0.435}Cs_{0.365}PbI_{2.76}Br_{0.24}$,
$DMA_{0.3}FA_{0.29}Cs_{0.41}PbI_{2.55}Br_{0.45}Cl_{0.06}$,
$DMA_{0.15}FA_{0.53}Cs_{0.32}PbI_{2.55}Br_{0.45}Cl_{0.06}$,
$DMA_{0.2}FA_{0.44}Cs_{0.36}PbI_{2.55}Br_{0.45}Cl_{0.06}$,
$DMA_{0.25}FA_{0.38}Cs_{0.37}PbI_{2.55}Br_{0.45}Cl_{0.06}$,
$DMA_{0.3}FA_{0.30}Cs_{0.40}PbI_{2.55}Br_{0.45}Cl_{0.06}$,
$DMA_{0.15}FA_{0.64}Cs_{0.21}PbI_{2.55}Br_{0.45}Cl_{0.06}$,
$DMA_{0.2}FA_{0.60}Cs_{0.2}PbI_{2.55}Br_{0.45}Cl_{0.06}$,
$DMA_{0.25}FA_{0.56}Cs_{0.19}PbI_{2.55}Br_{0.45}Cl_{0.06}$,
$DMA_{0.3}FA_{0.52}Cs_{0.18}PbI_{2.55}Br_{0.45}Cl_{0.06}$,
$DMA_{0.2}FA_{0.4}Cs_{0.4}PbI_{2.55}Br_{0.45}Cl_{0.06}$,
$DMA_{0.2}FA_{0.48}Cs_{0.32}PbI_{2.55}Br_{0.45}Cl_{0.06}$,
$DMA_{0.25}FA_{0.5}Cs_{0.25}PbI_{2.55}Br_{0.45}Cl_{0.06}$,
$DMA_{0.25}FA_{0.45}Cs_{0.3}PbI_{2.55}Br_{0.45}Cl_{0.06}$,
$DMA_{0.2}FA_{0.4}Cs_{0.4}PbI_{2.55}Br_{0.45}Cl_{0.06}$,
$DMA_{0.12}FA_{0.65}Cs_{0.23}PbI_{2.55}Br_{0.45}Cl_{0.06}$,
$DMA_{0.1}FA_{0.6}Cs_{0.3}PbI_{1.5}Br_{1.5}$,
$DMA_{0.1}FA_{0.6}Cs_{0.3}PbI_{2.85}Cl_{0.15}$,
$DMA_{0.1}FA_{0.6}Cs_{0.3}PbI_{2.94}Cl_{0.06}$,
$DMA_{0.1}FA_{0.6}Cs_{0.3}PbI_{2.9}Cl_{0.1}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_{2.55}Br_{0.3}$,
$DMA_{0.1}FA_{0.6}Cs_{0.3}PbI_{2.4}Br_{0.3}Cl_{0.3}$,
$DMA_{0.1}FA_{0.6}Cs_{0.3}PbI_{2.55}Br_{0.3}Cl_{0.15}$,
$DMA_{0.1}FA_{0.6}Cs_{0.3}PbI_3$,
$DMA_{0.1}FA_{0.6}Cs_{0.3}PbI_{2.4}Br_{0.45}Cl_{0.15}$,
$DMA_{0.1}FA_{0.6}Cs_{0.3}PbI_{2.55}Br_{0.45}$,
$DMA_{0.1}FA_{0.6}Cs_{0.3}PbI_{2.4}Br_{0.15}Cl_{0.45}$,
$DMA_{0.05}FA_{0.7}Cs_{0.25}PbI_{2.4}Br_{0.6}Cl_{0.06}$,
$DMA_{0.05}FA_{0.63}Cs_{0.32}PbI_{2.4}Br_{0.6}Cl_{0.06}$, or
$DMA_{0.2}FA_{0.53}Cs_{0.27}PbI_{2.4}Br_{0.6}Cl_{0.06}$.

5. The perovskite of claim 2, comprising $DMA_xCs_{1-x-y}FA_yPbI_{3-v}Cl_v$, wherein $0<v<3$.

6. The perovskite of claim 2, comprising $DMA_xCs_{1-x-y}FA_yPbI_{3-z}Br_z$, wherein $0<z<3$.

7. The perovskite of claim 2, comprising $DMA_xCs_{1-x-y}FA_yPbI_{3-v-z}Br_zCl_v$, wherein $0<v<3$, and $0<z<3$.

8. The perovskite of claim 1, wherein B comprises at least one of lead or tin.

9. The perovskite of claim 8, comprising $DMA_xCs_{1-x-y}FA_yPbX_3$.

10. The perovskite of claim 1, further comprising a unit cell volume greater than 480 Å$^3$.

11. The perovskite of claim 10, wherein the unit cell volume is between greater than 480 Å$^3$ and 485 Å$^3$, inclusively.

12. The perovskite of claim 1, further comprising a bandgap between 1.65 eV and 1.9 eV, inclusively.

13. The perovskite of claim 12, wherein the bandgap is between 1.70 eV and 1.85 eV, inclusively.

14. The perovskite of claim 1, wherein 4.1 g/cm$^3 \leq \rho \leq 4.37$ g/cm$^3$.

15. The perovskite of claim 1, further comprising at least one of guanidinium or acetamidinium.

16. The perovskite of claim 1, wherein the tilt angle is between 153 degrees and less than 180 degrees, inclusively.

* * * * *